United States Patent
Shook et al.

(10) Patent No.: US 10,720,689 B2
(45) Date of Patent: Jul. 21, 2020

(54) LAUNCH ASSEMBLY FOR COUPLING EM SIGNALS BETWEEN A CCU AND A WAVEGUIDE, WHERE THE CCU IS ENCLOSED BY A COVER REGION INCLUDING TRANSITION AND WAVEGUIDE INTERFACE REGIONS THEREIN FOR COUPLING TO THE WAVEGUIDE

(71) Applicant: Keyssa Systems, Inc., Campbell, CA (US)

(72) Inventors: James Gill Shook, Santa Cruz, CA (US); Stephan Lang, San Jose, CA (US); Alan Besel, Ridgefield, WA (US); Dennis F. Rosenauer, Tigard, OR (US); Giriraj Mantrawadi, Tigard, OR (US); Eric Sweetman, Portland, OR (US); Bojana Zivanovic, Portland, OR (US); Srikanth Gondi, Cupertino, CA (US)

(73) Assignee: KEYSSA SYSTEMS, INC., Campbell, CA (US)

( * ) Notice: Subject to any disclaimer, the term of this patent is extended or adjusted under 35 U.S.C. 154(b) by 11 days.

(21) Appl. No.: 15/818,237

(22) Filed: Nov. 20, 2017

(65) Prior Publication Data

US 2019/0157738 A1     May 23, 2019

(51) Int. Cl.
| | |
|---|---|
| *H01P 5/107* | (2006.01) |
| *H01P 5/02* | (2006.01) |
| *H03H 7/38* | (2006.01) |
| *H01P 3/20* | (2006.01) |
| *H04B 5/00* | (2006.01) |

(52) U.S. Cl.
CPC .............. *H01P 5/107* (2013.01); *H01P 3/20* (2013.01); *H01P 5/02* (2013.01); *H01P 5/024* (2013.01); *H03H 7/38* (2013.01); *H04B 5/00* (2013.01)

(58) Field of Classification Search
CPC ...................................................... H01P 5/107
USPC ............................................................ 333/26
See application file for complete search history.

(56) References Cited

U.S. PATENT DOCUMENTS

| | | | | |
|---|---|---|---|---|
| 8,169,060 | B2* | 5/2012 | Maurer et al. | H01L 23/66 |
| | | | | 257/662 |
| 10,256,520 | B2* | 4/2019 | Besel et al. | H04B 5/0031 |
| 2016/0043455 | A1* | 2/2016 | Seler et al. | H01P 11/002 |
| | | | | 333/26 |
| 2016/0079647 | A1* | 3/2016 | Hasch et al. | H01P 5/107 |
| | | | | 333/26 |
| 2017/0170569 | A1* | 6/2017 | Elad et al. | H01Q 13/00 |

\* cited by examiner

*Primary Examiner* — Benny T Lee
(74) *Attorney, Agent, or Firm* — Van Court & Aldridge LLP

(57) ABSTRACT

Conduit structures for guiding extremely high frequency (EHF) signals are disclosed herein. The conduit structures can include EHF containment channels that define EHF signal pathways through which EHF signal energy is directed. The conduit structures can minimize or eliminate crosstalk among adjacent paths within a device and across devices. Launch structures that interface with waveguides are also disclosed herein. Launch structures can control the EHF interface impedance between a contactless communication unit and the waveguide. Waveguide structures discussed herein are designed to provide maximum bandwidth with minimal jitter over a desired distance.

18 Claims, 44 Drawing Sheets

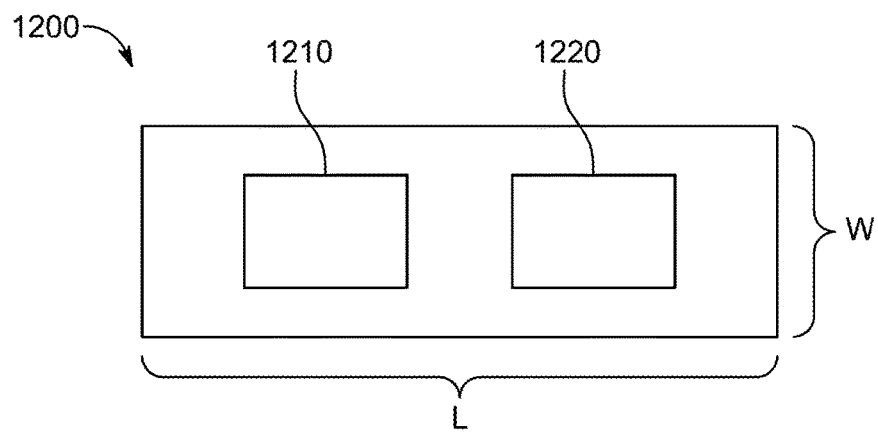
FIG. 12A
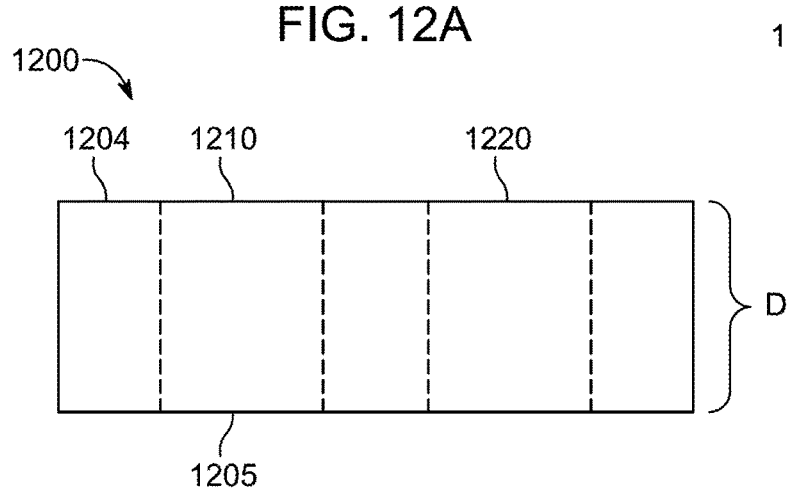 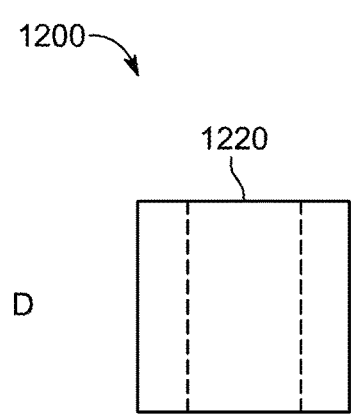
FIG. 12B              FIG. 12C
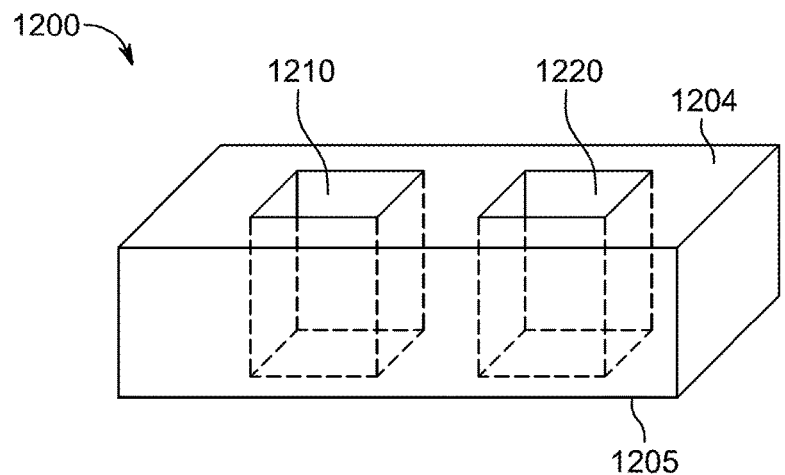
FIG. 12D

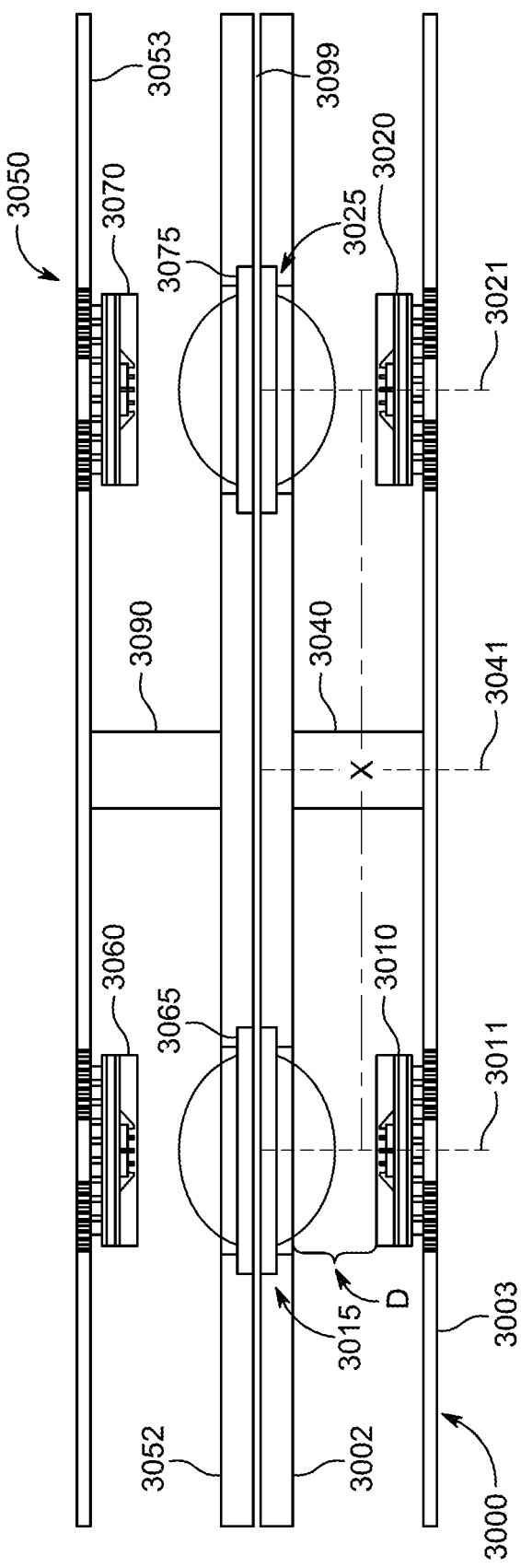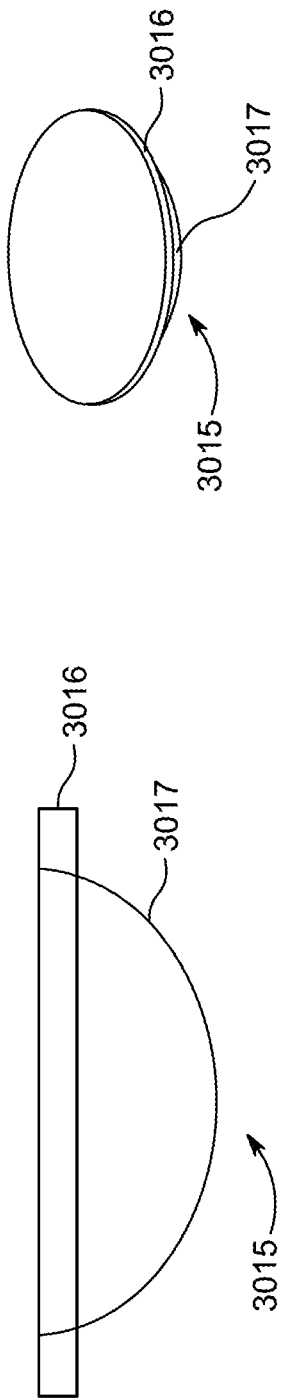
FIG. 30A
FIG. 30B
FIG. 30C

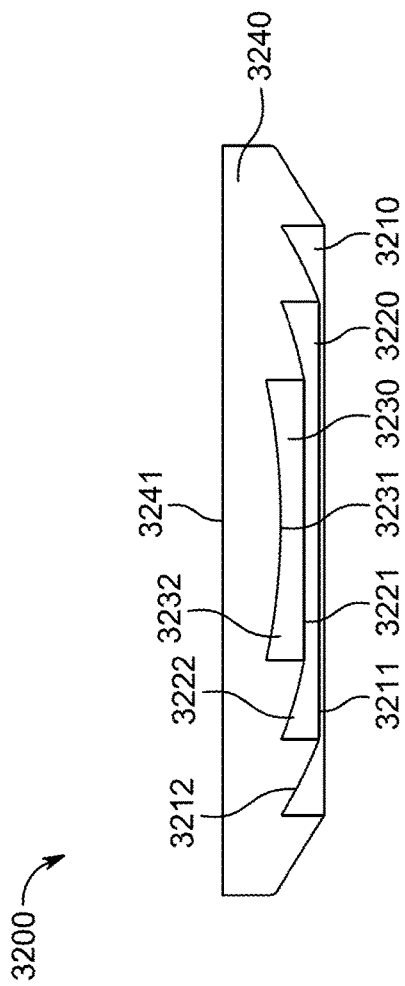
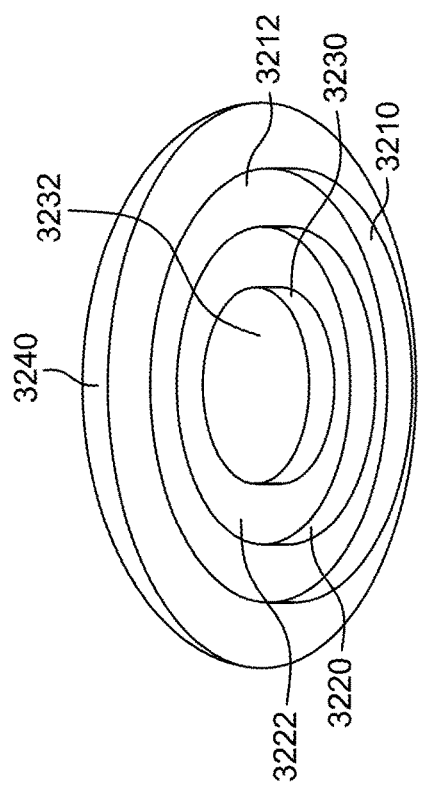

| Material | Dielectric Constant | Loss Tangent | Dielectric Loss (dB/M) |
|---|---|---|---|
| Polyvinyl Foam | 1.55 | 0.0043 | 39 |
| Vinyl | 2.58 | 0.0138 | 164 |
| Polycarbonate | 2.59 | 0.00855 | 101 |
| PVDF | 2.31 | 0.023 | 253 |
| Polystyrene | 2.32 | 0.0022 | 24 |
| Polyethylene Foam | 1.34 | 0.0009 | 7.6 |
| Polyethylene (Solid) | 2.07 | 0.001 | 10.5 |
| Neoprene | 1.18 | 0.001 | 7.9 |
| Bead Styrofoam | 1.018 | 0.001 | 7.4 |

FIG. 47

LAUNCH ASSEMBLY FOR COUPLING EM SIGNALS BETWEEN A CCU AND A WAVEGUIDE, WHERE THE CCU IS ENCLOSED BY A COVER REGION INCLUDING TRANSITION AND WAVEGUIDE INTERFACE REGIONS THEREIN FOR COUPLING TO THE WAVEGUIDE

FIELD OF THE INVENTION

The present disclosure relates to contactless connector assemblies and more specifically to contactless signal conduits that define signaling pathways for extremely high frequency signals.

BACKGROUND

Advances in semiconductor manufacturing and circuit design technologies have enabled the development and production of integrated circuits (ICs) with increasingly higher operational frequencies in the non-wired realm. As a result, electronic products and systems incorporating such integrated circuits are able to provide much greater functionality than previous generations of products. This additional functionality has generally included the processing of increasingly larger amounts of data at increasingly higher speeds. The higher operation speeds can result in enhanced radio frequency signal propagation that has a tendency to disperse in undesired ways that can cause signal loss and crosstalk.

SUMMARY OF THE INVENTION

Conduit structures for guiding extremely high frequency (EHF) signals are disclosed herein. The conduit structures can include EHF containment channels that define EHF signal pathways through which EHF signal energy is directed. The conduit structures can minimize or eliminate crosstalk among adjacent paths within a device and across devices. Launch structures that interface with waveguides are also disclosed herein. Launch structures can control the EHF interface impedance between a contactless communication unit and the waveguide. Waveguide structures discussed herein are designed to provide maximum bandwidth with minimal jitter over a desired distance.

In one embodiment, a system is provided that includes a housing including an interface for communicating extremely high frequency (EHF) contactless signals, a substrate positioned within the housing a distance from the interface, first contactless communication unit (CCU) mounted on the substrate, and a conduit structure positioned over the first CCU and coupled to the substrate and the interface. The conduit structure can include a first channel that spans the distance and defines a first contactless signal path between the first CCU and the interface, and at least one anti-spurious radiation (ASR) region positioned adjacent to the first channel and including a groove surrounding the first channel.

In another embodiment, a device is provided that includes a housing having first and second surfaces and an axis, a substrate comprising a contactless communication unit (CCU), wherein the substrate is positioned below the second surface of the housing and the CCU is aligned with the axis, and a lens structure coupled to the housing and aligned with the axis, the lens structure comprising a planar surface that is substantially co-planar with the first surface and at least one EM signal transformation region, wherein the at least one EM signal transformation region is operative to control velocities of an EM wave passing through the lens structure In yet another embodiment, a contactless signal conduit for use in a device including at least one contactless communication unit (CCU) mounted to a substrate and an interface that defines a contactless communications port for communicating extremely high frequency (EHF) contactless signals is provided. The contactless signal conduit can include a wave containment region comprising at least one EHF guiding channel, wherein each EHF guiding channel is associated with one of the at least one CCU and extends from a first surface to a second surface, and wherein an interior surface of each EHF containment channel comprises a conductive material, and compliant member that is mounted to the second surface of the wave containment region, wherein the compliant member comprises at least one open-air channel, each open-air channel aligned with a respective one of the at least one EHF guiding channel, and wherein the compliant member forms an EHF hermetic seal with the interface.

In yet another embodiment, a contactless signal conduit for use in a device including a plurality of contactless communication units (CCUs) mounted to a substrate and an interface that defines at least one contactless communications port for communicating extremely high frequency (EHF) contactless signals is provided. The contactless signal conduit can include a support structure constructed to be secured to the substrate and positioned over the CCUs, the support structure comprising an opening that exposes the CCUs, and a compliant structure constructed from a conductive material that is positioned within the opening and is positioned above the CCUs, the compliant structure defining at least one EHF containment channel existing between first and second surfaces of the compliant structure.

In another embodiment, a launch assembly for use in connection with a waveguide is provided. The launch assembly can include a substrate, a contactless communications unit (CCU) mounted to the substrate, and a launch coupled to the substrate in position over the CCU and configured to interface with the waveguide. The launch can include a cover region, a transition region, and a waveguide interface region, wherein each of the regions comprises inner dimensions that form part of a channel that serves as a conduit through which contactless signals travel between the CCU and the waveguide, wherein the cover region is mounted to the substrate and comprises first inner dimensions that impedance match to the CCU, wherein the waveguide interface region is configured to interface with the waveguide and comprises second inner dimensions that are approximately the same as the dimensions of the waveguide, and wherein the transition region is positioned between the cover and waveguide interface regions and comprises third inner dimensions that transition sizing of the channel from the first inner dimensions to the second inner dimensions.

In yet another embodiment, an angled waveguide for use in transmitting contactless signals is provided that can include a first waveguide oriented along a first path, a second waveguide oriented along a second path that is angled relative to the first path, a redirection region coupled to the first and second waveguides, the redirection region comprising an angled edge operative to redirect contactless signals from the first path to the second path, wherein the angled edge is offset with respect to the first and second waveguides to promote constructive interference of the contactless signals as they transition from the first path to the second path.

In yet another embodiment, a redirection waveguide for use in transmitting contactless signal is provided that can include a first waveguide operative to transmit contactless signal along a first path, and a second waveguide coupled to the first waveguide and operative to transmit signals along second and third paths, wherein the second waveguide comprises a compensation network operative to redirect contactless signals from the first path to the second and third paths, wherein the compensation network promotes constructive interference of the contactless signals as they transition from the first path to the second and third paths.

In yet another embodiment, a waveguide can include a body portion comprising first and second circular-shaped ridges traversing a length of the body portion, a first circular member disposed in the first circular-shaped ridge, a second circular member disposed in the second circular-shaped ridge, and a conductive layer that encapsulates an outer surface of the body portion, the first circular member, and the second circular member.

In yet another embodiment, a waveguide can include a body portion comprising first and second triangular-shaped ridges traversing a length of the body portion.

BRIEF DESCRIPTION OF THE DRAWINGS

Figure 1:
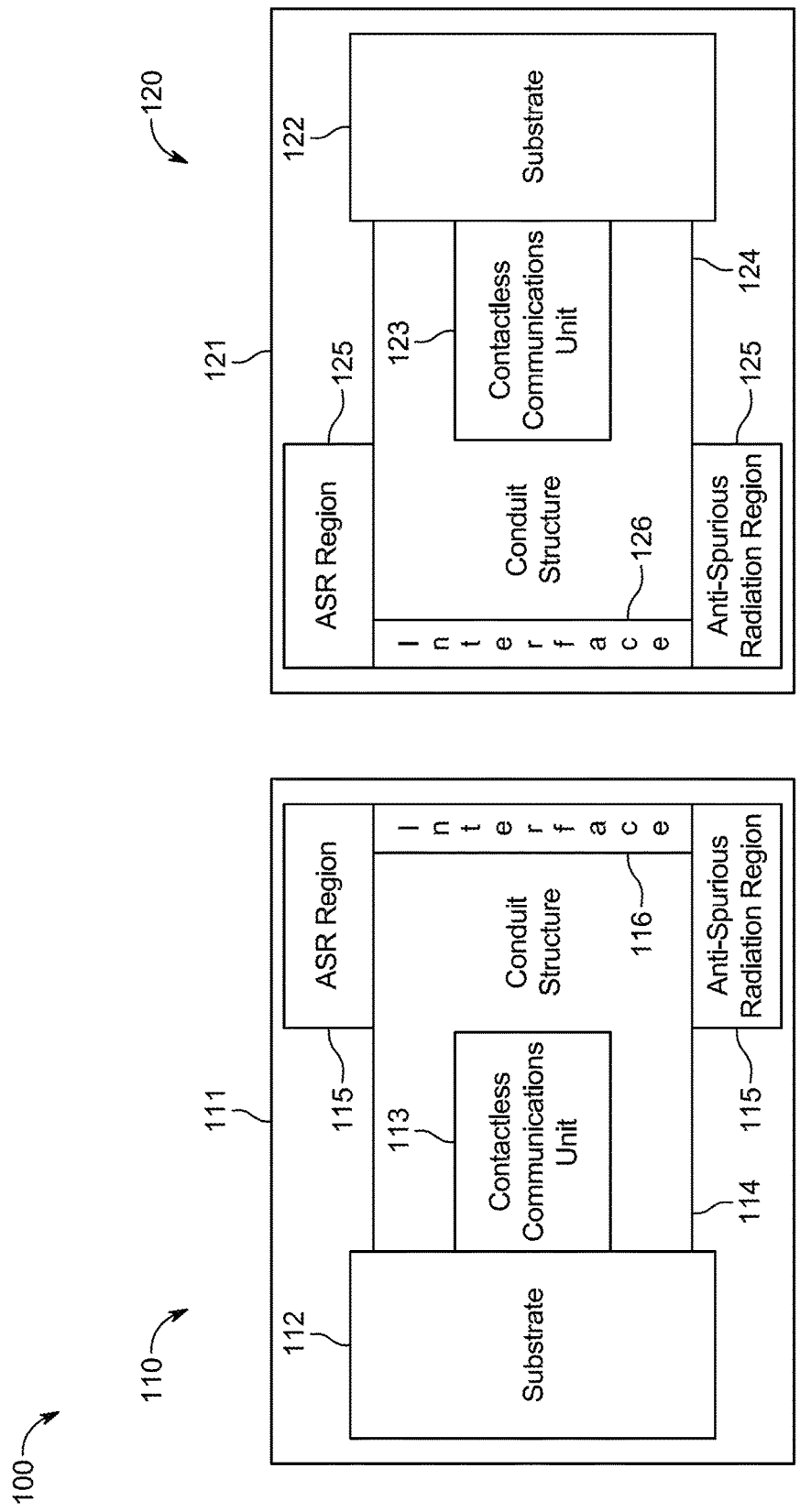
Figure 2A:
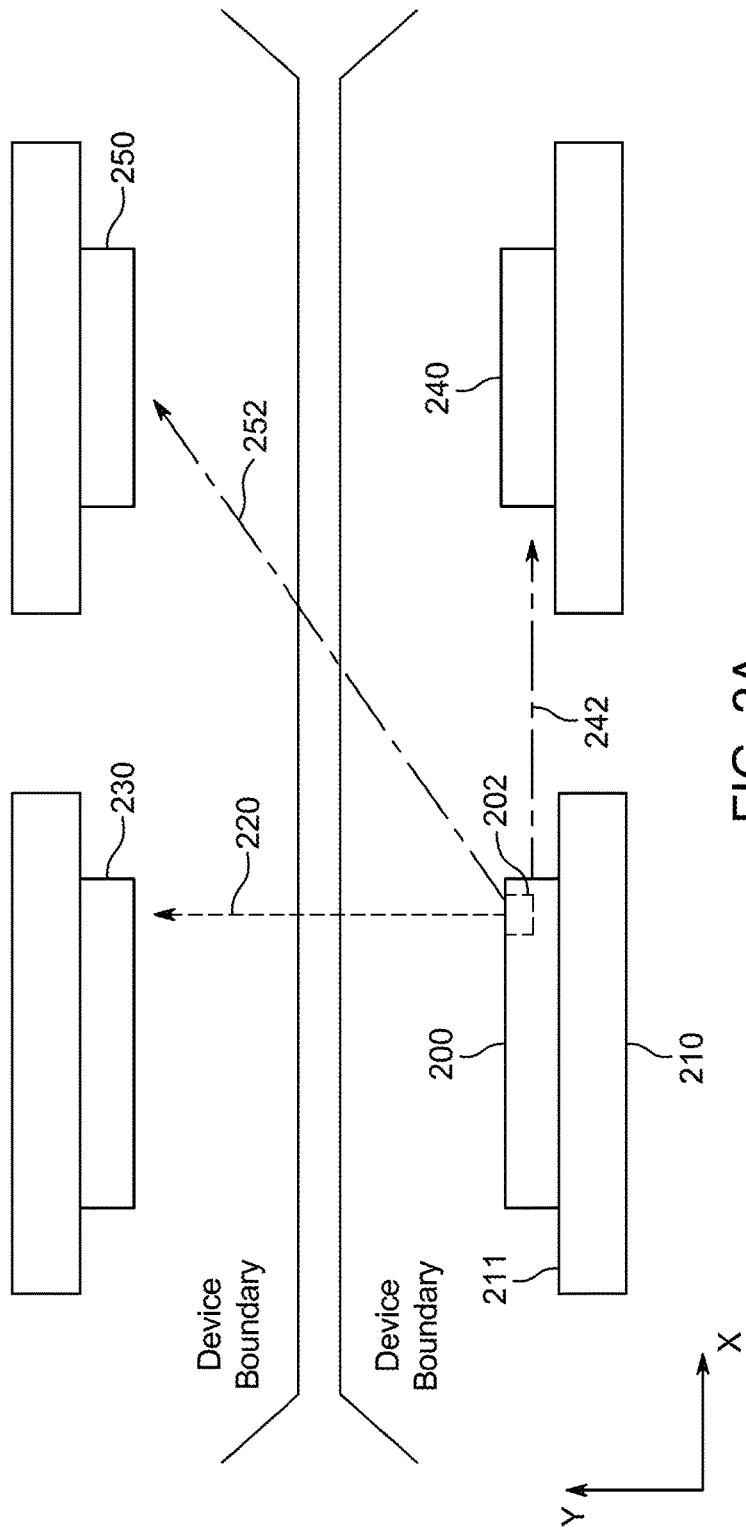
Figure 2B:
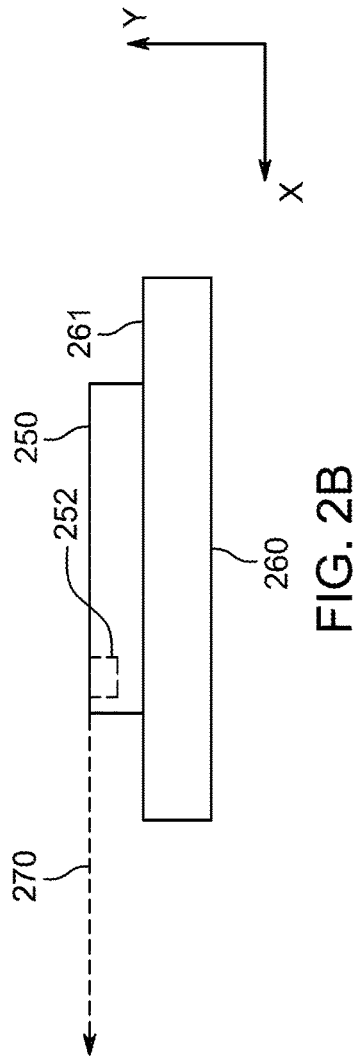
Figure 3:
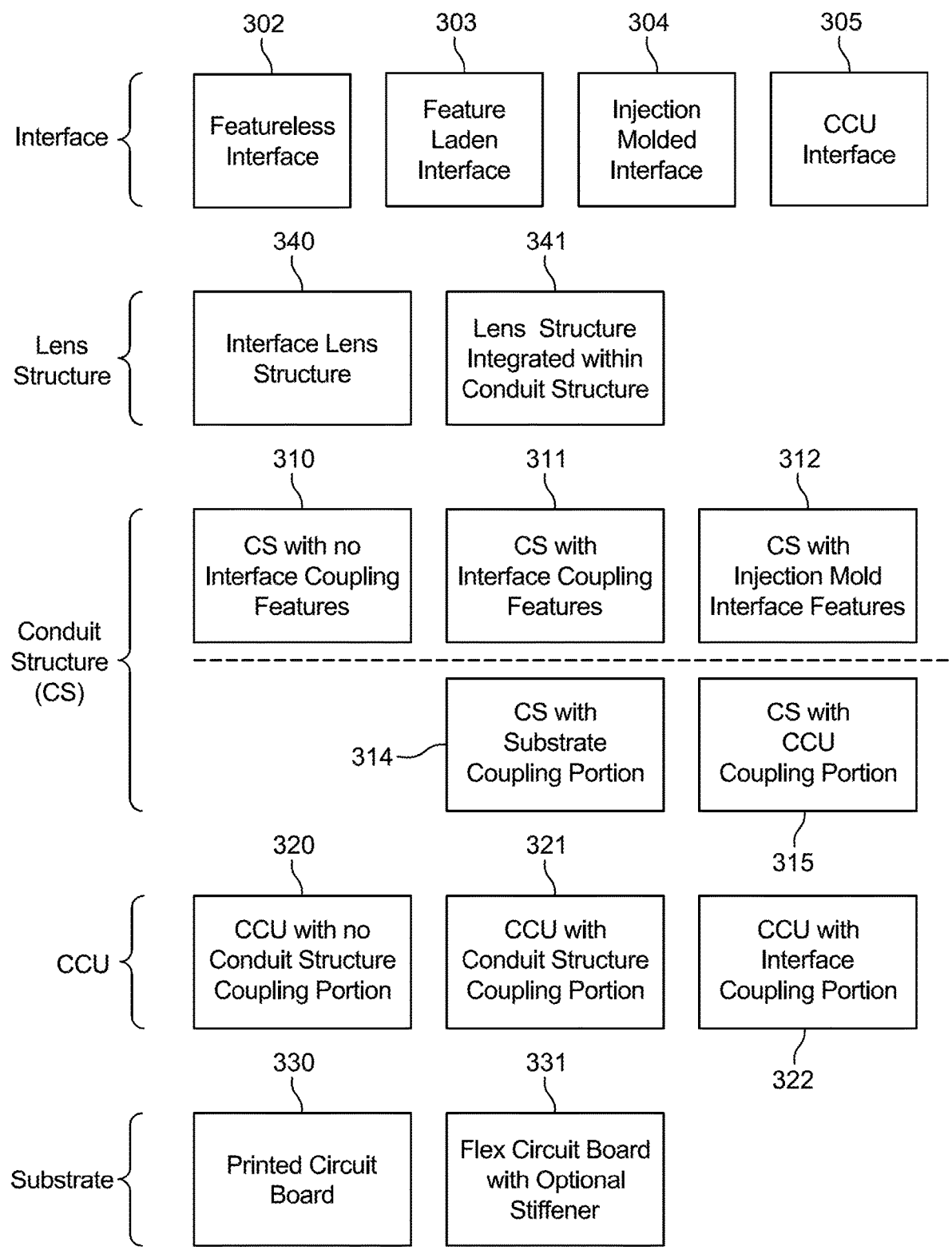
Figure 4:
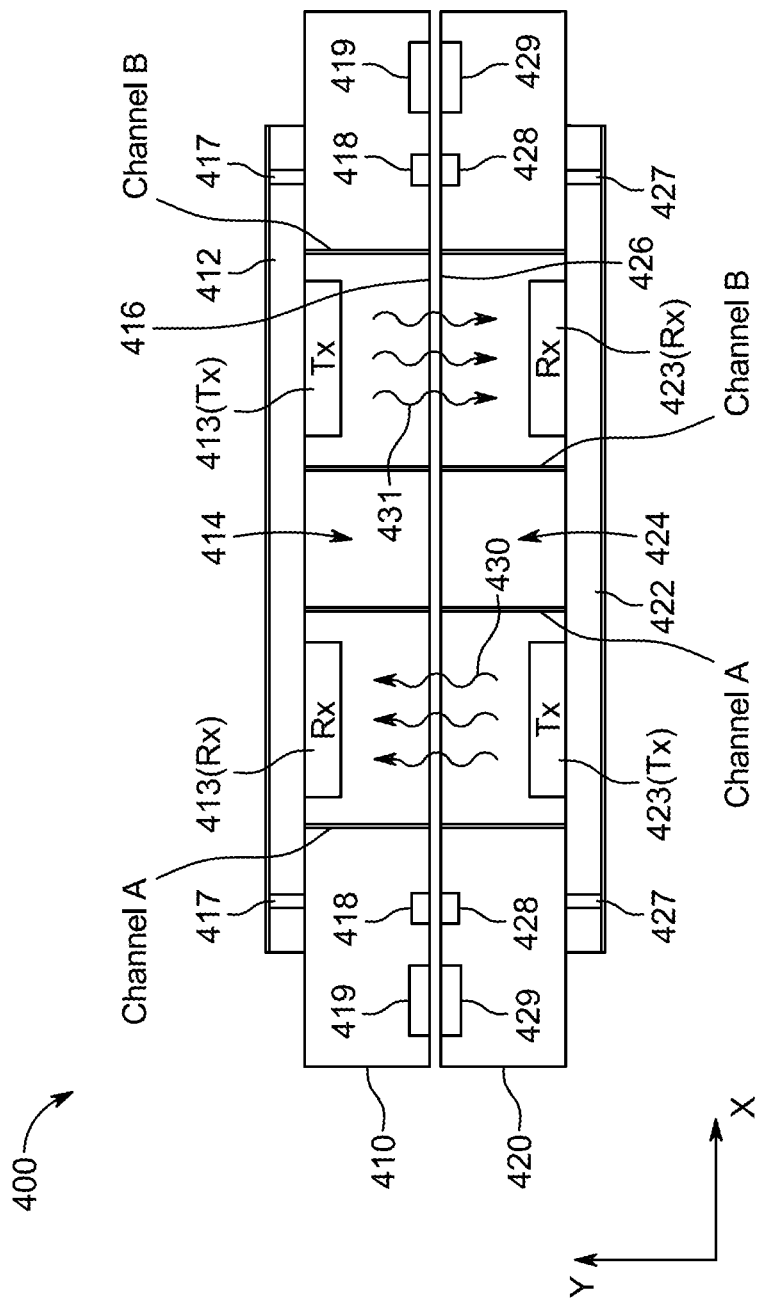
Figure 5A:
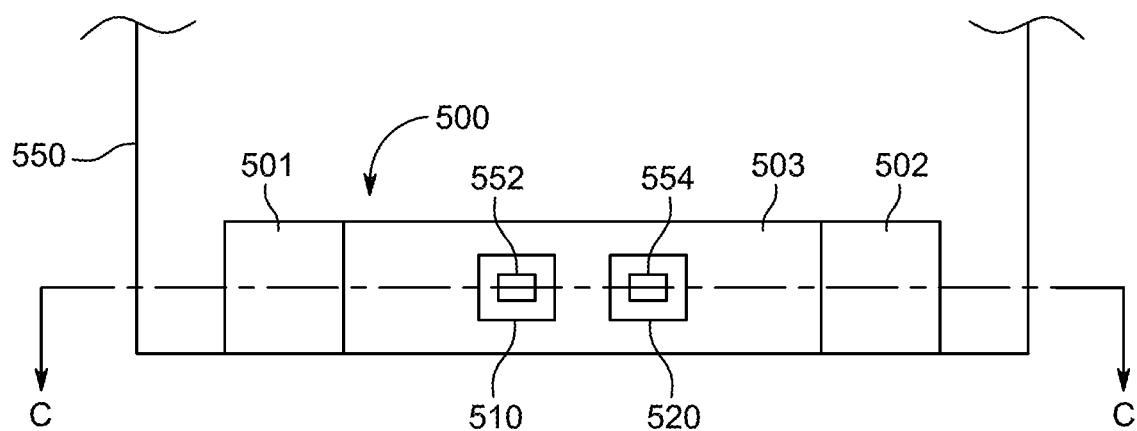
Figure 5B:
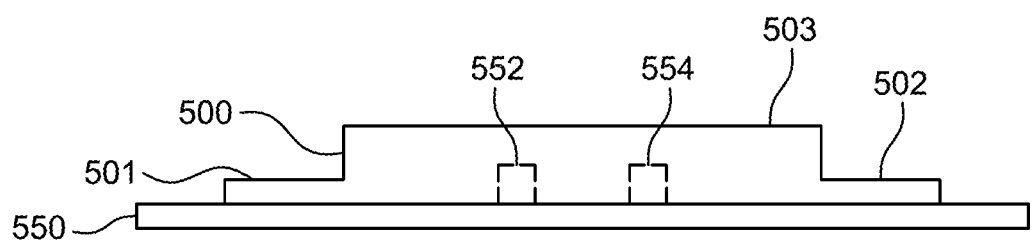
Figure 5C:
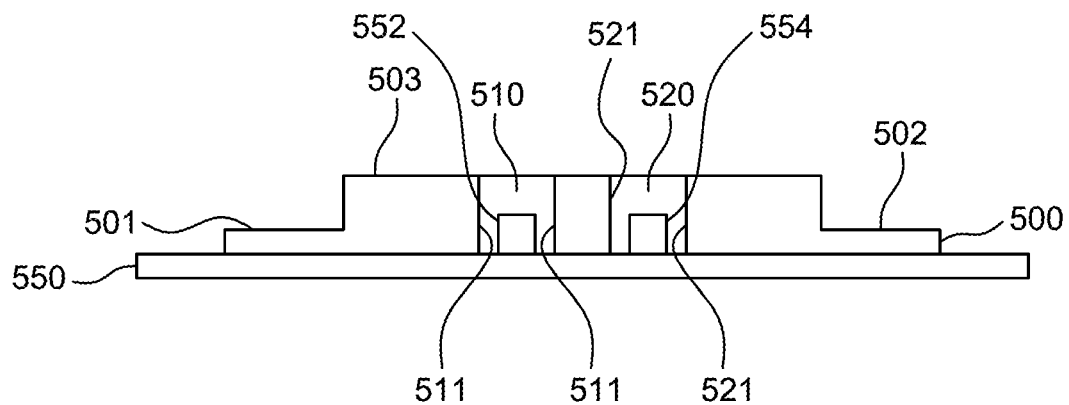
Figure 6A:
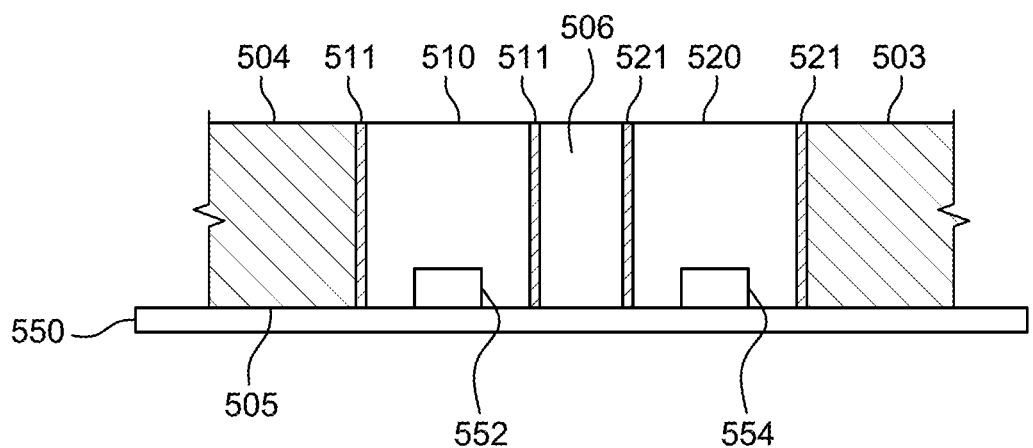
Figure 6B:
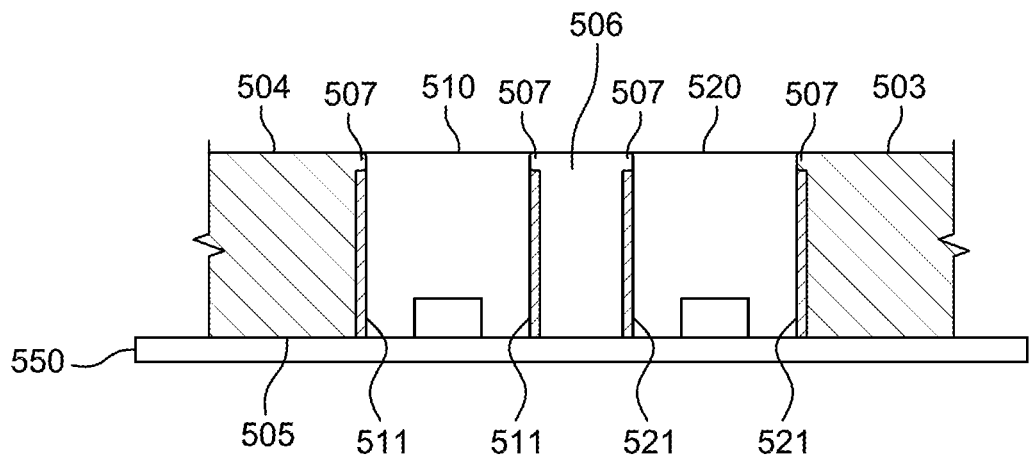
Figure 6C:
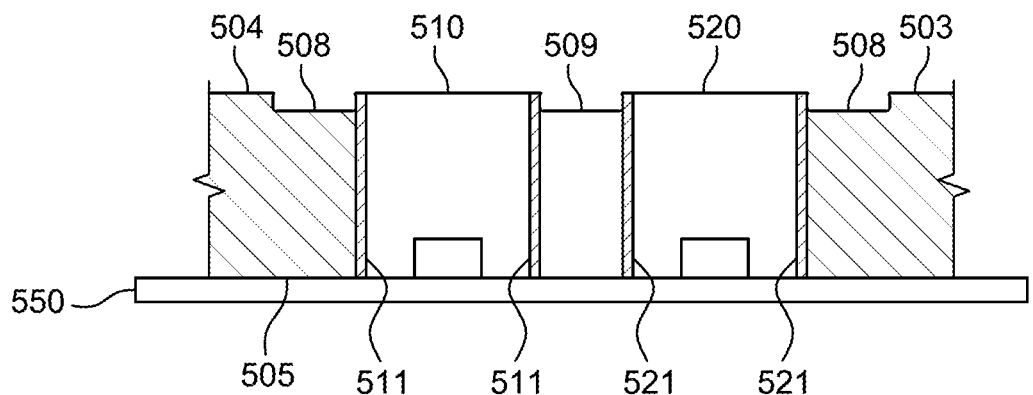
Figure 7A:
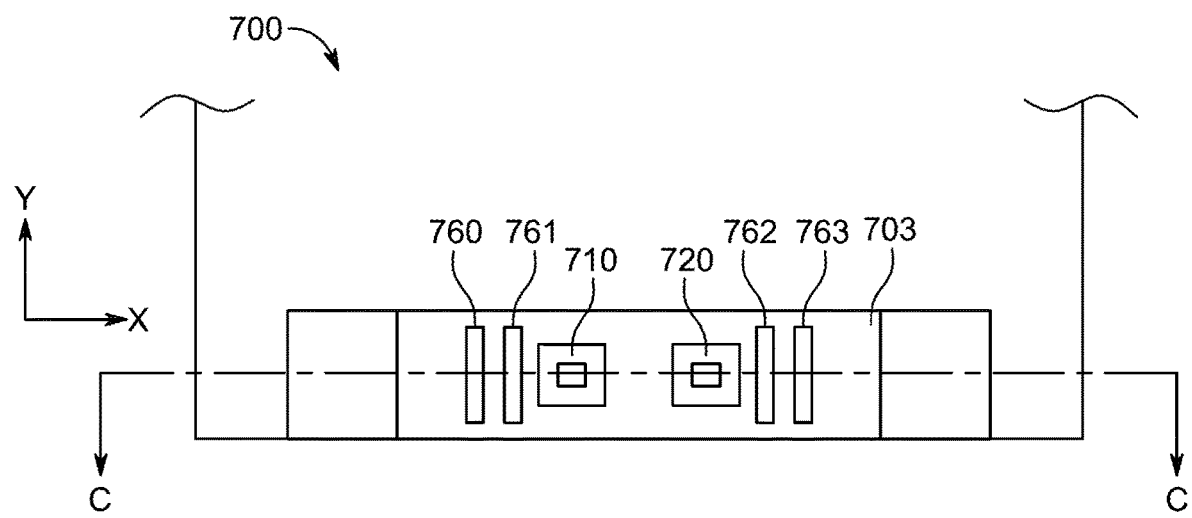
Figure 7B:
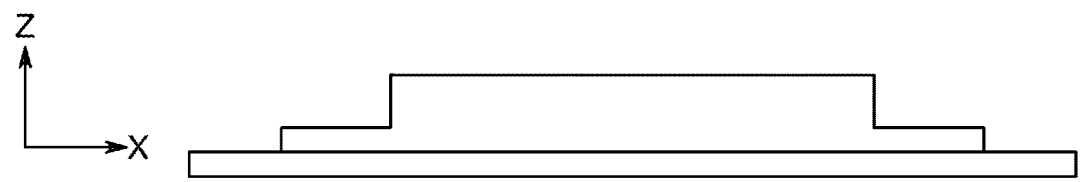
Figure 7C:
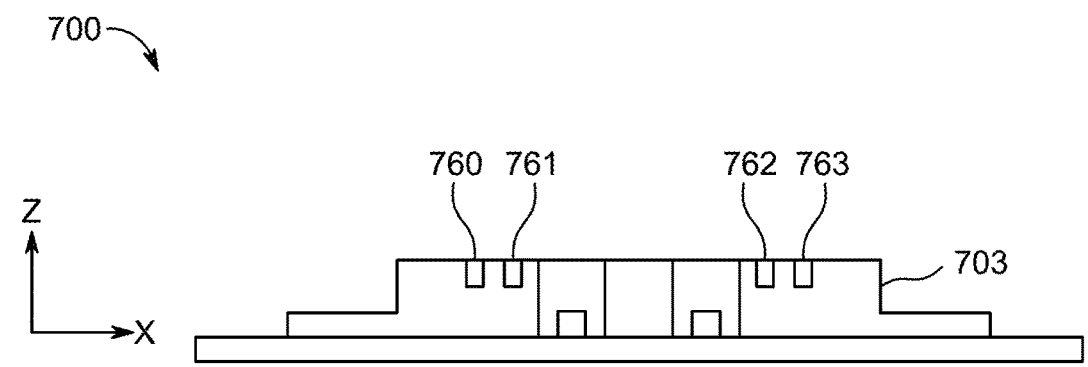
Figure 8:
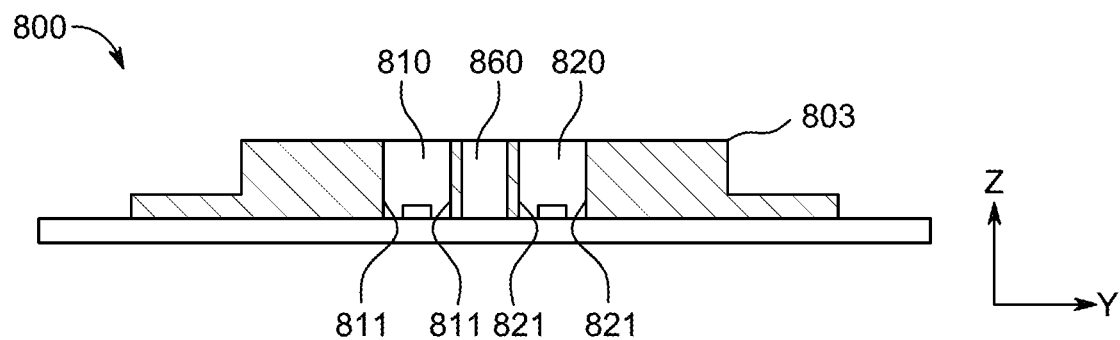
Figure 9:
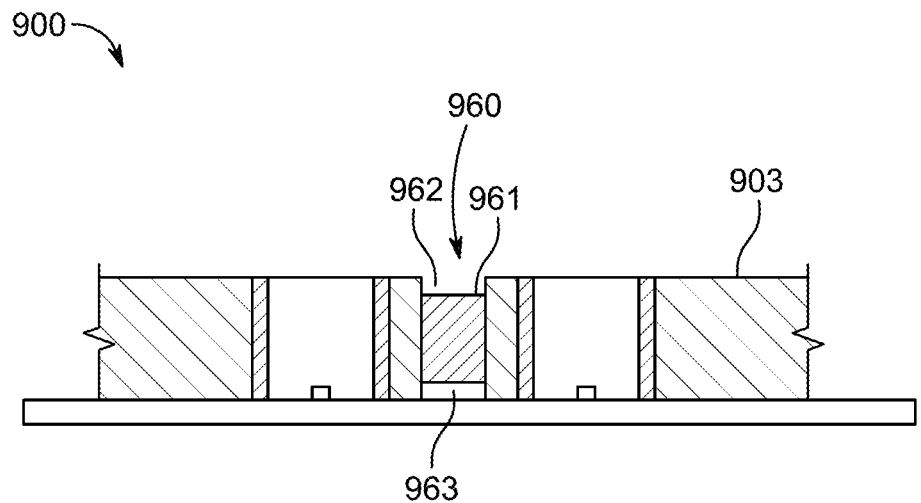
Figure 10:
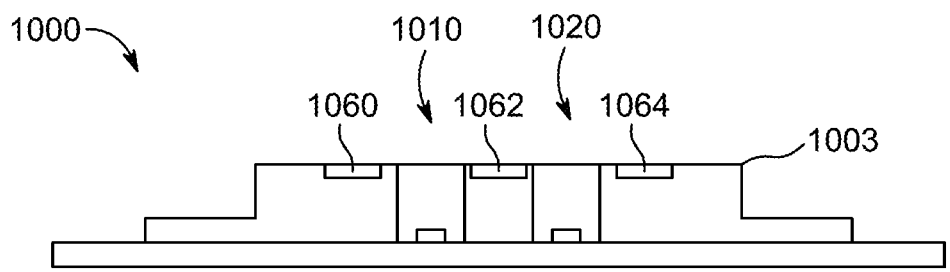
Figure 11:
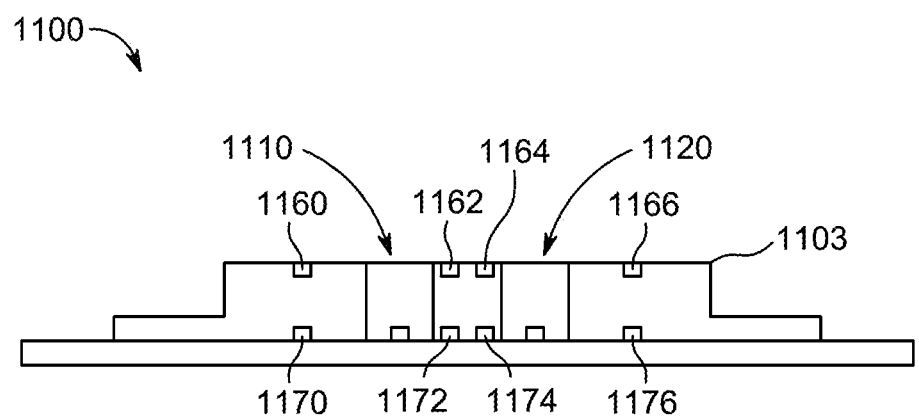
Figure 13:
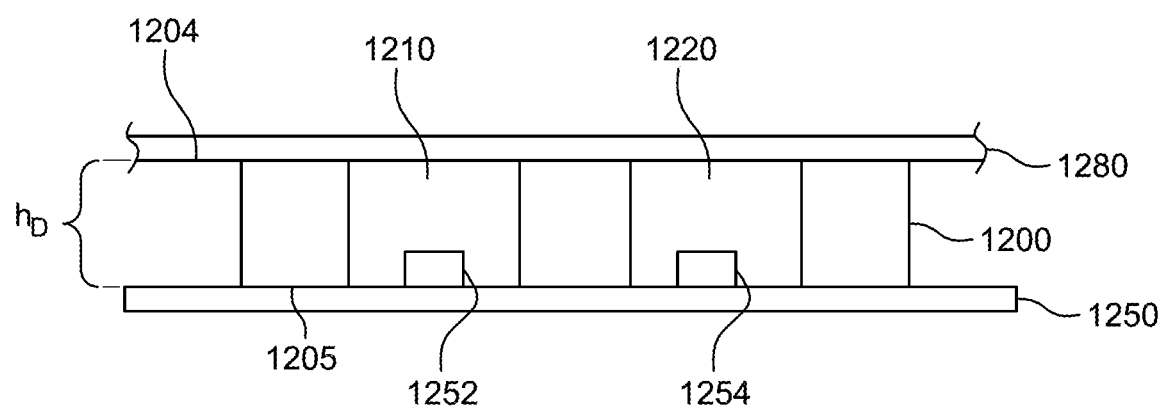
Figure 14A:
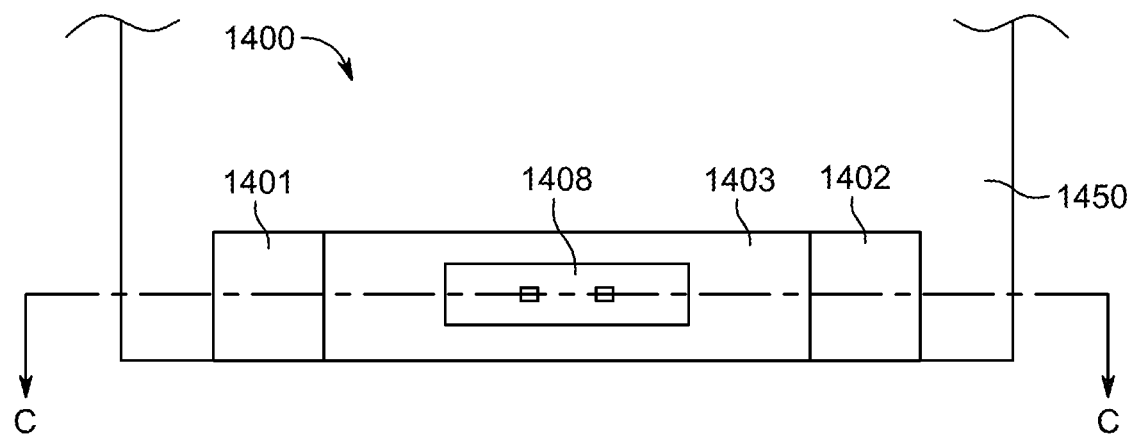
Figure 14B:
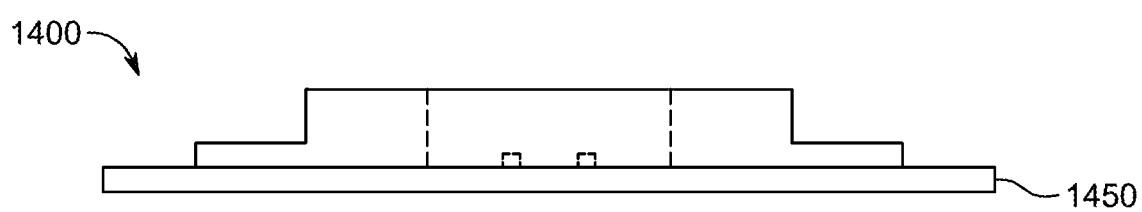
Figure 14C:
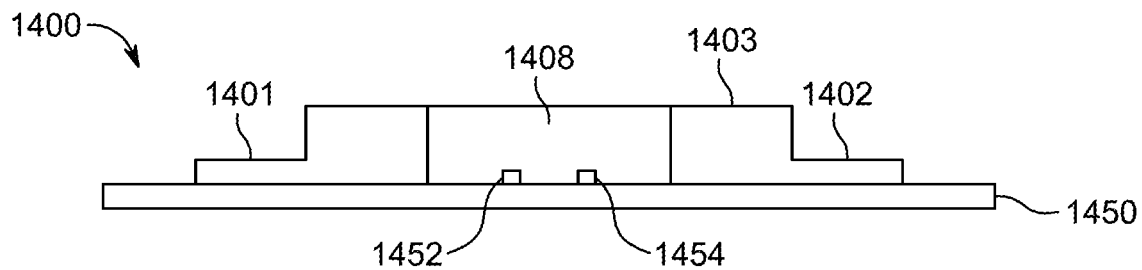
Figure 15A:
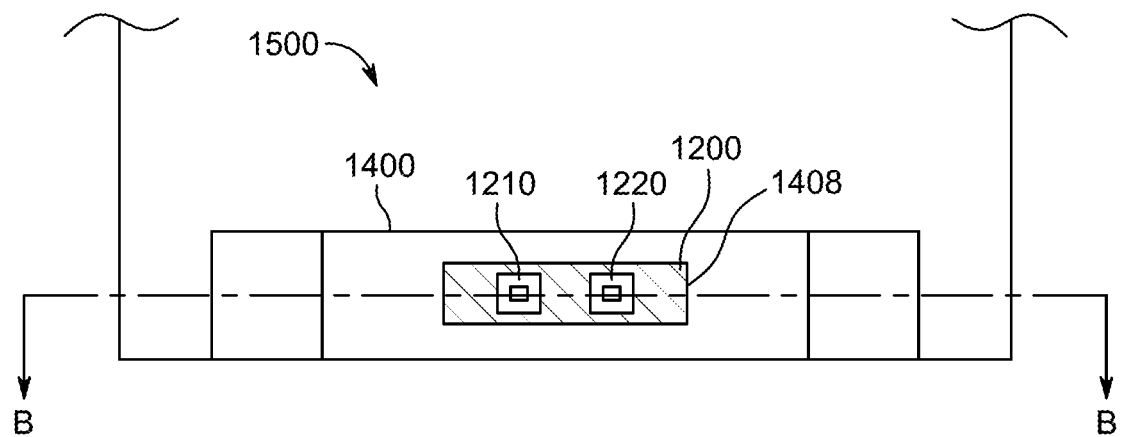
Figure 15B:
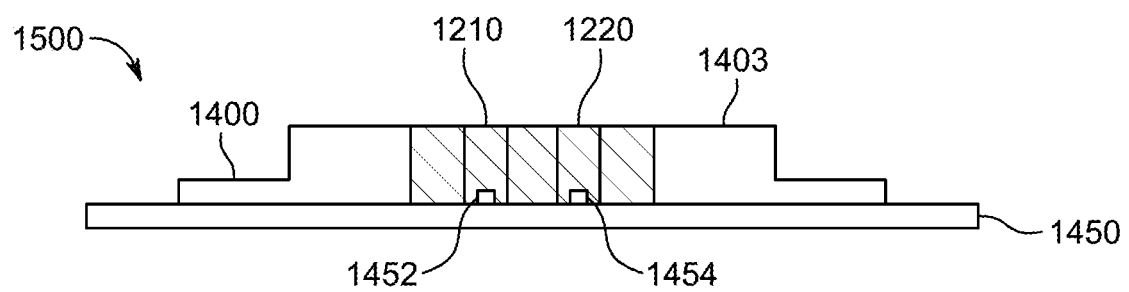
Figure 16:
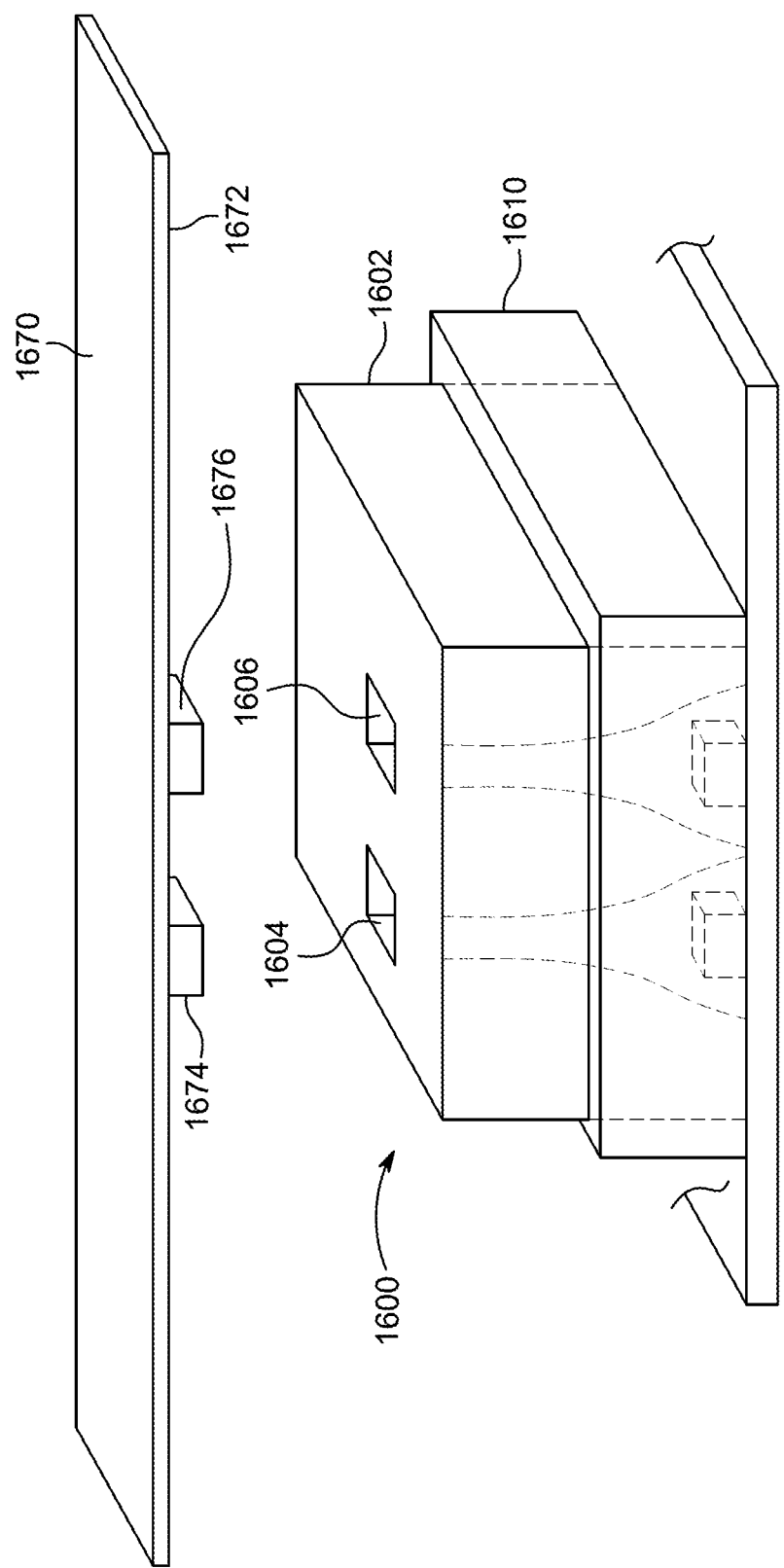
Figure 17A:
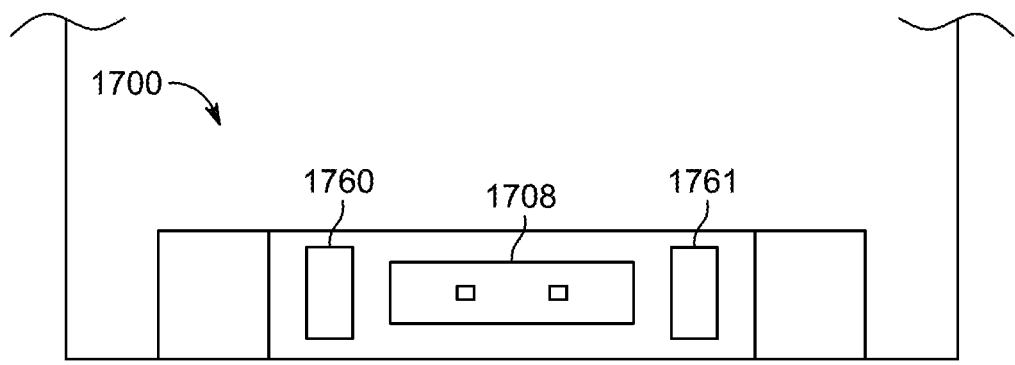
Figure 17B:
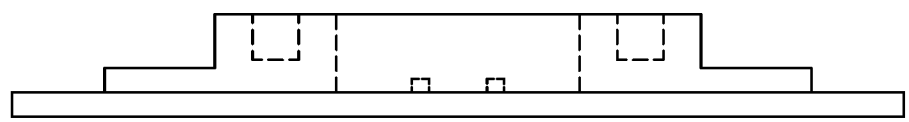
Figure 17C:
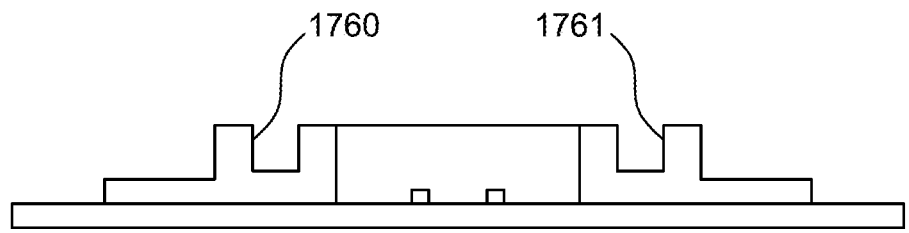
Figure 18A:
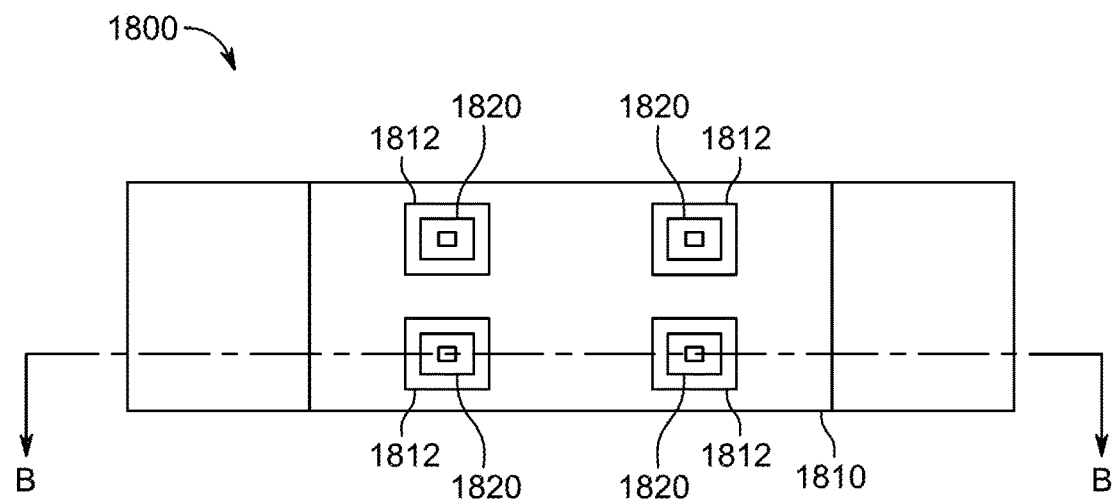
Figure 18B:
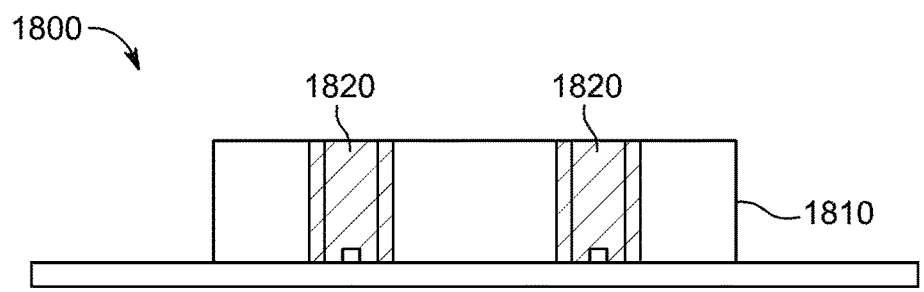
Figure 19A:
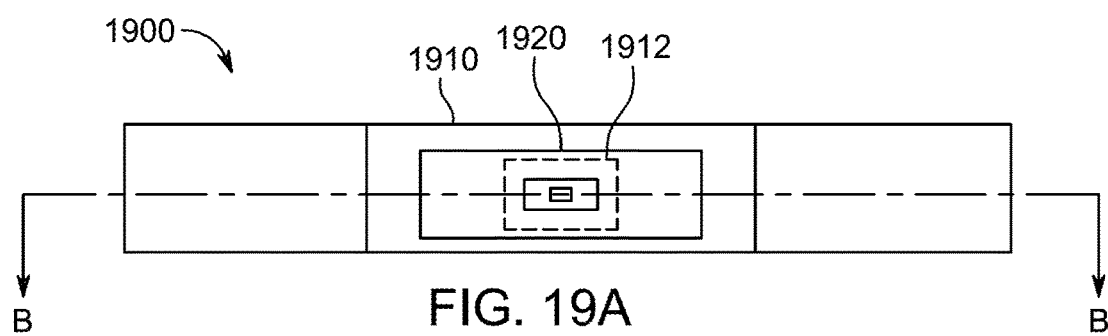
Figure 19B:
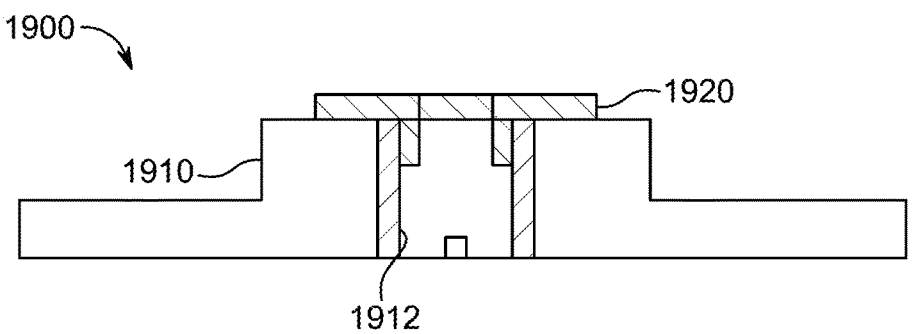
Figure 20A:
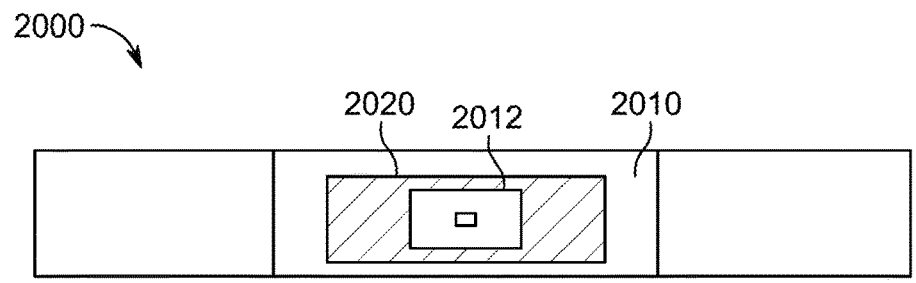
Figure 20B:
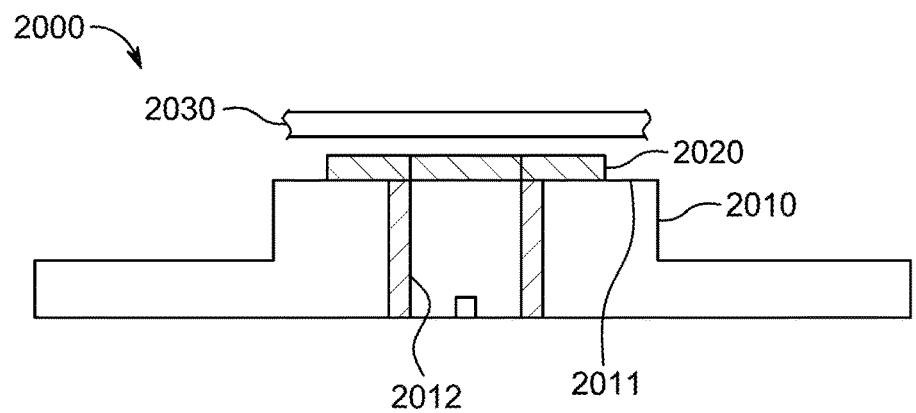
Figure 21A:
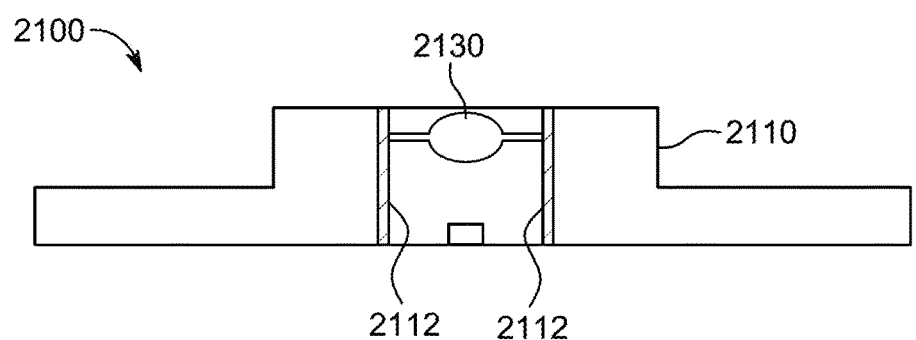
Figure 21B:
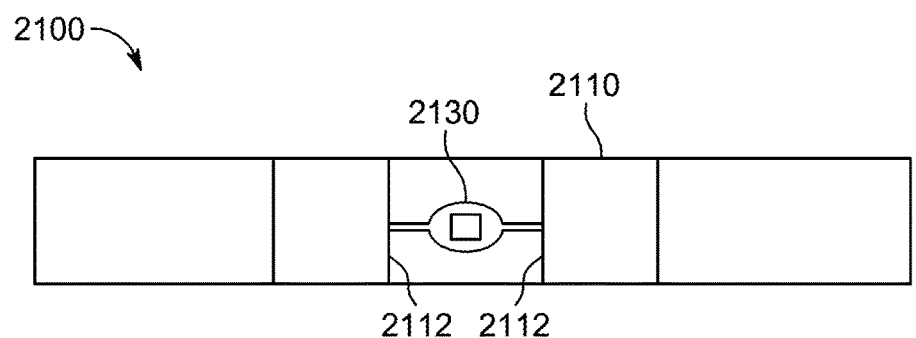
Figure 22:
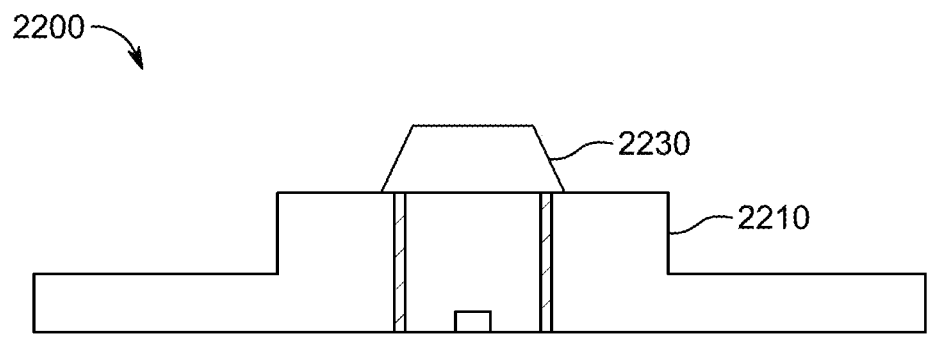
Figure 23:
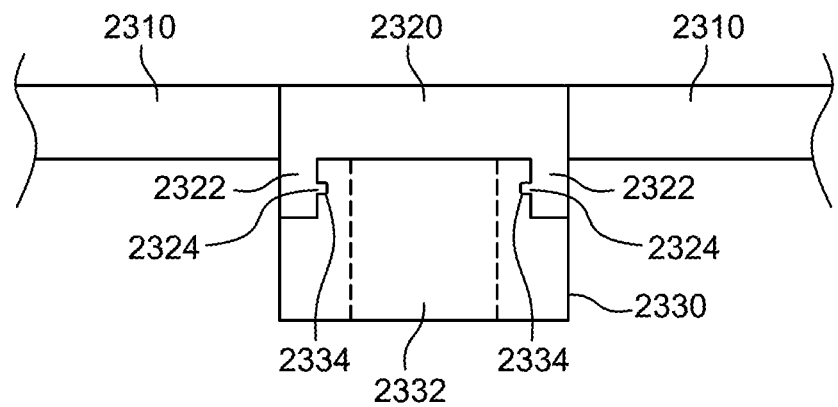
Figure 24:
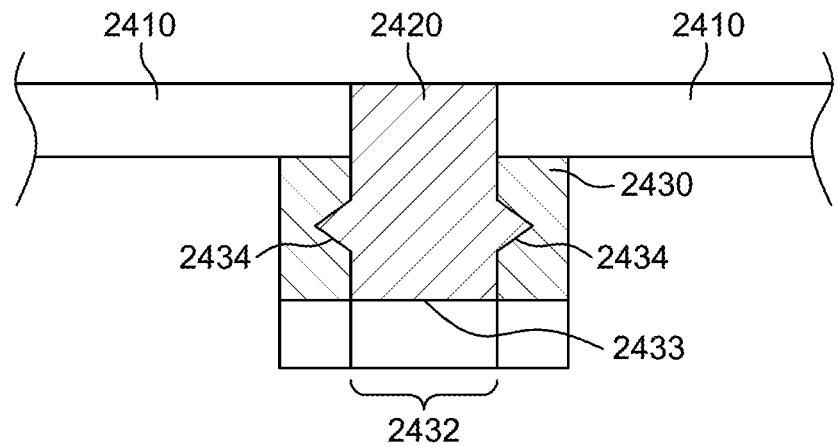
Figure 25:
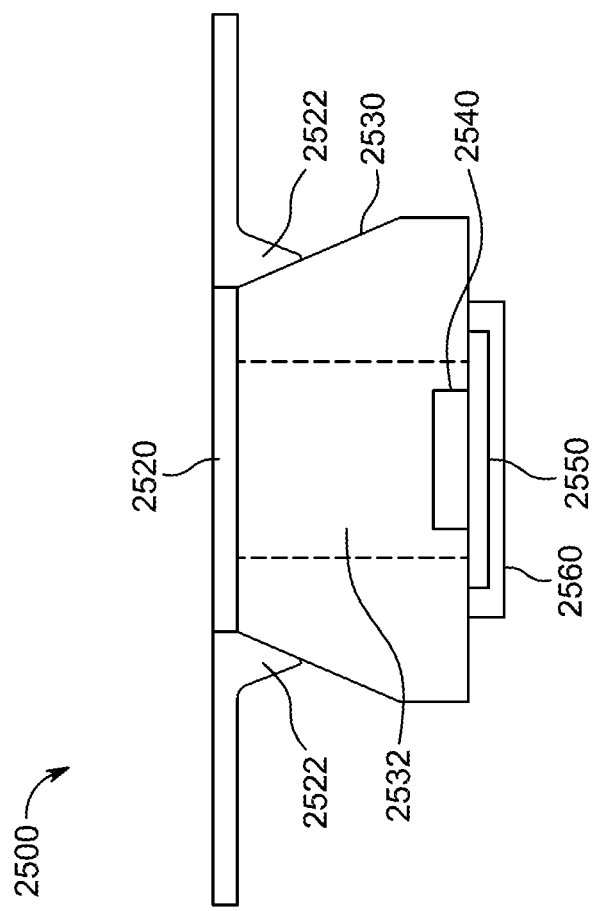
Figure 26A:
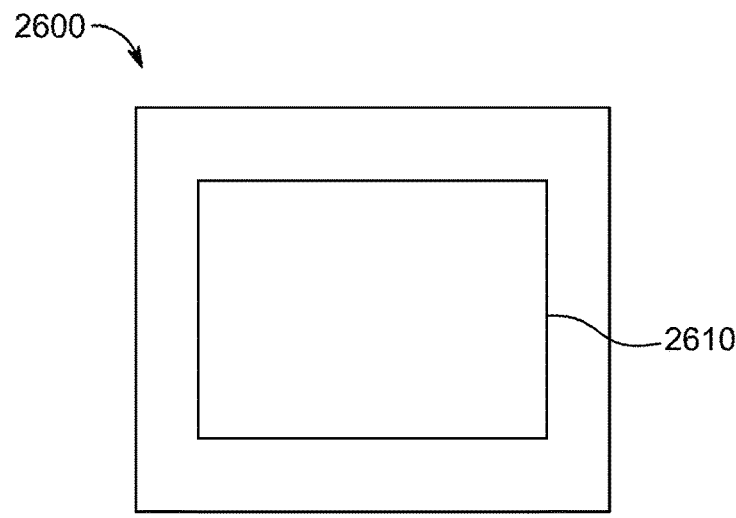
Figure 26B:
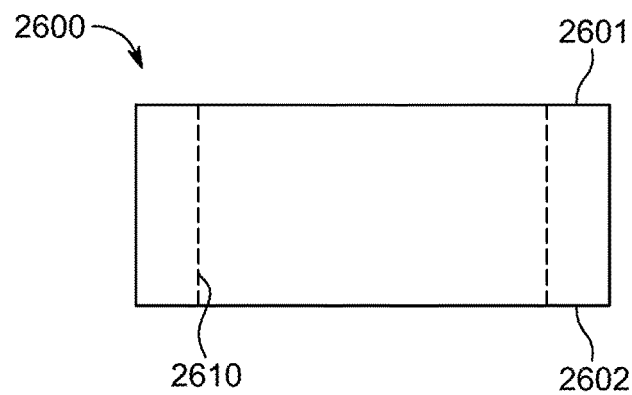
Figure 26C:
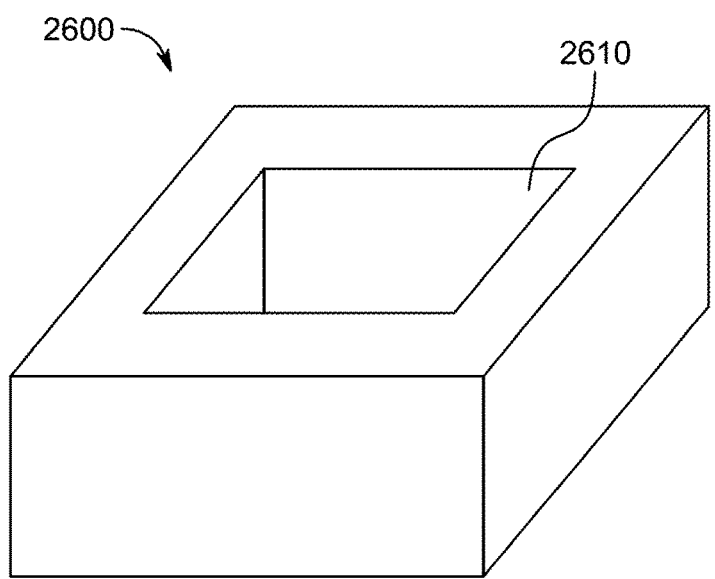
Figure 27A:
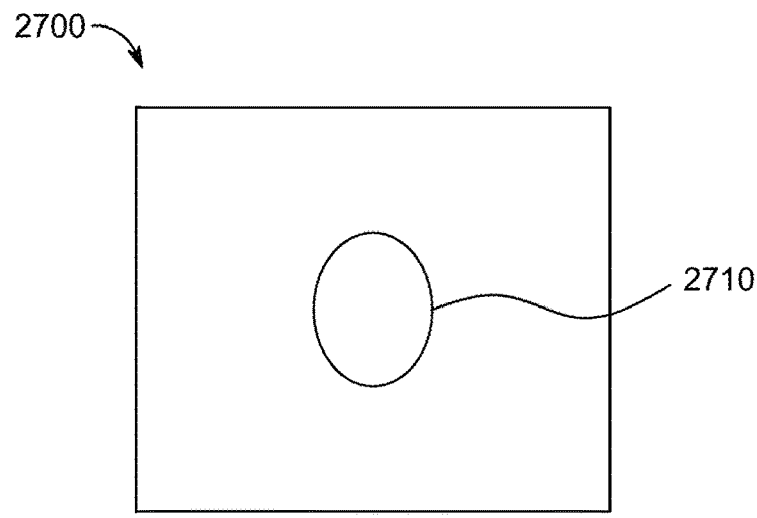
Figure 27B:
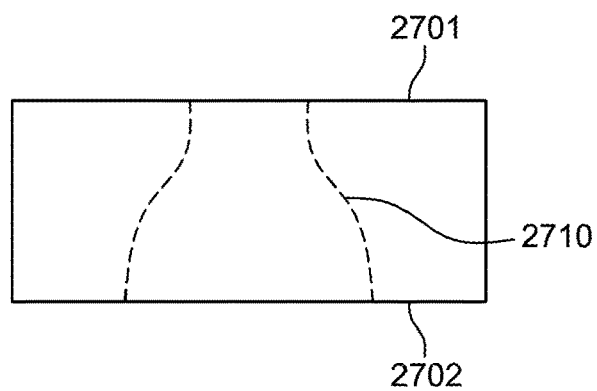
Figure 27C:
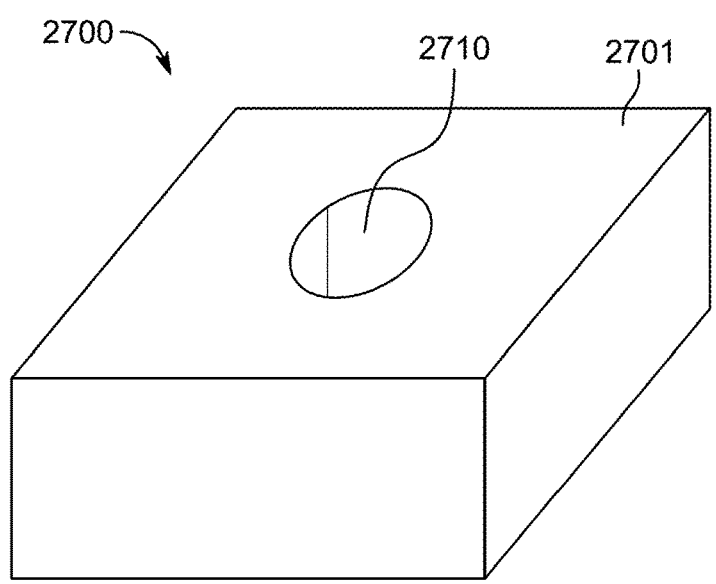
Figure 28A:
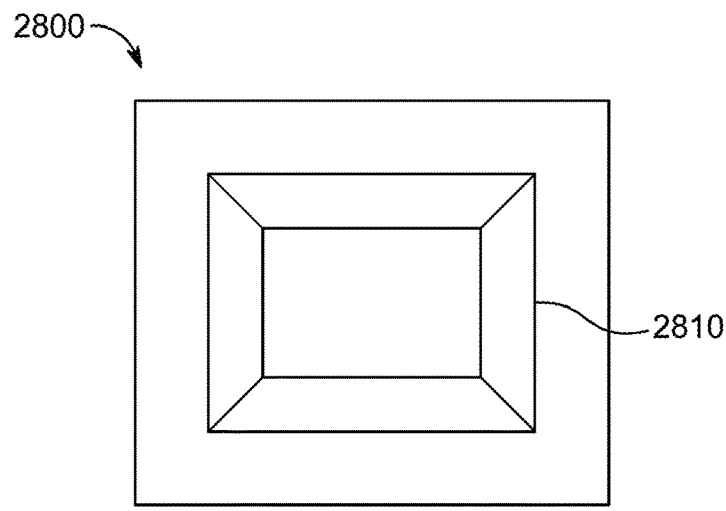
Figure 28B:
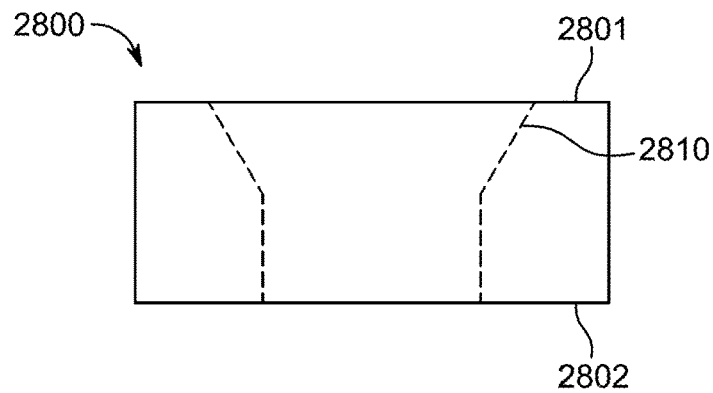
Figure 28C:
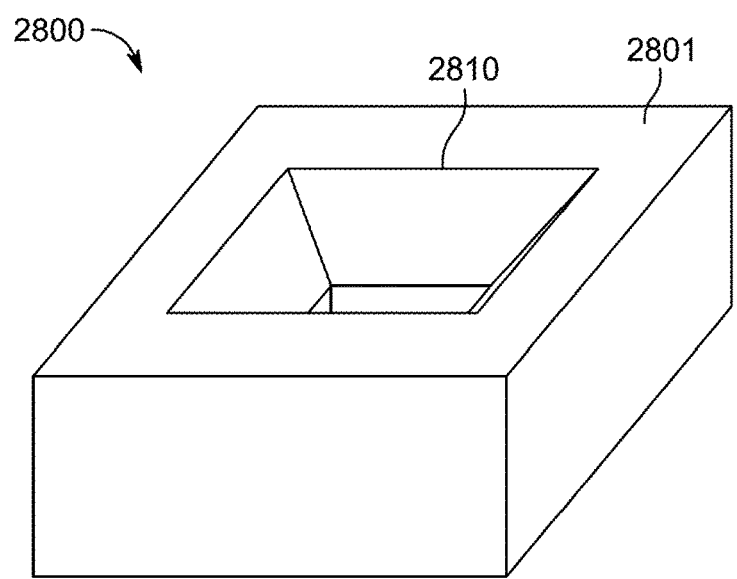
Figure 29A:
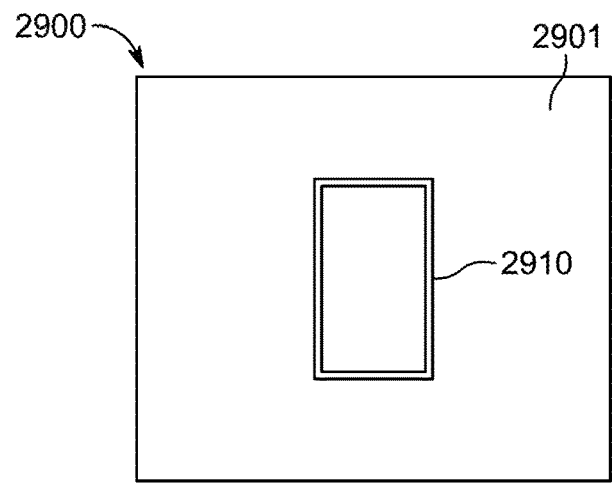
Figure 29B:
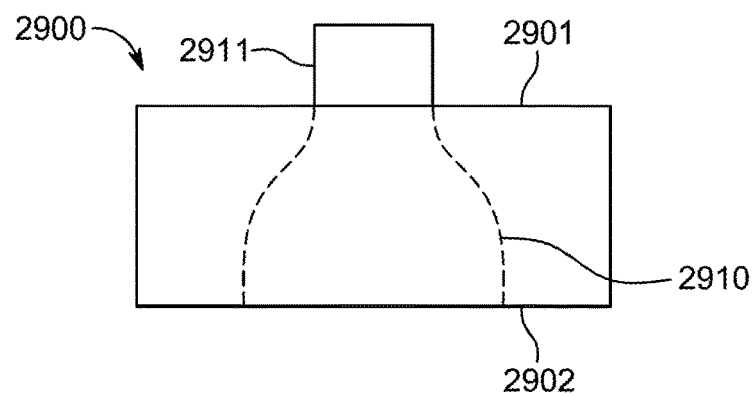
Figure 29C:
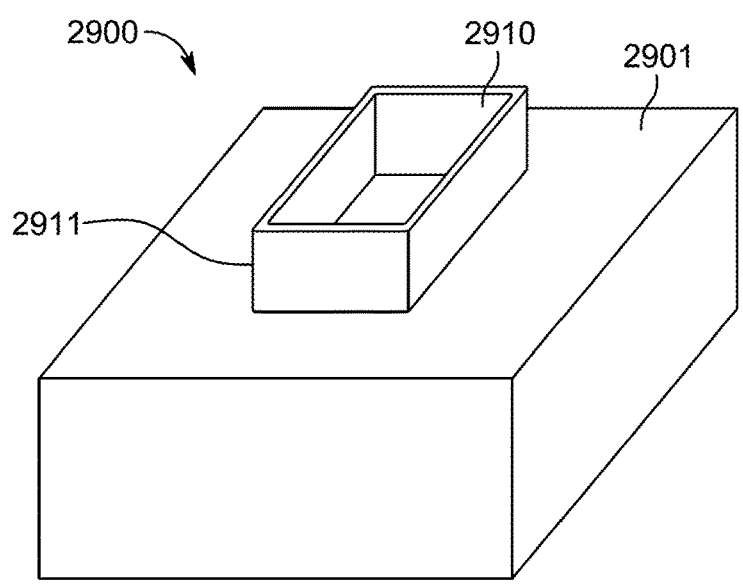
Figure 31A:
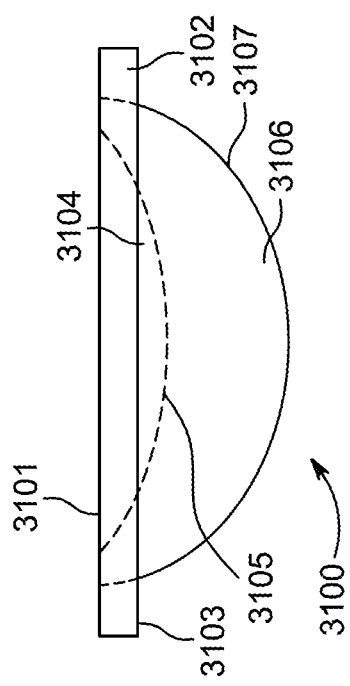
Figure 31B:
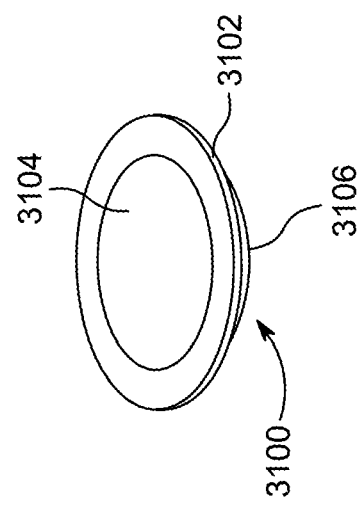
Figure 33:
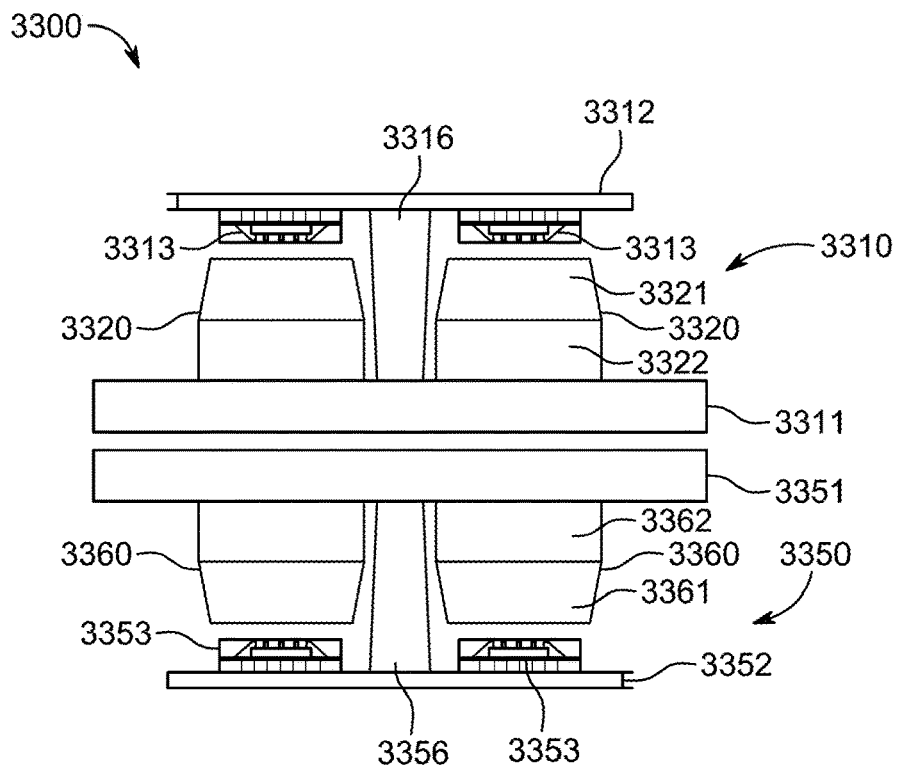
Figure 34:
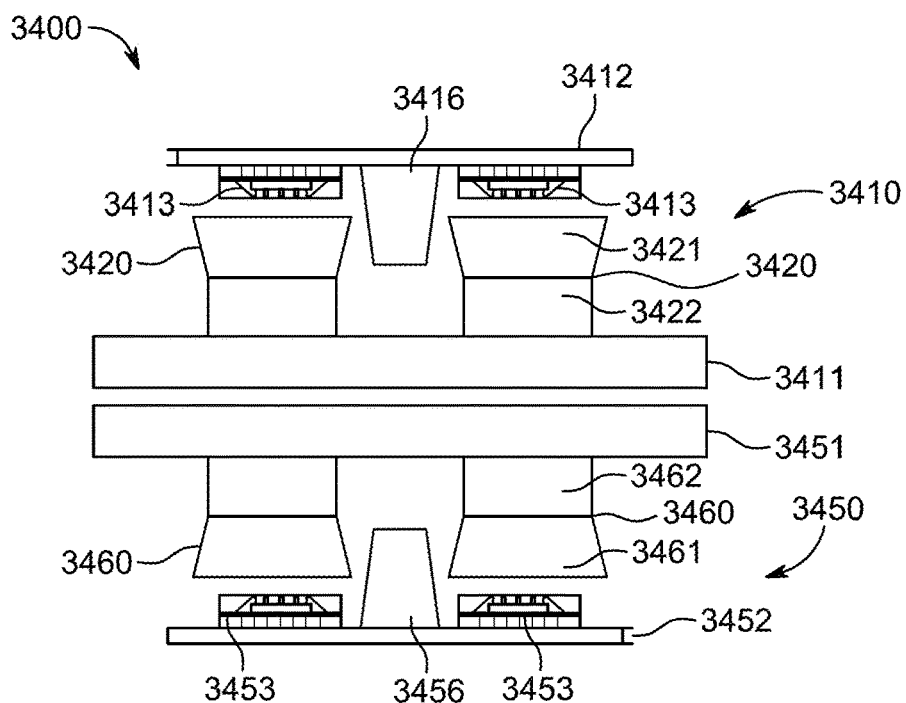
Figure 35:
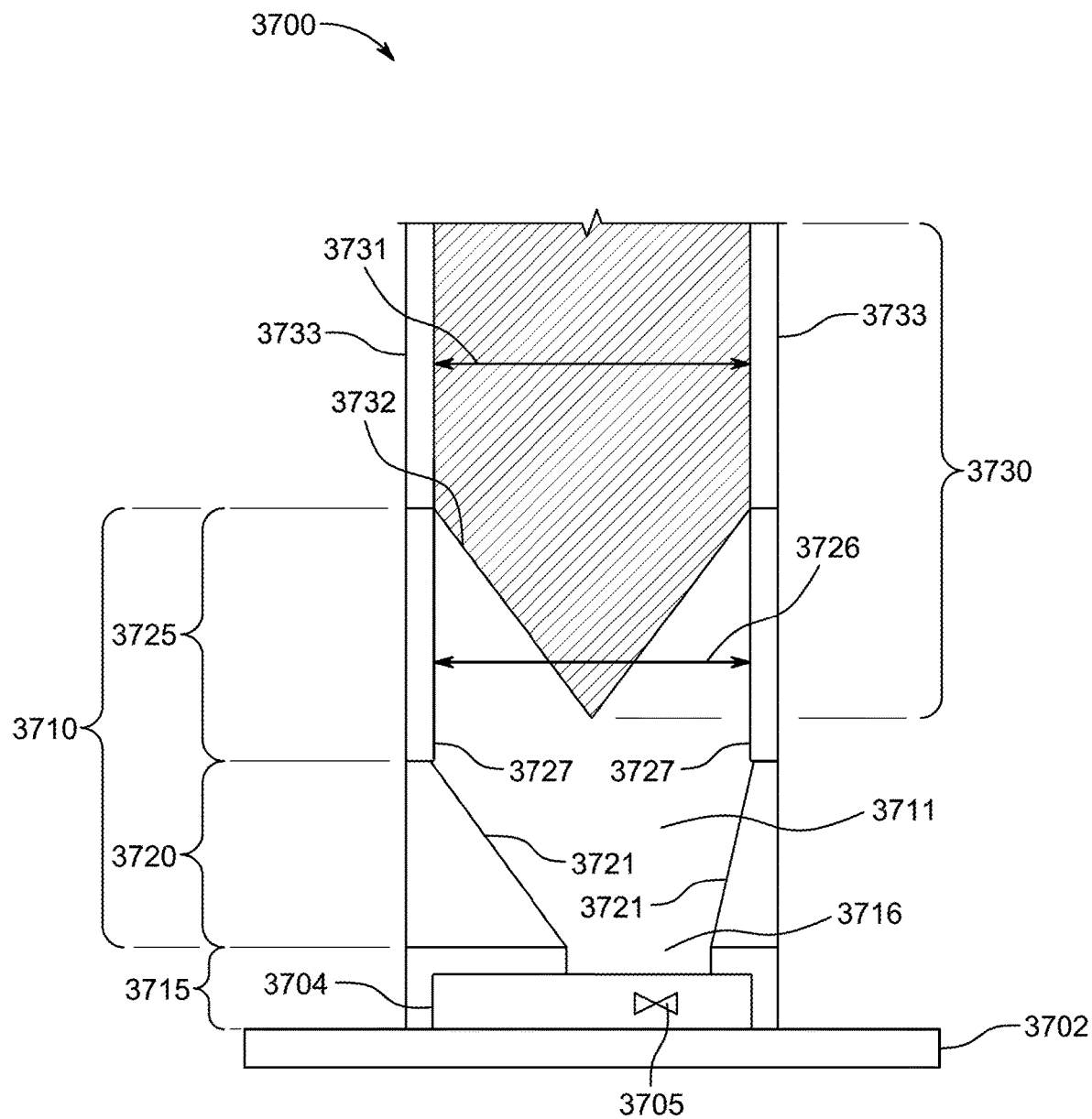
Figure 36:
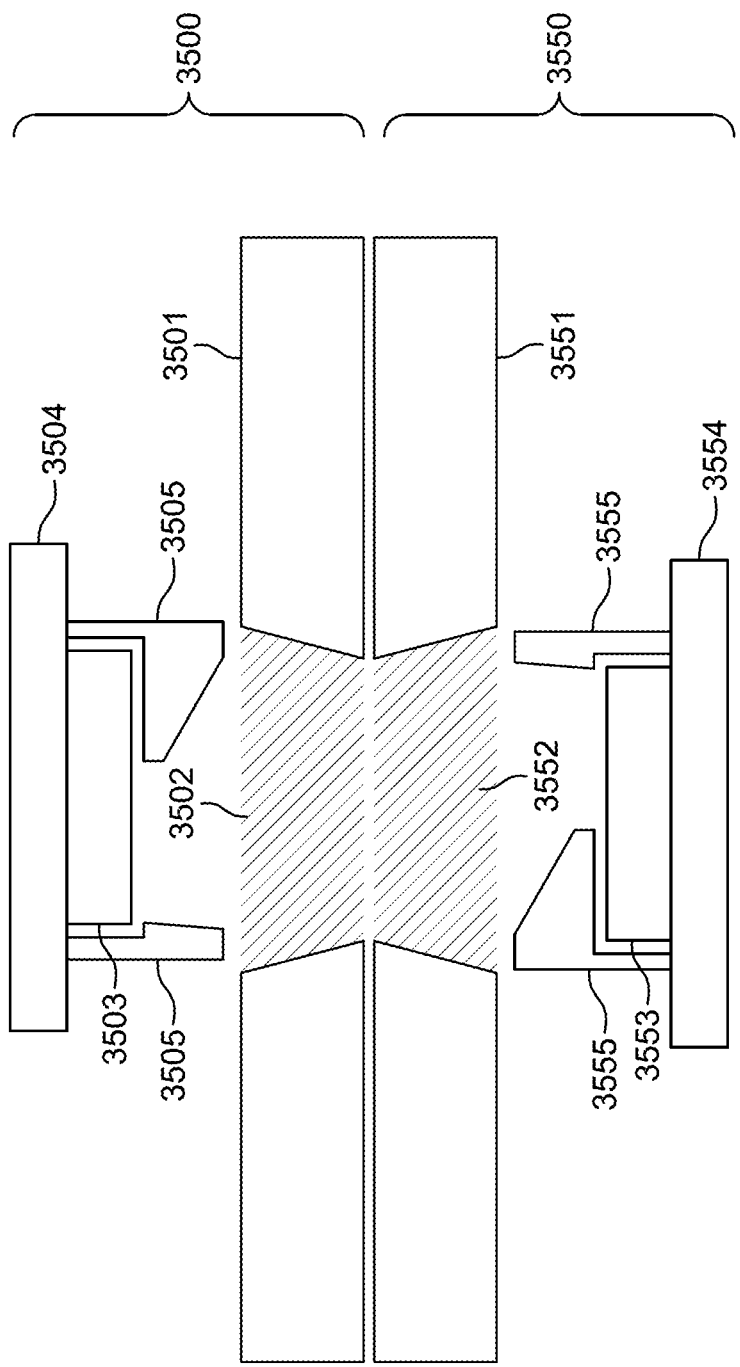
Figure 37:
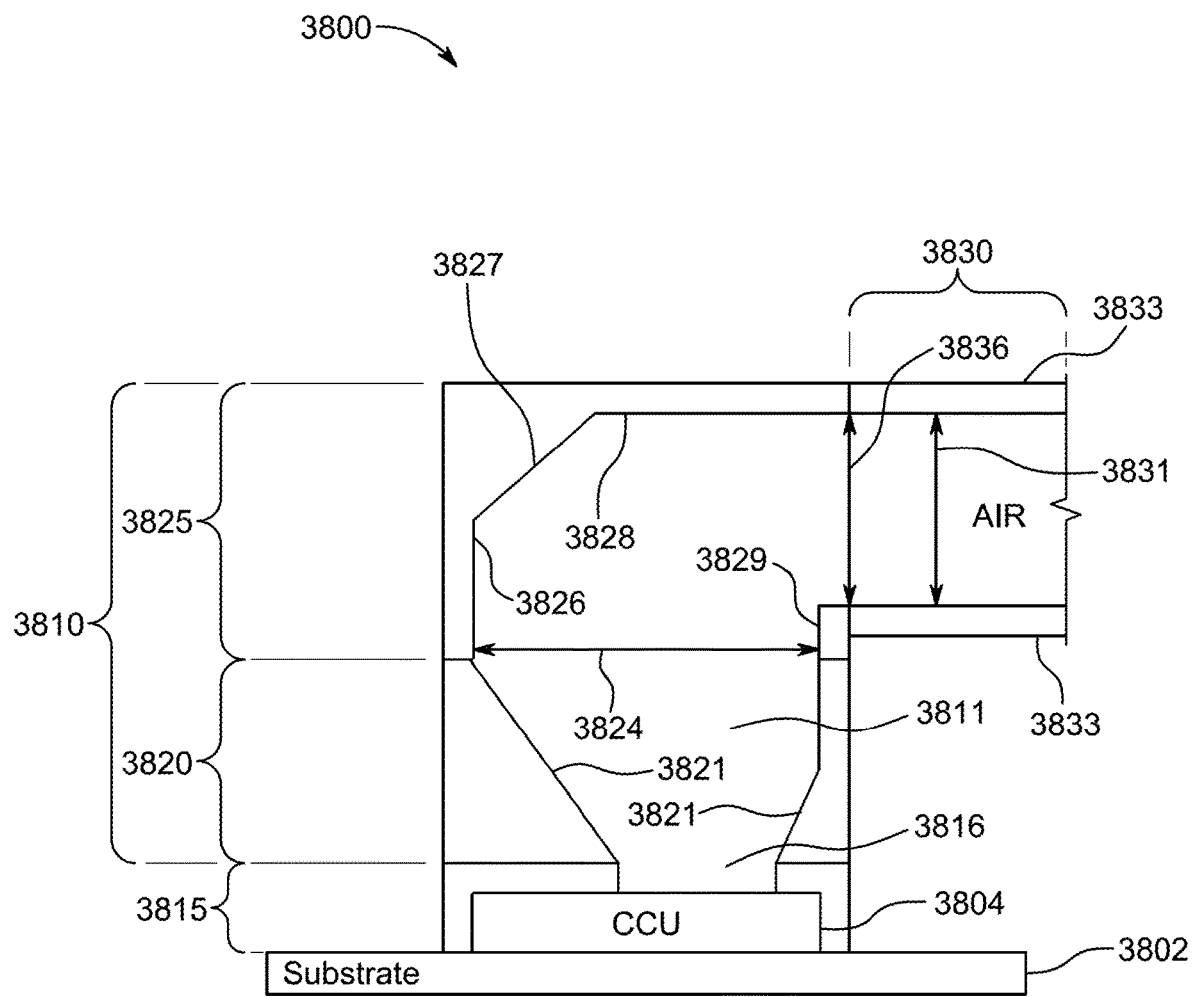
Figure 38:
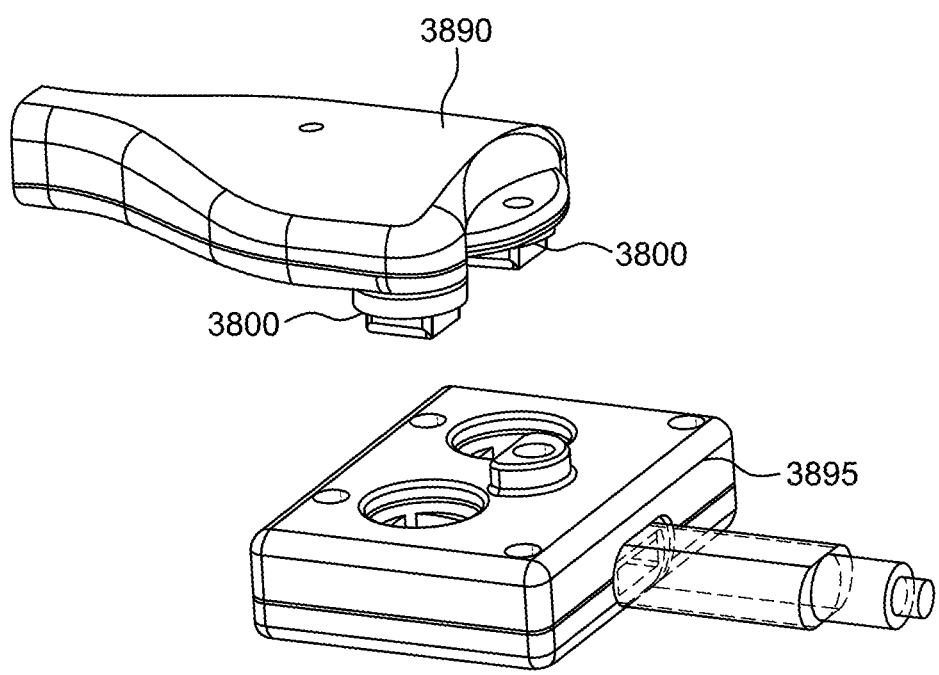
Figure 39A:
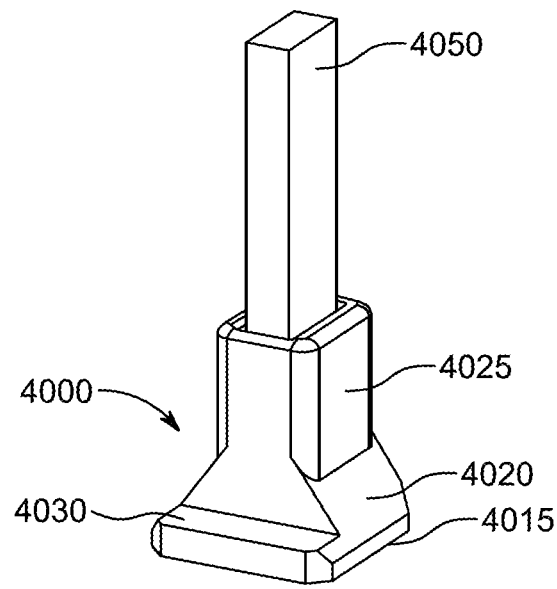
Figure 39B:
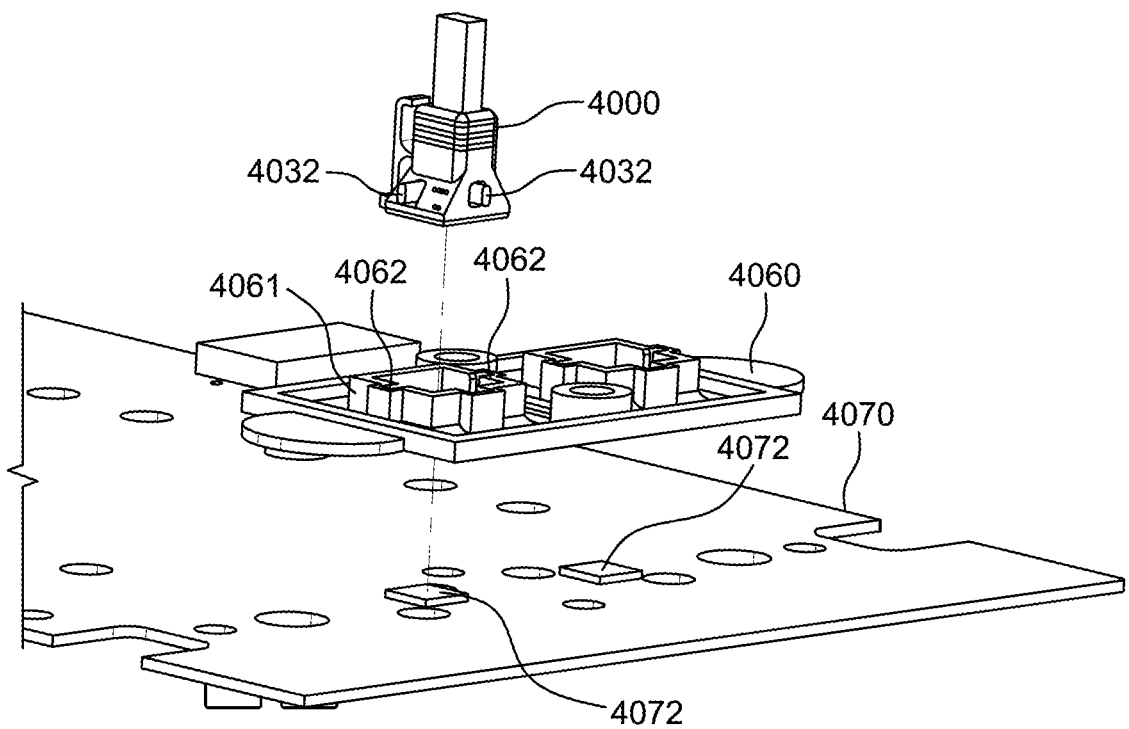
Figure 40A:
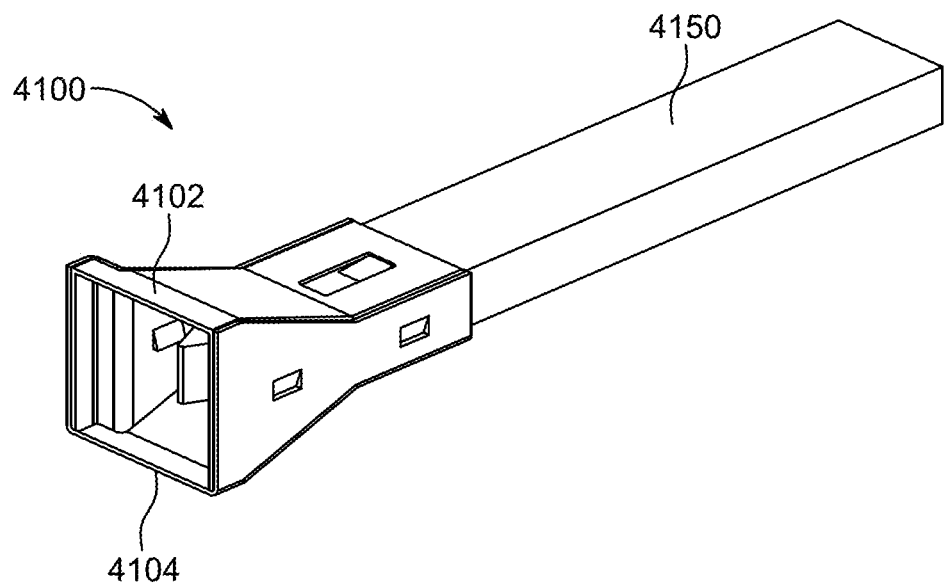
Figure 40B:
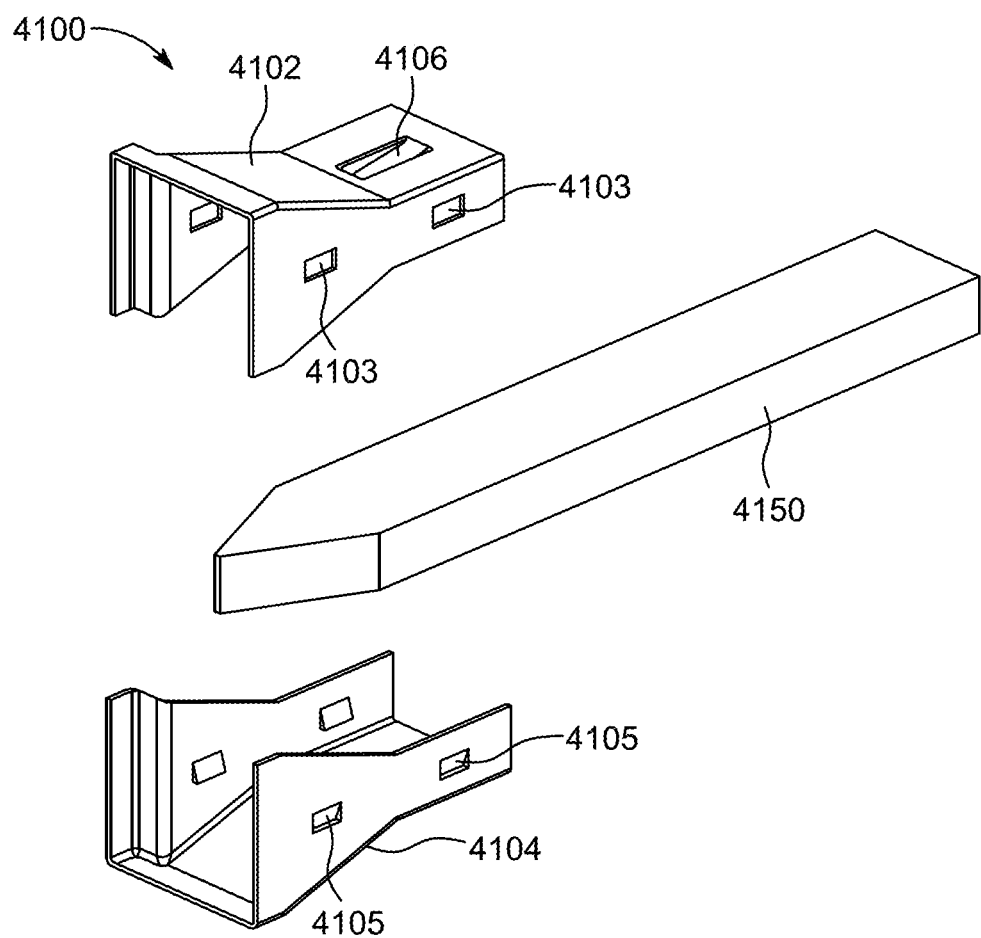
Figure 41:
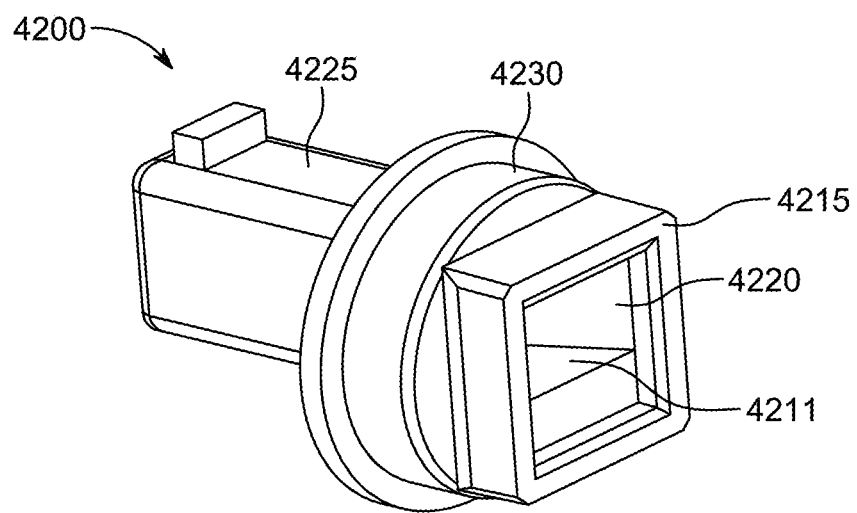
Figure 42A:
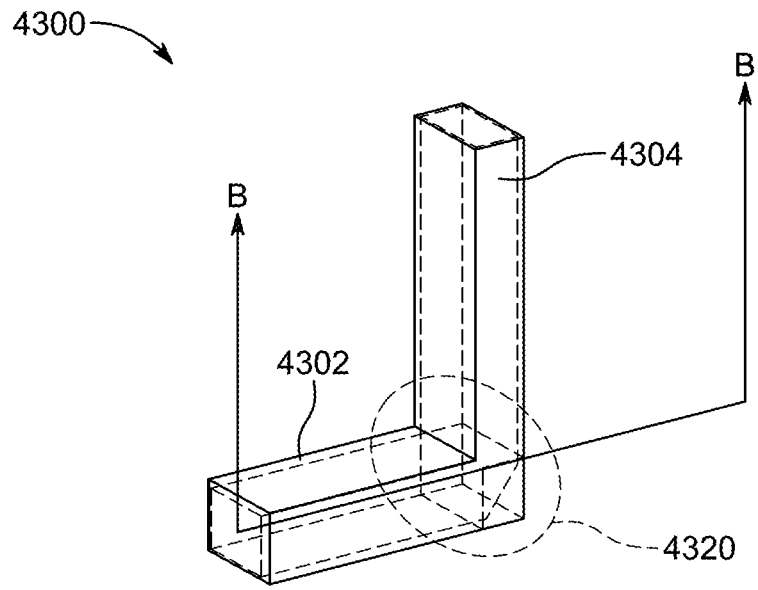
Figure 42B:
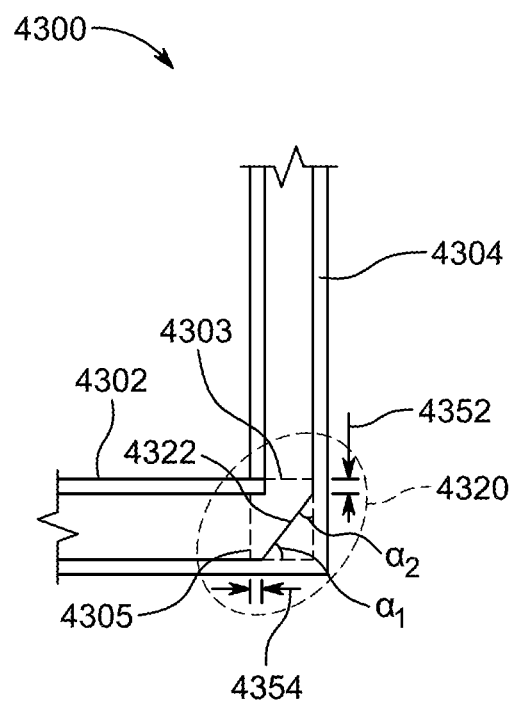
Figure 42C:
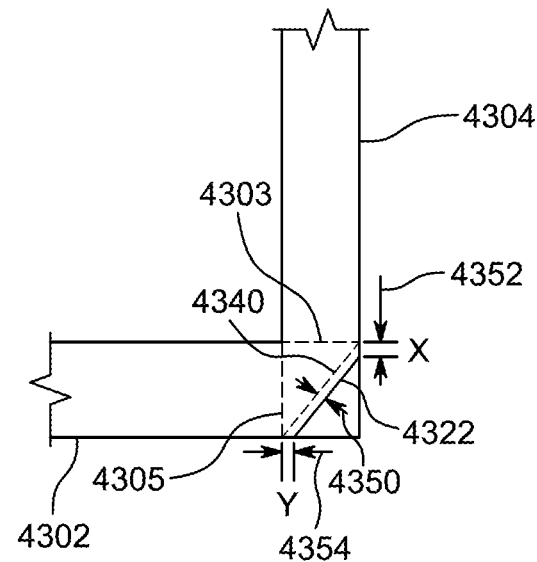
Figure 43A:
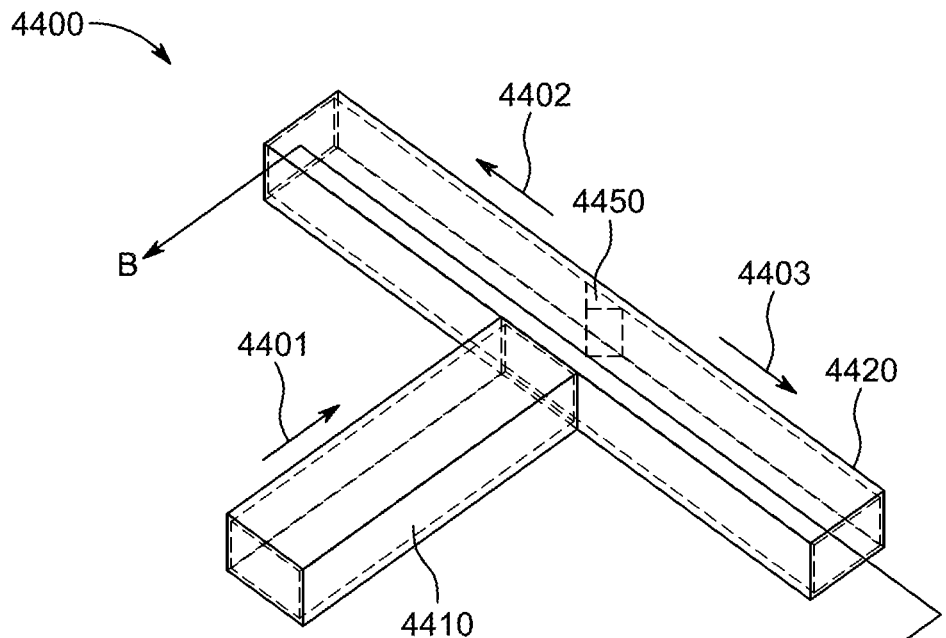
Figure 43B:
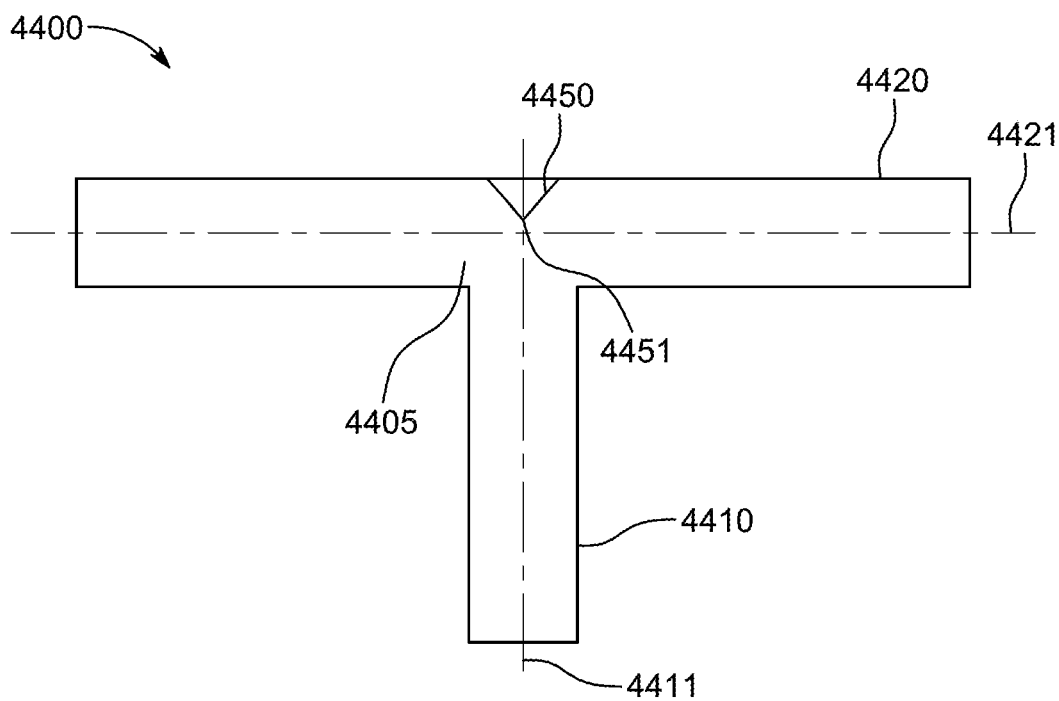
Figure 44A:
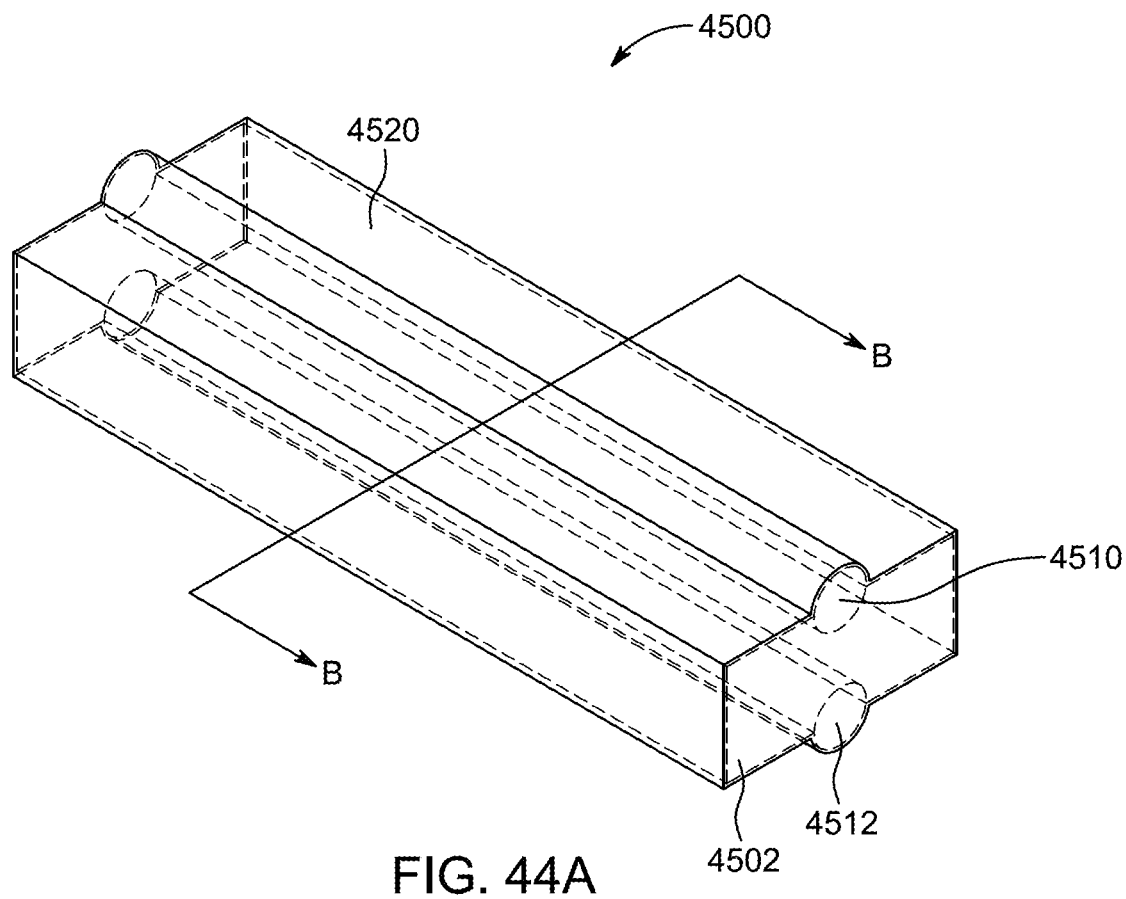
Figure 44B:
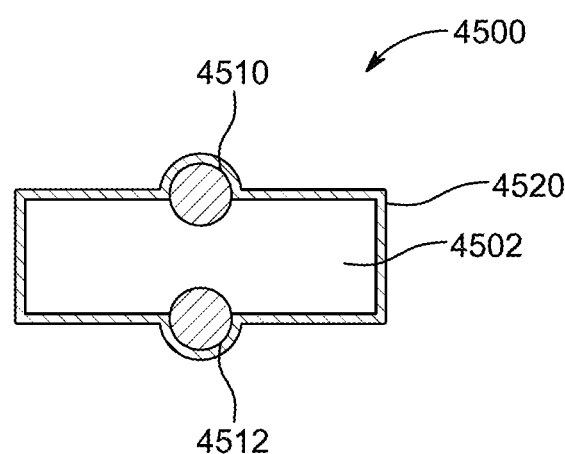
Figure 45A:
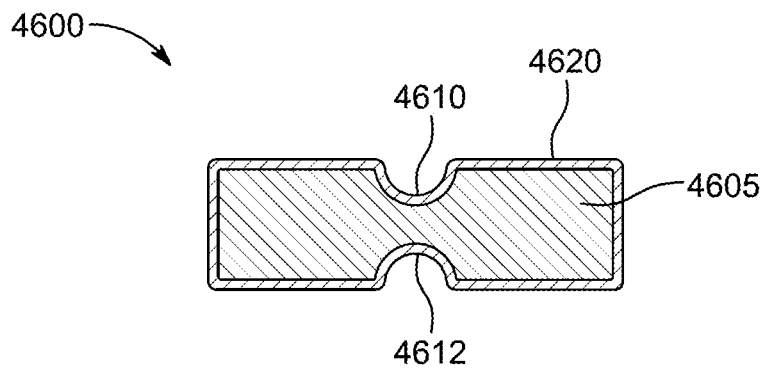
Figure 45B:
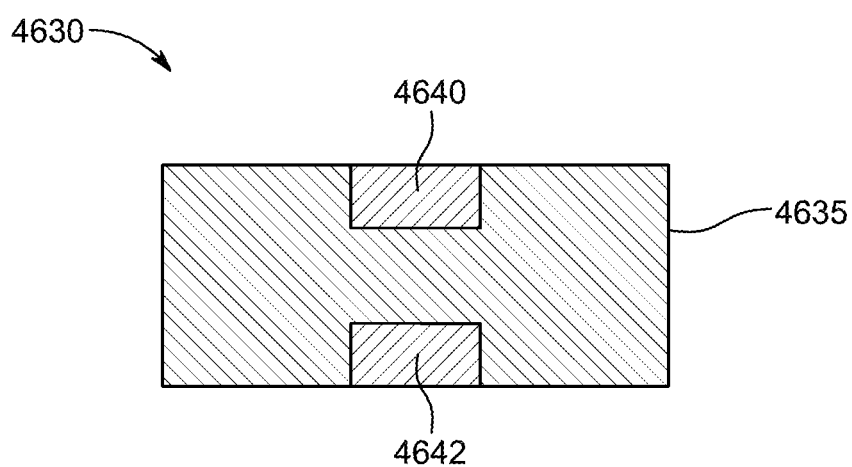
Figure 45C:
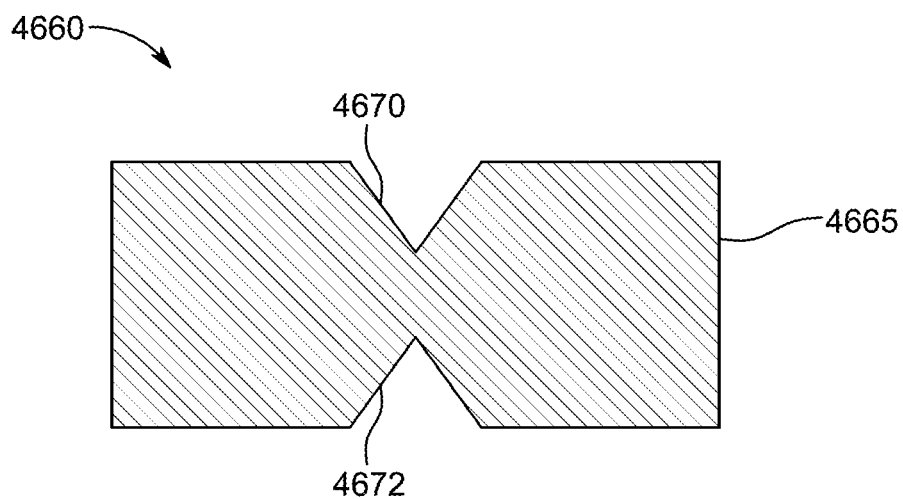
Figure 46A:
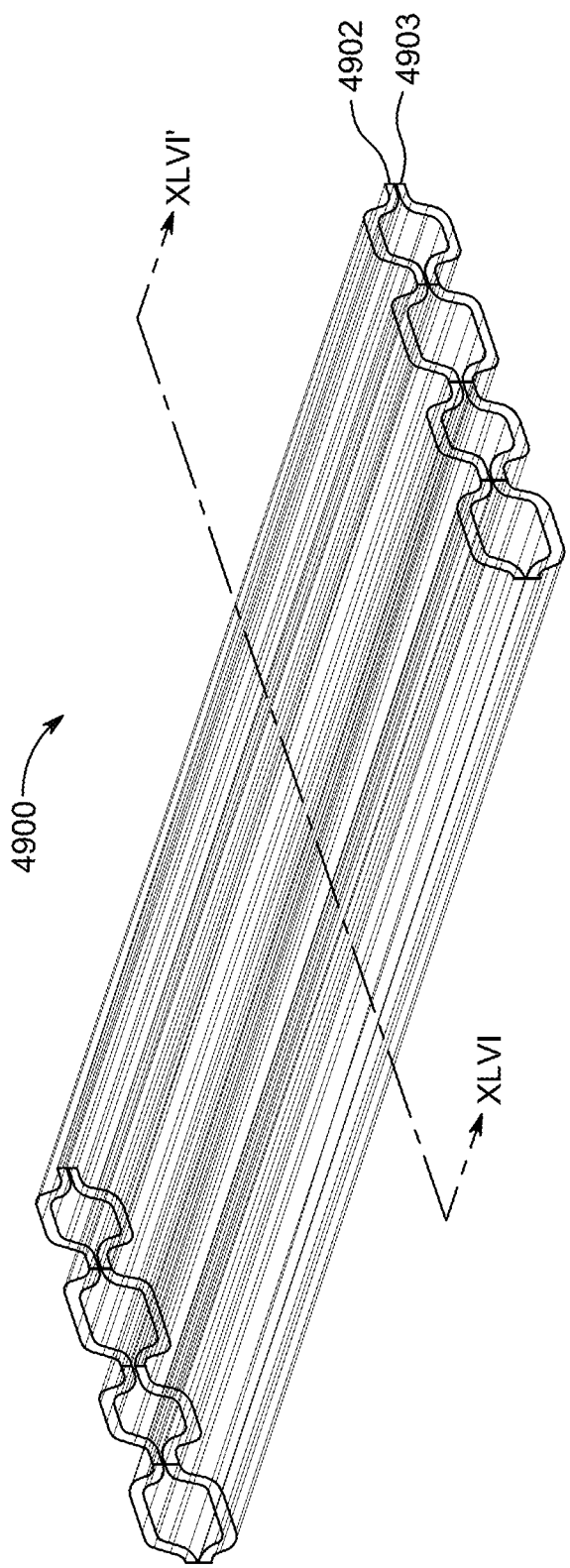
Figure 46B:
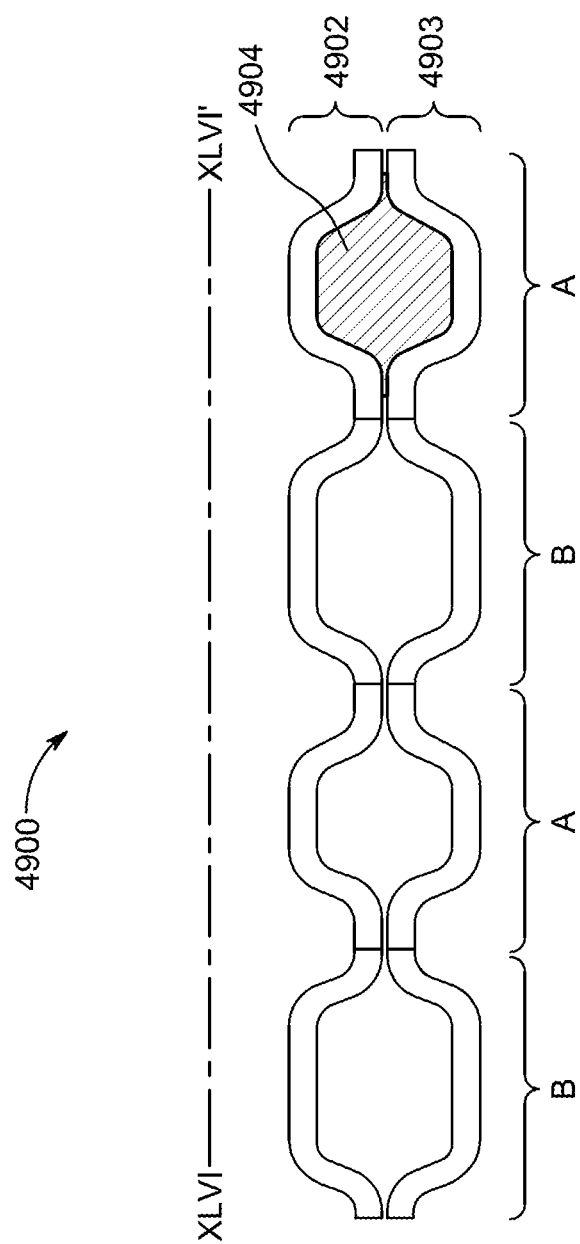
Figure 48A:
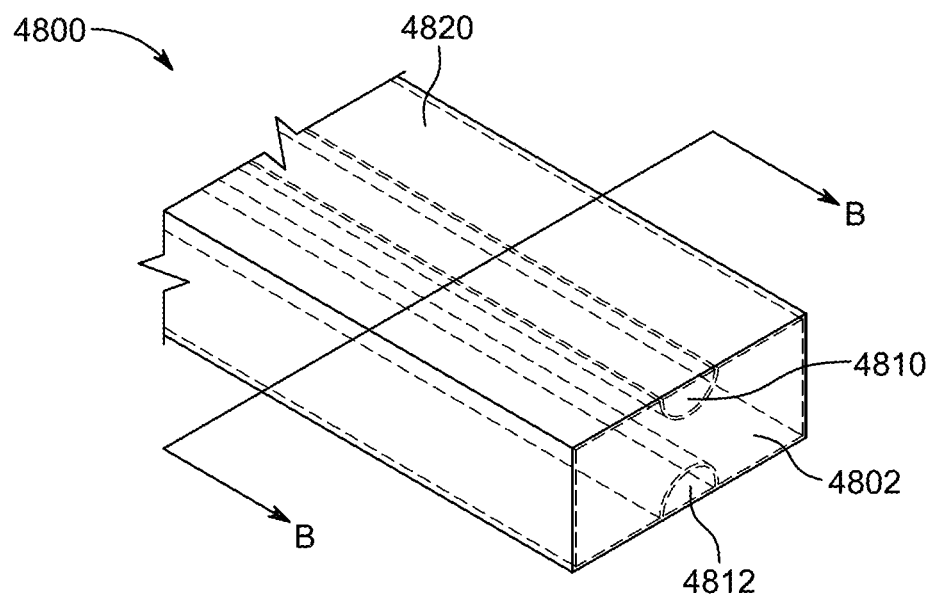
Figure 48B:
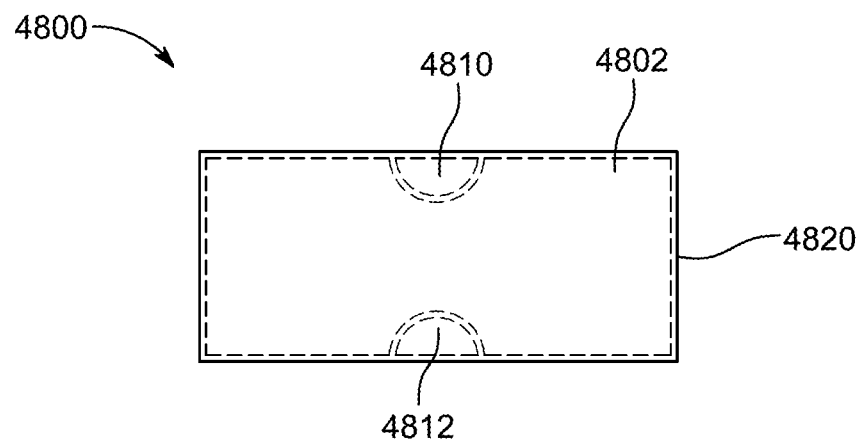

Having thus described communication between devices in general terms, reference is now made to the accompanying drawings, which are not necessarily drawn to scale, and wherein:

FIG. 1 illustrates an embodiment of a communication system;

FIG. 2A shows a simplified and illustrative communication unit mounted to substrate, according to an embodiment;

FIG. 2B shows another simplified and illustrative communication unit mounted to substrate, according to an embodiment;

FIG. 3 shows different system configurations that include variations of the interface, conduit structure, CCU, substrate, and lens structure, according to an embodiment;

FIG. 4 shows a more detailed view of communication system, according to an embodiment;

FIGS. 5A-5C show different views of a conduit structure mounted on a substrate, according to various embodiments;

FIGS. 6A-6C show enlarged partial cross-sectional views of different illustrative metal coating variations, according to various embodiments;

FIGS. 7A-7C show different views of a conduit structure including grooves, according to an embodiment;

FIG. 8 shows an illustrative cross-sectional view of a conduit structure, according to an embodiment;

FIG. 9 shows an illustrative partial cross-sectional of a conduit structure, according to an embodiment;

FIG. 10 shows an illustrative cross-sectional view of a conduit structure, according to an embodiment;

FIG. 11 shows an illustrative cross-sectional view of a conduit structure, according to an embodiment;

FIGS. 12A-12D show different views of an illustrative conductive, EHF absorptive member, according to various embodiments;

FIG. 13 shows an illustrative partial cross-sectional view of EHF absorptive member, according to an embodiment;

FIGS. 14A-14C show different views of a support structure, according to various embodiments;

FIGS. 15A and 15B show illustrative top and cross-sectional views of a conduit structure, according to an embodiment;

FIG. 16 shows an illustrative view of a conduit structure that can mate with an interface, according to an embodiment;

FIGS. 17A-17C show top, side, and cross-sectional views, respectively, of a support structure that includes grooves, according to various embodiments;

FIGS. 18A and 18B show different views of a conduit structure that includes a support member and single channel, EHF absorptive members, according to various embodiments;

FIGS. 19A and 19B show illustrative top and cross-sectional views, respectively, of a conduit structure that uses a hybrid approach, according to an embodiment;

FIGS. 20A and 20B show illustrative top and cross-sectional views, respectively, of a conduit structure that uses another hybrid approach, according to an embodiment;

FIGS. 21A and 21B show different views of a conduit structure having a lens member, according to an embodiment;

FIG. 22 shows another a conduit structure having a lens member, according to an embodiment;

FIG. 23 shows a housing having an interface that is secured to a conduit structure, according to an embodiment;

FIG. 24 shows an injection molded interface that secures a conduit structure in place, according to an embodiment;

FIG. 25 shows an illustrative cross-sectional view of an interface mounted conduit structure, according to an embodiment;

FIGS. 26A-26C show different views of a conduit structure, according to an embodiment;

FIGS. 27A-27C show different views of a conduit structure, according to an embodiment;

FIGS. 28A-28C show different views of a conduit structure, according to an embodiment;

FIGS. 29A-29C show different views of a conduit structure, according to an embodiment;

FIG. 30A shows an illustrative cross-sectional view of two devices positioned adjacent to each other to facilitate transmission of contactless signals via spherical lenses according to an embodiment;

FIGS. 30B and 30C show different views of an illustrative spherical lens structure according to an embodiment;

FIGS. 31A and 31B show an illustrative concave-convex spherical lens structure according to an embodiment;

FIGS. 32A and 32B show a zoned lens structure according to an embodiment;

FIG. 33 shows illustrative system using a conduit structure according to an embodiment;

FIG. 34 shows another illustrative system using a conduit structure according to an embodiment;

FIG. 35 shows an illustrative cross-sectional view of launch and dielectric filled waveguide assembly according to various embodiments;

FIG. 36 shows an illustrative device-to-device coupling that uses guiding conduit structures according to embodiments discussed herein;

FIG. 37 shows an illustrative cross-sectional view of another launch and waveguide assembly according to various embodiments;

FIG. 38 shows an illustrative contactless connector according to an embodiment;

FIG. 39A shows an illustrative perspective view of a top launch, according to an embodiment;

FIG. 39B shows an illustrative exploded view of an assembly, according to an embodiment;

FIGS. 40A and 40B show different views of another top launch, according to various embodiments;

FIG. 41 shows an illustrative perspective view of yet another top launch, according to an embodiment;

FIG. 42A shows a perspective view of a waveguide according to various embodiments;

FIG. 42B shows an illustrative cross-sectional view of the waveguide taken along line B-B of FIG. 42A, according to an embodiment;

FIG. 42C shows an illustrative close up of the waveguide compensation network of FIG. 42A, according to an embodiment;

FIG. 43A shows an illustrative waveguide tee, according to an embodiment;

FIG. 43B shows an illustrative cross-sectional view of the waveguide tee taken along line B-B of FIG. 43A;

FIG. 44A shows an illustrative perspective view of a ridge waveguide according to an embodiment;

FIG. 44B shows an illustrative cross-sectional view of the ridge waveguide taken along line B-B of FIG. 44A;

FIG. 45A shows an illustrative cross-sectional view of a semi-circular ridge waveguide according to an embodiment;

FIG. 45B shows an illustrative cross-sectional view of a filled rectangular ridge waveguide, according to an embodiment;

FIG. 45C shows an illustrative cross-sectional view of a v-shaped ridge waveguide, according to an embodiment;

FIG. 46A shows an illustrative a waveguide structure formed from metal sheets, according to an embodiment;

FIG. 46B shows an illustrative cross-sectional view of the waveguide structure of FIG. 46A along broken line XLVI-XLVI', according to an embodiment;

FIG. 47 shows a table of measured characteristics of various waveguide dielectric materials according to various embodiments;

FIG. 48A shows an illustrative perspective view of a ridge waveguide according to an embodiment;

FIG. 48B shows an illustrative cross-sectional view of the ridge waveguide taken along line B-B of FIG. 48A.

Figure 48C:
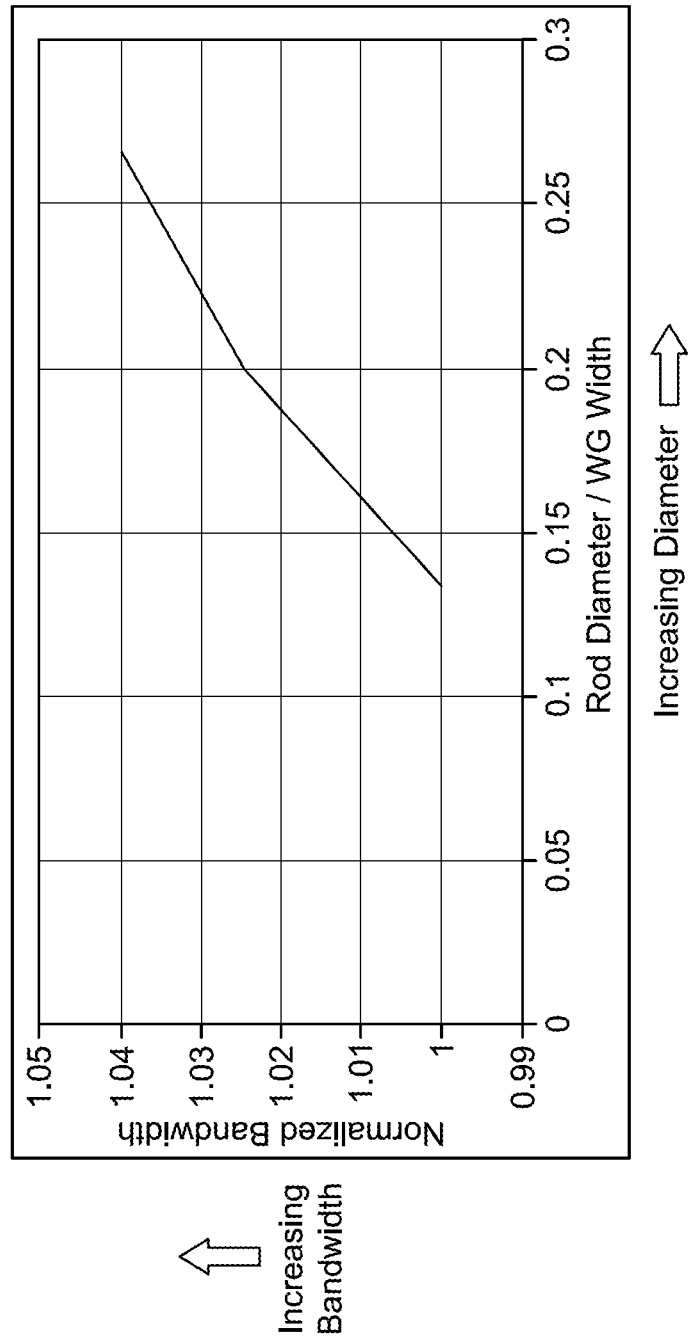
Figure 49:
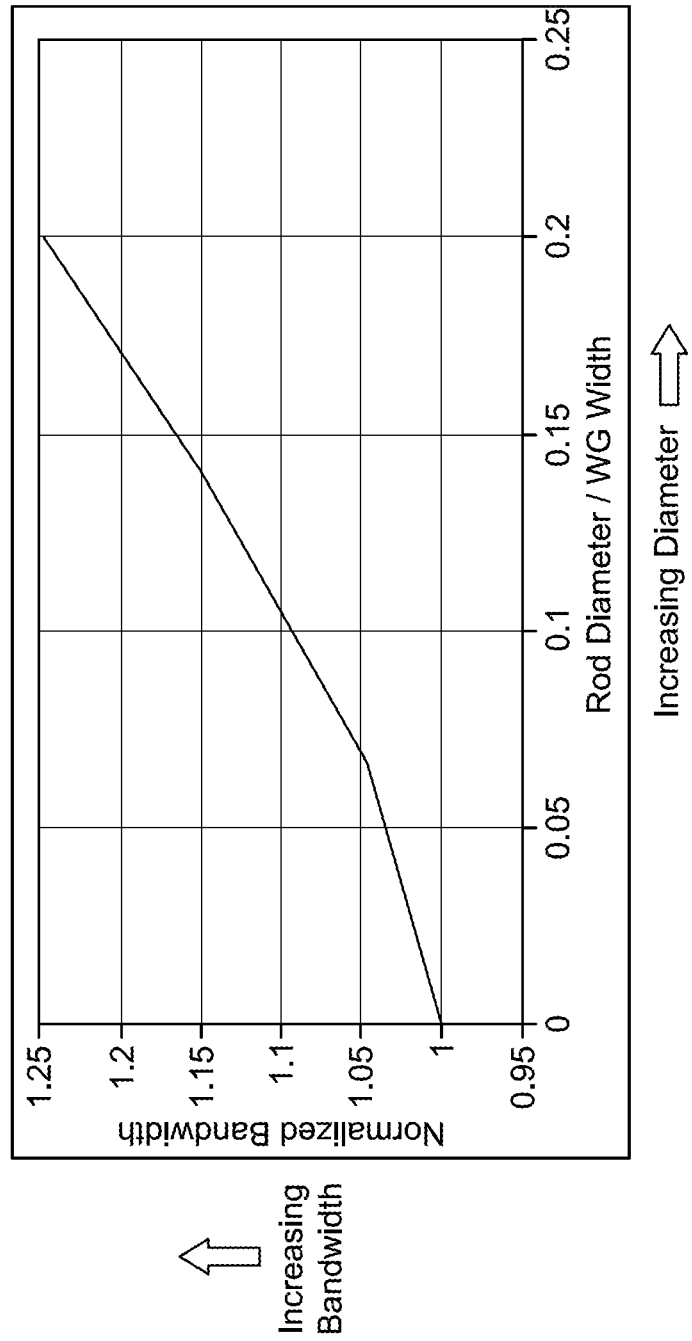

FIG. 48C shows an illustrative plot diagram showing bandwidth versus diameter of dielectric ridges, according to an embodiment;

FIG. 49 shows an illustrative plot diagram showing bandwidth versus diameter of conductive ridges, according to an embodiment.

DETAILED DESCRIPTION OF THE INVENTION

Illustrative embodiments are now described more fully hereinafter with reference to the accompanying drawings, in which representative examples are shown. The disclosed communication system and method may be embodied in many different forms and should not be construed as limited to the embodiments set forth herein. Like numbers refer to like elements throughout the drawing figures.

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of contactless communication between electronic devices and between sub-circuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms "comm-link chip", and "comm-link chip package" are used to refer to IC chips or packages having an embedded antenna. These IC chips or packages may also be referred to as contactless communication units (CCUs).

The acronym "EHF" stands for Extremely High Frequency, and refers to a portion of the electromagnetic (EM) spectrum in the range of 30 GHz to 300 GHz (gigahertz). The term "transceiver" may refer to a device such as an IC (integrated circuit) including a transmitter (Tx) and a receiver (Rx) so that the integrated circuit may be used to both transmit and receive information, such as data. Generally, a transceiver may be operable in a half-duplex mode (alternating between transmitting and receiving), a full-duplex mode (transmitting and receiving simultaneously), or configured as either a transmitter or a receiver. A transceiver may include separate integrated circuits for transmit and receive functions. The terms "contactless," "coupled pair," and "close proximity coupling" as used herein, refer to electromagnetic (EM) rather than electrical (wired, contact-based) connections and transport of signals between entities (such as devices). As used herein, the term "contactless" may refer to a carrier-assisted, dielectric coupling system. The connection may be validated by proximity of one device to a second device. Multiple contactless transmitters and receivers may occupy a small space. A contactless link established with electromagnetics (EM) may be channelized in contrast with a wireless link which typically broadcasts to several points.

FIG. 1 illustrates a communication system 100. As shown, system 100 may include a first device 110 configured to communicate with a second device 120. First device 110 may be configured to communicate with and/or connect to second device 120 and vice versa. Further, first device 110 and second device 120 can be any apparatus capable of connecting and communicating with each other. First device 110 may couple directly to device 120 via a direct coupling or via a physical coupling member (e.g., cable) that can couple the two devices together. For example, device 110 can be a device such as a mobile device or a computer, and device 120 can be a cable device such as a dongle designed to interface with the device 110. First device 110 may include housing 111 that encompasses substrate 112, one or more EHF contactless communication units (CCUs) 113, conduit structure 114, anti-spurious radiation (ASR) region 115, and interface 116. Similarly, second device 120 may include housing 121 that encompasses substrate 122, one or more EHF contactless communication units (CCUs) 123, conduit structure 124, anti-spurious radiation (ASR) region 125, and interface 126.

Housings 111 and 121 may respectively represent the structure that forms the outer dimensions of devices 110 and 120. Housings 111 and 121 may be constructed from any suitable material or materials. In some embodiments, interface 116 may be integrated within housing 111. For example, interface 116 may be a separate component that is coupled to housing 111. As another example, a portion of housing 111 can be designated as the interface. That is, the housing itself serves as the interface without the need for a separate component. Interface 116 may provide indicia and/or device coupling mechanisms (e.g., keying structure, magnets, etc.) for specifying the location of the interface and for connecting to the interface of another device.

Substrates 112 and 122 may respectively be any suitable structure on which CCUs 113 and 123 can reside. For example, substrates may be a circuit board, a printed circuit board, or a flexible printed circuit board. CCUs 113 and 123 may respectively be positioned on their respective substrates 112 and 122 in a manner that minimizes a distance between the substrate and respective interfaces 116 and 126. Such placement may assist in managing signal propagation from the CCUs to the interface.

EHF CCUs 113 and 123 can be EHF transceivers capable of selectively transmitting and receiving EHF signals. When operating as a transmitter, the EHF CCUs may transmit an electromagnetic EHF signal, and when operating as a receiver, the EHF CCUs may receive an electromagnetic EHF signal. For example, in one embodiment, device 110 can include two EHF CCUs and device 120 can include two EHF CCUs. In device 110, a first EHF CCU may operate as a transmitter and a second EHF CCU may operate as a receiver. Similarly, device 120 may include first and second EHF CCUs that operate as transmitter and receiver, respectively. The transmitter EHF CCU of device 110 may transmit EHF signals to the receiver EHF CCU of device 120, and the transmitter EHF CCU of device 120 may transmit EHF signals to the receiver EHF CCU of device 110.

Conduit structures 114 and 124 may manage the propagation of EHF signals through one or more channels that exist between EHF CCUs and the interface by containing the EHF signal energy within the confines of each channel. All channels referred to herein may be EHF containment channels that guide and contain EHF signal energy. The dimensions of a radiation field associated with a first EHF CCU can potentially overlap the radiation field of one or more other EHF CCUs. Such overlap can cause cross-talk or interference with EHF signaling. Conduit structure 114 may provide one or more EHF containment channels or pathways that exist between EHF CCUs 113 and interface 116 to prevent the radiation fields of multiple EHF CCUs from overlapping each other. Similarly, conduit structure 124 may provide one or more EHF containment channels or pathways that exist between EHF CCUs 123 and interface 126. An EHF containment channel may exist for each EHF communication unit, and each channel is effectively isolated from each other to prevent cross-talk and signal degradation. Thus, the conduit structure can simultaneously direct EHF signals along desired pathways and prevent the EHF signals from traversing or entering undesired regions. Each channel of structures 114 and 124 can direct or guide EHF signal energy into a cross sectional area smaller than the transverse dimensions of the EHF CCU's radiation field. As a result, the EHF signals can be directed to travel along a desired signal path and away from undesirable paths.

The conduit structure can be secured within each device in a variety of ways. In one approach, conduit structure 114 may interface with substrate 112 and interface 116. In this approach, structure 114 may surround EHF CCU 113. If multiple CCUs 113 exist, structure 114 may include multiple channels that each independently surround a respective one of the CCUs. In another approach, conduit structure 114 can be mounted to interface 116 and be suspended over EHF CCU 113. In yet another approach, conduit structure 114 can be mounted to substrate 112 and extend in the direction of interface 116.

The conduit structures can be constructed from a combination of different materials to shape the direction of signal propagation and to mitigate EHF leakage (which may cause cross-talk). These materials can include EHF transmissive materials that are operable to facilitate propagation of EHF signals, EHF reflective materials that are operable to reflect EHF signals, and EHF absorptive materials that are operable to absorb EHF signals. Examples of transmissive materials can include plastics and other materials that are electrically non-conductive (i.e., dielectric). Reflective materials can include, for example, metals, metal alloys, metal foam, and other materials that are electrically conductive. Examples of absorptive materials can include, for example, carbon-loaded (or magnetically-loaded) rubber materials that are electrically non-conductive, but exhibit effective EHF dampening resonance due to their high electric loss tangent and magnetic loss tangent. Other example suitable absorptive materials may include carbon-loaded (or magnetically-loaded) silicone-based material, polybutylene terephthalate (PBT) based material, or hard-plastic material.

In some embodiments, the conduit structures can be constructed from just one of the different material types. For example, the conduit structure can be constructed from just the EHF transmissive material or just the EHF reflective material. In other embodiments, the structure can be constructed from two or more of the different material types. For example, one portion can be constructed from transmissive materials, and another portion can be constructed from reflective materials.

Conduit structures 114 and 124 may be constructed to exhibit any suitable shape, and can be constructed from a single component or multiple components. Regardless of shape and construction configuration, each conduit may include at least one signal collimating structure that has a channel existing within the collimating structure. Any suitable shape, including for example, rectangular, elliptical, or polygonal shapes of any suitable dimension may characterize each channel. The collimating structure may be constructed from, lined with, or coated with an EHF reflective material that may simultaneously guide EHF signals along the channel and prevent those same signals from penetrating the channel wall.

In addition to providing one or more pathways for channeling EHF signals, the conduit structures may protect the EHF CCUs from shock events. That is, during an event that imparts shock energy to the device, such as a device drop, the conduit structure can absorb the shock to prevent potentially damaging energy transfer to the EHF CCUs. In one embodiment, the shock protection can be achieved by constructing at least a portion of the conduit structure from a relatively rigid material (e.g., plastic) that covers the EHF CCU(s). In another embodiment, shock protection can be achieved using a relatively compliant material (e.g., foam or silicone-based material) that also covers the EHF CCU(s). In yet another embodiment, a combination of relatively rigid and compliant materials may be used to provide protection.

The conduit structure may also be constructed to account for tolerance variations in device stackup. That is, variations in component construction can vary the stackup tolerances when assembled. For example, the distance between the EHF units and the interface may vary depending on construction and variations in components. In one build, the distance may be x and in another build, the distance may be y, where y is greater than x. The conduit structure may include a compliant material that is designed to accommodate variations in stackup. The compliant material may be compressible and thus able to ensure that the conduit structure makes a secure and flush connection with the interface.

Anti-spurious radiation (ASR) regions 115 and 125 may minimize transmission of spurious EHF signals that may exist at or near a break in a channel containing the EHF signals. A break may occur at locations where the conduit structure interfaces with another structure or component. For example, a potential break may exist at the junction formed between interface 116 and structure 114. Another potential break may exist at the junction formed between substrate 112 and structure 114. Yet another potential break may exist on the surface of interface 116 that is mounted to housing 111 or the portion of housing 111 designated as the interface. ASR regions can be incorporated into the conduit structures or mounted thereto to combat spurious EHF signals. The ASR regions can include various anti-spurious radiation materials and/or grooves. ASR materials can include any combination of EHF transparent, EHF reflective, and EHF absorptive materials. Grooves can include grooves or channels that exist in strategic locations within or adjacent to the conduit structures.

FIG. 2A shows a simplified and illustrative EHF CCU 200 mounted to substrate 210, according to an embodiment. CCU 200 may include transducer 202 that is designed to transmit contactless EHF signals in the direction of signal path 220. Path 220 projects in a direction perpendicular to surface 211 of substrate 210. In other words, path 220 projects in the Y-axis direction towards CCU 230 across the device boundary. The direction of signal path 220 is merely illustrative. For example, the signal path can be directed any suitable direction. For example, FIG. 2B shows a simplified and illustrative EHF CCU 250 mounted to substrate 260. CCU 250 may include transducer 252 that is designed to transmit contactless EHF signals in the direction of signal path 270. Path 270 projects in a direction co-planar to surface 261 of substrate 260, for example, to transmit contactless EHF signals to an adjacent CCU (not shown) in the same device. In other words, path 270 projects in the X-axis direction.

Thus, although it may be desirable for EHF signals to be transmitted along a desired signal path (e.g., such a path 220 or 270), non-directed, free flowing EHF signal energy may emit in all directions, thereby resulting in radiation patterns that are not confined to the desired signal path. Non-directed transmission of EHF signals in undesired directions may cause cross-talk and multi-path crosstalk. Cross-talk may occur among adjacent CCUs in the same device. Such cross-talk may exist over-the-air and/or within circuit boards. This is illustrated in FIG. 2A, which shows cross-talk EHF signal path 242 emanating from CCU 200 to CCU 240. Multi-path cross talk may occur when a CCU a first device communicates with an unintended CCU of a second device. This is illustrated FIG. 2A, which shows multi-path cross talk signal path 252 emanating from CCU 200 to CCU 250. Likewise, as shown in FIG. 2B, the signal path 270 in the lateral direction towards an adjacent CCU (not shown) in the same device may be a desired signal path, and a signal path in a direction other than that of the desired path may be an undesired signal path. The non-directed transmission of EHF signals may also result in reduced signal strength, thereby potentially making it more difficult for receiving CCUs to capture the EHF signals. Various embodiments discussed herein are used to direct EHF signals along desired signal pathways (e.g., pathway 220) and eliminate undesired pathways (e.g., pathways 242 and 252). Spurious radiation may also contribute to cross-talk and/or signal loss and can occur when a break exists in a channel containing the EHF signals. The breaks may occur at locations where two devices are mated together, for example. Embodiments described herein provide different solutions to mitigate cross talk and multi-path cross talk, among other things.

FIG. 3 shows different system configurations that include variations of the interface, conduit structure, CCU, and substrate. As shown in FIG. 3, each of the interface, conduit structure (CS). CCU, substrate, and lens structure is identified as generic category on the left-hand side of the figure, and the right-hand side of the figure lists several alternative embodiments for each generic category. The categories and their respective embodiments are arranged in a stackup to illustrate how different embodiments in each category can be coupled together. In general, the interface, which can be part of the housing, resides at a top layer of the system, followed by the conduit structure, and then followed by either the CCU or substrate. In some embodiments, such as those of FIG. 3, a lens structure may also be disposed, for example, between the interface and the conduit structure. The conduit structure's primary function is to provide a channel through which contactless signals can travel between the CCU and the interface. The intricacies in which the conduit structure couples to the interface, CCU, and/or substrate can vary markedly, many of which will be discussed in connection with FIG. 3 and the other figures. For example, in some embodiments, the conduit structure may be designed with emphasis on being securely mounted to the substrate. In another example, the conduit structure may be designed to be securely mounted to the interface. In yet another example, the conduit structure and the CCU may be coupled together to form a module that can be secured to an interface and/or substrate.

Attention is now drawn to various interface embodiments. The interface can represent a generic or featureless interface that is devoid of specially constructed coupling features for being coupled to the conduit structure. Interface 302 may be featureless in that does not include any of the features that may be included as part of interfaces 303, 304 and 305. For example, a featureless interface can be characterized as having a flat planar surface to which the top surface of the conduit structure and/or adhesive or conductive EHF absorptive material (e.g., foam and silicone-based material) is abutted against. Interface 303 can represent a feature laden interface that includes a coupling feature that interlocks, registers, and/or facilitates alignment of the conduit structure. When the conduit structure is mated with interface 303, a feature existing in interface 303 facilitates the coupling. Interface 304 can represent an injection molded interface that is formed using an injection molding process. The injection mold can simultaneously hold the conduit structure in place and serve as the interface. Interface 305 can represent an interface configured to be directly coupled with a CCU, thereby eliminating a need for the conduit structure to exist between the CCU and the interface.

Referring now to various conduit structure embodiments, FIG. 3 shows that the conduit structure can have one portion dedicated to interface centric characteristics and another portion dedicated to substrate/CCU characteristics. For example, the interface centric characteristic can be designed to be coupled to the interface (e.g., one of interfaces 302-304), and the substrate/CCU characteristics can be designed to be coupled to one of the substrate or CCU. Conduit structure portion 310 may not have any interface coupling features specifically designed for being coupled to the interface. Conduit structure portion 310 may be featureless in that it does not include any of the features that may be included as part of conduit structure portions 311 and 312. For example, a featureless conduit structure portion can be characterized as having a flat planar surface that abuts against the interface. As another example, conduit structure portion 310 may be coupled to interface 302 or interface 303.

Conduit structure portion 311 can include interface coupling features that are designed to engage, interlock, and/or provide registration for coupling to the interface. For example, portion 311 can include reciprocal registration features that compliment registration features of interface 303. In some embodiments, conduit structure portion 311 can include other features such as ASR regions. Conduit structure portion 312 can include injection mold features that are designed to be coupled to an injection mold. For example, portion 312 can include self-locking features that receive a flowing mold that locks the interface to the conduit structure after it cures. Portion 312 may be coupled to interface 304.

Conduit structure portion 314 can represent a conduit structure that couples with a substrate. For example portion 314 can be fixed directly to the substrate and surround the CCU such that the channel exists above the CCU. Conduit structure portion 315 can represent a conduit structure that directly couples to the CCU. For example, the CCU may be enshrouded in an encapsulant that is configured to nestle into or attach to portion 315. It should be appreciated that even though portion 314 is designed to be coupled to the substrate, portion 314 may abut a portion of the CCU. It should also be appreciated that even though portion 315 is designed to be coupled to the substrate, portion 315 may abut or be further coupled to the substrate.

CCU portion 320 may represent CCUs that are not intended to directly couple to the conduit structure, but may be surrounded/overlaid by the conduit structure. CCUs having portion 320 may be CCUs that do not have their own ground plane located within its integrated circuit package. That is, such CCUs may rely on a ground plane existing in the substrate to which it is attached to reflect EHF signal energy.

CCU portion 321 may represent CCUs that are intended to directly couple to the conduit structure. The encapsulant of such CCUs may be molded to nestle into or attach to a conduit structure. Such CCUs may be self-resonant and contain their own ground plane, thereby eliminating the need to rely on a ground plane in a substrate to reflect EHF signal energy. Additional information of such CCUs can be found, for example, in commonly assigned, co-pending U.S. patent application Ser. No. 15/145,589, filed May 3, 2016.

In some embodiments, a module including CCU portion 321 and conduit structure 315 and any one of portions 310-312 may exist as a standalone component that is readily adaptable for use in any device without requiring extensive EHF engineering or customization. That is, the module is a self-contained EHF transmission/reception system within known EHF signal characteristics, and thus can be readily incorporated into various devices to provide contactless signal capability without requiring substantially effort by the end user to ensure EHF signaling parameters are met to ensure reliable contactless communications.

CCU embodiment 322 may represent CCUs that are intended to directly couple to the interface. Such CCUs may be constructed in a manner similar to CCU portion 321 to enable such a direct coupling. For example, interface 305 may couple directly to CCU portion 322, thereby eliminating a need for a separate conduit structure. In this example, the combination of interface 305 and CCU portion 322 may provide an EHF channel for containing contactless signals.

The substrate may embody a printed circuit board 330 or flexible printed circuit board 331. Flexible printed circuit board 331 may include an optional stiffener plate to provide added rigidity to the flex circuit. Printed circuit board 330 may be coupled to conduit structure portion 314. Flexible printed circuit board 331 can be coupled to CCU portion 321 or CCU portion 322.

The lens structure may be designed to focus an EM wave passing through a conduit structure to or away from a CCU. The lens structure can transform the EM wave by using at least one EM transformation region that is designed to control the velocity of the EM wave passing through the lens structure. For example, the at least one EM transformation region can include edge and central portions, and EM wave velocity can be faster through the edge portions than through the central portion. The extent to which the EM transformation region controls the velocity of the EM can depend on a number of factors. For example, one factor can be the construction of the lens. Exemplary lenses can include a spherical lens (shown in FIGS. 30A, 30B and 30C), a convex-concave lens (shown in FIGS. 31A and 31B), a zoned lens (shown in FIGS. 32A and 32B), a pyramidal lens, a rectangular lens, or a Fresnel lens. Another factor can be the positioning of the lens structure within the substrate, CCU, conduit structure, interface stackup. Interface lens structure 340 may represent a lens structure that is incorporated into the interface or communications port of a device housing. Lens structure integrated within conduit structure 341 may represent a lens structure that is primarily associated with a conduit structure. For example, the lens structure can be positioned at the top of the conduit structure (the part more closely associated with the interface), within the conduit structure, or the bottom of the conduit structure (the part more closely associated with the CCU). In another embodiment, the lens structure can be designed to be positioned above the CCU or it can be designed to interface with the substrate or a combination thereof.

FIG. 4 shows a more detailed view of communication system 400, and in particular, shows an illustrative partial cross-sectional view of system 400. System 400 may include many of the same components of system 100, but are labeled with reference numbers starting with 4xx, where xx matches the least significant digits of the equivalent component in FIG. 1. As shown, first device 410 is positioned above and mated to second device 420. First device 410 shows substrate 412, CCU 413(Rx), CCU 413(Tx), conduit structure 414, and interface structure 416. Substrate 412 may include vias 417 that are operative to block EHF signal radiation through substrate 412. Interface structure 416 may be integrally formed with conduit structure 414, which can extend from substrate 412 to the outer surface of interface 416. Conduit structure 414 may have two EHF containment channels, Channel A, which guides signals for CCU 413 (Rx), and Channel B, which guides signals for CCU 413

(Tx). ASR regions 419 may be integrated within interface 416 or conduit structure 414. Interface 416 can include alignment and proximity control structures 418 that may be used to connect and/or orient interface 416 with respect to interface 426. Second device 420 can be arranged and include the same components as first device 410, but this is not necessary. For example, device 420 can include substrate 422, CCU 423 (Tx), CCU 423 (Rx), conduit structure 424, interface structure 426, vias 427, alignment and proximity control structures 428, and ASR regions 429. Conduit structure 424 may have two EHF containment channels, Channel A, which guides signals for CCU 423(Tx), and Channel B, which guides signals for CCU 423(Rx). An air gap may or may not exist between interfaces 416 and 426; however, a relatively small air gap is shown in FIG. 4 for illustrative purposes. This air gap may provide a gap or space for spurious EHF radiation to emanate.

CCU 423 (Tx) may transmit contactless EHF signals in the direction of signal path 430 toward CCU 413(Rx), CCU 413(Tx) may transmit contactless EHF signals in the direction of signal path 431 toward CCU 423(Rx). The A and B channels formed as part of conduit structures 414 and 424 may assist in guiding and containing the EHF signals along paths 430 and 431 with minimal or no cross-talk or multi-path cross-talk. ASR regions 419 and 429, which act as high-impedance filters to spurious wave propagation along the air gap between surfaces 416 and 426, may assist in mitigating any potential spurious radiation. According to some embodiments, ASR grooves may be formed to extend around all sides of each channel, which would reduce crosstalk between the channels. According to some embodiments, one or more surfaces of the ASR grooves may be lined or coated with a metal. According to some embodiments, a plurality of ASR grooves may be formed concentrically or in a tree-ring around each channel like successive RF chokes. According to some embodiments, the ASR grooves may be formed on a surface of the housing of the device.

FIGS. 5A-5C show different views of a conduit structure 500 mounted on a substrate 550 according to various embodiments. In particular, FIG. 5A shows an illustrative top view, FIG. 5B shows an illustrative side view, and FIG. 5C shows an illustrative cross-sectional view taken along line C-C of FIG. 5A. FIGS. 5A-5C may be collectively referenced in the following discussion. As shown, EHF CCUs 552 and 554 are mounted on top of substrate 550 and conduit structure 500 is also mounted on top of substrate 550. Conduit structure 500 can include mounting regions 501 and 502, and wave containment region 503. Mounting regions 501 and 502 may include features that enable structure 500 to be secured to substrate 550. Wave containment region 503 may be integrally formed with mounting regions 501 and 502 and may have a height that exceeds the height of the regions 501 and 502. In some embodiments, the height of region 503 may be selected so that conduit structure 500 can mate directly with the interface (not shown) of the device housing or at least be positioned near that interface.

Wave containment region 503 may be positioned over EHF CCUs 552 and 554 to provide a combination of protection and EHF containment channels for the CCUs. The protective characteristic may be realized by the relative thickness of wave containment region 503 compared to the thickness of CCUs 552 and 554. Thus, in a shock event, wave containment region 503, in combination with regions 501 and 502, can absorb the shock and/or prevent a portion (e.g., housing) of the device from deflecting onto the CCUs.

Wave containment region 503 can include channels 510 and 520 that are positioned directly over EHF CCUs 552 and 554, respectively. The dimensions of channels 510 and 520 are shown in FIGS. 5A and 5C to be larger than the dimensions of EHF CCUs 552 and 554, but it should be understood that this is merely illustrative and the channel dimensions may be smaller than the dimensions of the CCUs. Channels 510 and 520 may be lined or coated with a conductive metal material, shown as 511 and 521, respectively as shown in FIG. 5C. The presence of the metal material within channels 510 and 520 isolates the EHF signals flowing through the channels from each other, thereby reducing or eliminating cross-talk. In one embodiment, conductive metal material 511 and 521 may be a conductive paint that covers the surface(s) of channels 510 and 520. In another embodiment, conductive metal material 511 and 521 may be a solid metal fence or shield that covers the surface(s) of channels 510 and 520. The solid metal fences may be press fit into the channels or conduit structure 500 (FIGS. 5A, 5B and 5C) may be injection molded around the solid metal fences.

The degree to which the metal coating covers the surfaces of channels 510 and 520 may vary, several of which are illustrated in FIGS. 6A-6C. Each of FIGS. 6A-6C show enlarged partial cross-sectional views of different illustrative metal coating variations, according to various embodiments. FIG. 6A shows that the metal coatings 511 and 521 span the entire height of wave containment region 503. That is, the top of metal coatings 511 and 521 may be flush with the top surface 504 of region 503 and the bottom of metal coatings 511 and 521 may be flush with bottom surface 505 of region 503. Moreover, the composition of region 506, which exists between channels 510 and 520, may be constructed from the same material as the rest of region 503 or it may be constructed from a different material.

FIG. 6B shows that metal coatings 511 and 521 extend from bottom surface 505 of region 503 to near top surface 504, but not quite all the way to top surface 504. Portions 507 of wave containment region 503 can occupy the space between top surface 504 and metal coatings 511 and 521. In region 506, portions 507 may form a "T" shape that occupies the space between channels 510 and 520. Portions 507 may serve as an abutment member that limits the positioning of metal coatings 511 and 521. For example, if metal coatings are shields that are press fit into channels 510 and 520, portions 507 would serve as a stop that limits travel of coatings 511 and 521. In an approach opposite to that shown FIG. 6B, metal coatings 511 and 521 may extend from the top surface 504 of region 503 to near bottom surface 505, but not quite all the way to bottom surface 505. In yet another approach that is not shown, metal coatings 511 and 521 may be suspended within region 503 such that neither ends of coatings 511 and 521 are flush with either top surface 504 or bottom surface 505.

FIG. 6C shows that metal coatings 511 and 521 extend from top surface 504 to bottom surface 505 of region 503. Groove regions 508 and 509 may exist adjacent to channels 510 and 520, as shown. In particular, groove region 509 may exist between channels 510 and 520 and groove regions 508 may exist on the left side of channel 510 and the right side of channel 520. Groove regions 508 and 509 lower the height of the region 503 relative to its nominal top surface 504. As a result, metal coatings 511 and 521 extend beyond the lowered portions of region 503 at the interface existing between the regions 508 and 509 and coatings 511 and 521. In some embodiments, groove regions 508 and 509 may assist in reducing spurious radiation of EHF signals. Groove regions 508 and 509 may be unfilled and occupied by air or they may be filled by a material that is different than the composition of the region 503. Grooves 508 and 509 may directly abut channels 510 and 520 and may take any suitable shape. It should be appreciated that grooves similar to grooves 508 and 510 can exist near bottom surface 505 of region 503. It should also be appreciated that grooves may exist on both top and bottoms surfaces 504 and 505 of region 503.

Returning now to FIGS. 5A, 5B and 5C, it should be appreciated that many different metal coating/wave containment regions may exist. These different approaches may contribute to each channel's ability to guide EHF signals to and/or from the CCUs with minimal cross-talk and signal loss. Other features may be incorporated into conduit structure 500 to further contribute to minimization of cross-talk and signal loss. These additional features include ASR grooves. Such grooves were briefly mentioned above in connection with FIG. 6C, and a more detailed discussion of different ASR groove embodiments can be found in the discussion accompanying FIGS. 7A-7C and FIGS. 8-11.

FIG. 7A shows an illustrative top view of conduit structure 700 including ASR grooves, FIG. 7B shows an illustrative side view of the conduit structure, and FIG. 7C shows an illustrative cross-sectional view of the conduit structure 700 taken along line C-C of FIG. 7A. Structure 700 is similar to structure 500. Thus, some common elements shown in FIGS. 5 and 7A-7C share the same least significant numbers, but different most significant digits. For example, channel 510 of FIG. 5 may be referred to as channel 710 in FIG. 7A. Not shown in FIG. 5 is the addition of ASR grooves 760, 761, 762 and 763. As shown in FIGS. 7A and 7C, ASR grooves 760 and 761 are positioned to the left of channel 710 and ASR grooves 762 and 763 are positioned to the right of channel 720 in FIG. 7A. Grooves 760-763 may form depressions within wave containment region 703 (FIGS. 7A and 7C). The depth (i.e., z direction in FIGS. 7B and 7C) of grooves 760-763 may be uniform or they may vary. In addition, the width (i.e., x direction) and length (i.e., y direction in FIG. 7A) may also be uniform or vary. For example, the one or more of the dimensions of the inner most grooves 761 and 762 may be larger be than those of the outer most grooves 760 and 763, or vice versa. As a specific example, the widths of grooves 761 and 762 may be greater than the widths of grooves 760 and 763, with all other dimensions being equal.

In some embodiments, grooves 761 and 762 may be positioned directly next to channels 710 and 720, respectively, such that a negligible gap separation exists between the two (similar to that shown in FIG. 6C). In another embodiment, groove 761 may be placed a fixed distance from the edge of channel 710, and similarly, groove 762 may be placed the same fixed distance from the edge of channel 720.

It should be understood that while only four grooves are shown in structure 700, any suitable number of grooves may be incorporated into the structure. For example, only one groove may exist to the left of channel 710 and only one groove may exist to the right of channel 720. As another example, three or more grooves may exist to the left of channel 710 and three or more grooves may exist to the right of channel 720.

FIG. 8 shows an illustrative cross-sectional view of conduit structure 800. As shown, structure 800 can include channel 810, which is lined with metal coating 811, channel 820, which is lined with metal coating 821, ASR groove 860, which is positioned between channels 810 and 820. Groove 860 may be surrounded by wave containment portion 803 and span the entire height (z axis direction) of wave containment portion 803. In one embodiment, groove 860 may be an open air, non-metalized, channel that is not affiliated with a CCU.

FIG. 9 shows an illustrative partial cross-sectional of conduit structure 900. Structure 900 is similar to structure 800, but groove 960 can include groove element 961, which is positioned within groove 960. Groove element 961 may be constructed from a material that is different than the material of wave containment structure 903. For example, element 961 may be a metal or other conductive substance, or it may be an EHF absorbent material. Air gaps 962 and 963 are shown to exist above and below element 961. This is merely illustrative, however, as one of air gaps 962 or 963 or both may be occupied by element 961.

FIG. 10 shows an illustrative cross-sectional view of conduit structure 1000, according to an embodiment. Structure 1000 can represent a combination of structures 700 and 800. For example, structure 1000 can include wave containment region 1003, channels 1010 and 1020, and ASR grooves 1060, 1062, and 1064. One or more grooves 1060 (only one is shown) may be positioned to the left of channel 1010, and one or more grooves 1064 (only one is shown) may be positioned to the right of channel 1020. The discussion of grooves 760-763 and all of their permutations apply equally to the grooves 1060 and 1062. Groove 1062 may be positioned between channels 1010 and 1020, and all the permutations of grooves discussed in connection with FIGS. 8 and 9 may apply to groove 1062.

FIG. 11 shows an illustrative cross-sectional view of conduit structure 1100, according to an embodiment. Structure 1100 can include grooves that exist on both the top and bottom sides of wave containment structure 1103. All permutations of grooves as previously discussed can apply to any one of the grooves in structure 1100. Top grooves 1160, 1162, 1164, and 1166, and bottom grooves 1170, 1172, 1174, and 1176 may be positioned as shown relative to channels 1110 and 1120. Specifically, grooves 1160 and 1170 may be positioned to the left of channel 1110, grooves 1162, 1164, 1172, and 1174 may be positioned between channels 1110 and 1120, and grooves 1166 and 1176 may be positioned to the right of channel 1120. The positioning of the upper grooves relative to the positioning of the lower grooves may take many different configurations. For example, in one configuration, one or more of the top and bottom groove positions may be symmetric (i.e., they each share a common axis). As another example, one or more of the top groove positions may be offset with respect to one or more of the bottom groove positions.

FIGS. 12A 12D 12A, 12B, 12C and 12D show different views of an illustrative conductive, ERF absorptive member 1200, which may form part or all of a conduit structure, according to various embodiments. In particular, FIGS. 12A-12D show illustrative top view, front side view, right side view, and perspective view, respectively. EHF absorptive member 1200 can include any number of EHF containment channels. Only two such channels 1210 (FIGS. 12A, 12B and 12D) and 1220 are shown. EHF absorptive member 1200 may have any suitable length L (FIG. 12A), width W (FIG. 12A), and depth D (FIG. 12B) dimensions and channels 1210 and 1220 may be have any desire size and shape. EHF absorptive member 1200 may be constructed from a carbon-loaded material that may be silicone-based, hard plastic, PBT-based, or combinations thereof. For example, EHF absorptive member 1200 may be constructed using the JCS-9 carbon-loaded, silicone rubber made by Laird®. A conductive property of the EHF absorptive member, such as when constructed using the JCS-9 material, may exhibit EHF reflective properties suitable for guiding and containing EHF signals along a desired pathway, and each channel provides an EHF isolated pathway for guiding and containing EHF signals through member 1200. It should be understood that any suitable material may be used in the construction of EHF absorptive member 1200, such as a metalized foam.

When EHF absorptive member 1200 is constructed using a compliant material, it provides compliance to conform to different shapes and to account for tolerances in device assembly stackup. This compliance may also enable EHF absorptive member 1200 to form hermetic EHF seals with the structure(s) to which it is mounted. This can effectively eliminate potential occurrence of spurious EHF radiation. EHF absorptive member 1200 may also provide shock protection for the EHF CCUs (not shown) when EHF absorptive member 1200 is constructed using a material that also provides some level of shock absorption, such as the JCS-9 material.

FIG. 13 shows an illustrative partial cross-sectional view of EHF absorptive member 1200 mounted to substrate 1250 and interface 1280. As shown, bottom surface 1205 may be flushly mounted to substrate 1250, and top surface 1204 may be flushly mounted to interface 1280. The flush mountings may create hermitic EHF seals that effectively enable EHF signals to travel through EHF containment channels 1210 and 1220 with minimal or no spurious radiation and reduced potential for cross-talk and signal loss. EHF absorptive member 1200 may accommodate different height differences, $h_D$, existing between interface 1280 and substrate 1250 due to stackup variations. EHF absorptive member 1200 may be secured in place using glue, adhesive(s) and/or mechanical press fit arrangements. FIG. 13 illustrates the use of EHF absorptive member 1200 as a standalone component for providing EHF containment channels for CCUs 1252 and 1254. That is, in this embodiment, EHF absorptive member 1200 is the only component being used as a conduit structure to guide EHF signals. In other embodiments, such as those discussed below, EHF absorptive member 1200 may be used in combination with at least one other component to provide another conduit structure embodiment.

FIGS. 14A, 14B and 14C show different views of support structure 1400, which may form part or all of a conduit structure, according to various embodiments. In particular, FIGS. 14A-14C shows illustrative top view, side view, and cross-sectional view taken along line C-C of FIG. 14A, respectively. As shown in FIG. 14C, EHF CCUs 1452 and 1454 are mounted on top of substrate 1450 and support structure 1400 is also mounted on top of substrate 1450. Structure 1400 can include mounting regions 1401 and 1402, and retaining region 1403 as shown in FIGS. 14A and 14C. Mounting regions 1401 and 1402 may include features that enable structure 1400 to be secured to substrate 1450. Retaining region 1403 may be integrally formed with mounting regions 1401 and 1402 and may have a height that exceeds the height of the regions 1401 and 1402. In some embodiments, the height of region 1403 may be selected such that structure 1400 can mate directly with the interface (not shown) of the device housing or at least be positioned near that interface.

Retaining region 1403 may be positioned over EHF CCUs 1452 and 1454 and includes open region 1408 in which a compliant member (e.g., EHF absorptive member 1200 of FIGS. 12A, 12B, 12C, and 12D) can be inserted and retained therein. Open region 1408 may include any suitable retaining mechanisms (not shown) for securing the compliant member in place. Example retaining mechanism can include barbs, hooks, protrusions, ridges, retaining tabs, etc.

In addition to providing a location for the compliant member to be inserted, structure 1400 can provide shock protection for CCUs 1452 and 1454. The protective characteristic may be realized by the relative thickness of region 1403 compared to the thickness of CCUs 1452 and 1454. Thus, in a shock event, region 1403, in combination with regions 1401 and 1402, can absorb the shock and/or prevent a portion (e.g., housing) of the device from deflecting onto the CCUs. The EHF absorptive member (not shown) may also provide additional shock protection for CCUs 1452 and 1454.

FIGS. 15A and 15B show illustrative top and cross-sectional views of conduit structure 1500, according to an embodiment. FIG. 15B is a cross-sectional view taken along line B-B in FIG. 15A. Conduit structure 1500 combines EHF absorptive member 1200 (FIG. 15A) and EHF absorptive support structure 1400 to provide EHF containment channels for each CCU. As shown, EHF absorptive member 1200 is retained in open region 1408 (FIG. 15A) of retaining region 1403 (FIG. 15B). Once EHF absorptive member 1200 is secured, it provides channel 1210 for CCU 1452 (FIG. 15B) and channel 1220 for CCU 1454 (FIG. 15B). The bottom surface of EHF absorptive member 1200 may be flushly mounted to substrate 1450 as shown in FIG. 15B, where each channel surrounds its respective CCU, thereby forming a hermitic EHF seal. Whether the top surface of retaining region 1403, the top surface of EHF absorptive member 1200, or both are mounted to the interface (not shown) depends on the construction (and compressibility) of EHF absorptive member 1200. For example, when conduit structure 1500 is not fixed to an interface, the top surfaces of EHF absorptive member 1200 and retaining region 1403 may be co-planar or offset with respect to each other. FIG. 15B shows that both top surfaces are co-planar. In another embodiment, the top surface of EHF absorptive member 1200 may be lower relative to the top surface of region 1403. This may occur, for example, if the open region 1408 has retaining lips (not shown) that prevent EHF absorptive member 1200 from extending beyond the top surface of region 1403. In yet another embodiment, the top surface of EHF absorptive member 1200 may be higher relative to the top surface of region 1403. Then, when conduit structure 1500 is mated to an interface, various factors such as size and shape of the interface may dictate which component or components directly mate with the interface. Regardless of how the mating is achieved, a hermetic EHF seal may be formed.

FIG. 16 shows an illustrative view of conduit structure 1600 that can mate with interface 1670, according to an embodiment. Conduit structure 1600 shows EHF absorptive member 1602 residing in retaining member 1610, where EHF absorptive member 1602 includes channels 1604 and 1606. Interface 1670 may have a predominantly planar surface 1672 with wave guide protrusions 1674 and 1676 extending therefrom. Protrusions 1674 and 1676 may serve as registration elements for aligning and securing EHF absorptive member 1602 to interface 1670 and as waveguides for preferentially carrying EHF signals between an outer surface of interface 1670 and channels 1604 and 1606. When structure 1600 is mated to interface 1670, EHF absorptive member 1602 may be compressed such that a top surface of member 1602 fits flush against planar surface 1672, thereby providing a hermetic EHF seal for channels 1604 and 1606. It should be appreciated that even if EHF absorptive member 1602 does not extend beyond a top surface of retaining member 1610, a hermetic EHF seal can still be achieved by constructing the mating face of interface 1670 to conform to the configuration of structure 1600.

Additional approaches may be used to further assist in eliminating potential spurious radiation and cross-talk. For example, ASR grooves may be incorporated into the support structure. FIGS. 17A, 17B and 17C show top, side, and cross-sectional views, respectively, of support structure 1700 (FIG. 17A) that includes ASR grooves 1760 and 1761 as shown in FIGS. 17A and 17C. ASR groove 1760 is positioned left of open region 1708 as shown in FIG. 17A, and ASR groove 1761 is positioned right of open region 1708. The various permutations and configurations of ASR grooves as discussed above can apply to grooves 1760 and 1761. For example, although only one groove is shown to flank opposite sides of open region 1708, multiple grooves may occupy the presence of lone grooves 1760 and 1761.

It should be appreciated that a large variety of EHF absorptive members and support structures may be utilized to achieve desired results of shock support for the CCUs and EHF signal containment. For example, the support structure may be constructed to have a separate open region for each CCU, and a single channel EHF absorptive member can be positioned in each open region. FIGS. 18A and 18B show illustrative top and cross-sectional views, respectively, of such an example. FIG. 18B shows a cross-sectional view taken along line B-B of FIG. 18A. In particular, FIGS. 18A and 18B show conduit structure 1800 that includes support member 1810 and single channel EHF absorptive members 1820. Support member 1810 can include four open regions 1812 arranged in a 2×2 matrix as shown in FIG. 18A, and each positioned over a CCU as shown in FIG. 18B. An individual single-channel EHF absorptive member 1820 is positioned in each of the four open regions 1812.

Another variation of a conduit structure can be a hybrid of the wave containment conduit structures of FIGS. 5A, 5B, 5C, 6A, 6B, 6C, 7A, 7B, 7C, 8, 9, 10 and 11 and EHF absorptive members. For example, FIGS. 19A and 19B show illustrative top and cross-sectional views, respectively, of conduit structure 1900 that uses the hybrid approach. FIG. 19B shows a cross-sectional view taken along line B-B of FIG. 19A. Structure 1900 includes wave containment region 1910 that includes channel 1912, which can be lined with a metal coating. Structure 1900 also includes ERF absorptive member 1920 that is dimensioned to fit within channel 1912 as shown in FIG. 19A and to extend beyond a periphery of channel 1912 as shown in FIG. 19B. EHF absorptive member 1920 also includes a channel to enable EHF signals to pass through. EHF absorptive member 1920 and channel 1912 may form an EHF hermetic seal when conduit structure 1900 is mated to an interface (not shown). In addition, the presence of EHF absorptive member may provide slack for accommodating variations in device assembly, as well as provide additional shock support.

FIGS. 20A and 20B show illustrative top and cross-sectional views, respectively, of conduit structure 2000 that uses another hybrid approach. Structure 2000 includes wave containment region 2010 that can include channel 2012, which can be lined with a metal coating. Structure 2000 can also include EHF absorptive member 2020 that is disposed around the periphery of channel 2012 on surface 2011 (FIG. 20B) of region 2010. In one embodiment. EHF absorptive member 2020 may form a continuous ring around channel 2012. In another embodiment, EHF absorptive member 2020 may be placed in discrete chunks around channel 2012 (e.g., placed only on two sides of channel 2012). EHF absorptive member 2020 may form an EHF hermetic seal when conduit structure 2000 is mated to interface 2030 as shown in FIG. 20B. In addition, the presence of EHF absorptive member 2020 may provide slack for accommodating variations in device assembly, as well as provide additional shock support.

FIGS. 21A and 21B show different views of conduit structure 2100 having lens member 2130 incorporated therein, according to an embodiment. Lens member 2130 may be operative to focus or direct EHF signal energy in a particular direction or region. Structure 2100 includes wave containment region 2110 that can include channel 2112, which can be lined with a metal coating. Structure 2100 can also include lens member 2130 that can be disposed within channel 2112. If desired, lens member 2130 may be mounted outside of channel 2112. For example, lens member 2130 may be positioned above region 2110 and channel 2112. As another example, lens member 2130 may be integrated with region 2110 such that it forms an extension thereof and is positioned above channel 2112.

FIG. 22 shows an example structure 2200 in which lens member 2230 is integrated with wave containment region 2210, according to an embodiment. Lens member 2230 may exhibit a frustoconical shape; however, this is merely illustrative. The shape of lens member 2230 may be such that it interlocks with or is key registered with the interface (not shown). This can promote EHF sealing and proper placement during assembly.

Conduit structures can be designed to be coupled to the interface (of the housing) in a manner that mitigates spurious radiation. Such coupling can be accomplished using a variety of different approaches. In each approach, the interface may be constructed in a manner that is amenable to the passage of contactless signals through the interface (e.g., constructed with an open air channel or from a material that facilitates propagation of contactless signals). In one approach, the conduit structures may be designed to be an extension of the interface. This can be accomplished by aligning the conduit structure with registration portions of the interface. The registration portions can align the conduit structure in the correct orientation prior to being secured to the interface. In some embodiments, the registration portions can include interlocking features (e.g., snap fit or press fit features) that secure the conduit structure in place. Reference is now made to FIG. 23, which shows an illustrative interface that is secured to a conduit structure, according to an embodiment.

In particular, FIG. 23 shows housing 2310 having interface 2320 that is secured to conduit structure 2330. Interface 2320 is part of housing 2310, but may be constructed from a different material than the rest of housing 2310. For example, interface 2320 may be constructed from a material that facilitates propagation of contactless signals, whereas housing 2310 may be constructed from a material that inhibits propagation of contactless signals. Interface 2320 can include registration portions 2322 that provide alignment registration for conduit structure 2330. Registration portions 2322 can take any suitable shape, including, but not limited to square shapes, angular shapes, and interlocking shapes. For example, an angular shape is shown in FIG. 25. In addition, interface 2320 can include retention elements 2324 that are designed to engage reciprocal retention elements included as part of conduit structure 2330. This way, when conduit structure 2330 is inserted between registration portions 2322, retention elements 2324 may secure conduit structure 2330 in place. Alternative to or in lieu of retention elements, an adhesive (not shown) may be used to secure conduit structure 2330 to interface 2320.

Conduit structure 2330 may include EHF channel 2332, which may be lined with conductive material (not shown). Structure 2330 may also include reciprocal retention elements 2334 that engage retention elements 2324 of interface 2320. Not shown in FIG. 23 is a substrate and a CCU. In some embodiments, the CCU may be positioned within channel 2332 and mounted to the substrate, and the substrate may be secured to the bottom of structure 2330.

In another approach, the interface portion can include an injection mold that secures the conduit structure in place. For example, during construction of the housing, the interface may have an opening existing therein that can accept an injection mold flow. The conduit structure may be placed adjacent to the opening during mold flow so that the mold can flow into a portion of the conduit and secure it in place after the mold cures. The conduit structure can include self-locking cutouts that accept the injection mold flow in order to be securely mounted to the interface. In this approach, the injection mold may form part of an outer surface of the housing as well as the EHF conductive material that simultaneously secures the conduit structure to an inner surface of the housing and provides a channel that facilitates propagation of EHF signals from a CCU to outside of the housing.

FIG. 24 shows an illustrative cross-sectional view of an injection molded interface that is integrally coupled to a conduit structure. As shown, FIG. 24 includes housing 2410, interface 2420, and conduit structure 2430. Conduit structure 2430 can include EHF channel 2432, which can be lined with a conductive material, interface floor 2433, and self-locking regions 2434. Interface floor 2433 may span channel 2432 and defines a lower limit for how far an injection mold flow can travel within conduit structure 2430. Interface 2420 and interface floor 2433 may be constructed from an EHF signal transparent material so that contactless signals can travel to and/or from a CCU (not shown, but would be positioned below floor 2433) through interface 2420 and interface floor 2433. Self-locking regions 2434 can exhibit any suitable shape amenable to locking conduit structure 2434 to interface 3420. During the injection molding process, the mold flows into channel 2432, self-locking regions 2434, and an opening existing within housing 2410. When the mold cures to form interface 2420, conduit structure 2430 is secured in place and cannot be easily taken apart from interface 2420. After the mold cures, it may be cut and/or polished so that it appears to be an integral part of housing 2410 (e.g., the outer surfaces of housing 2410 and interface 2420 are co-planer or seamlessly flush with each other).

Interface 2420 may be applied as a single shot, double shot, or multi-shot injection molding process. For example, if multiple shots are used, a first shot may be used for securing conduit structure 2430, and the subsequent shot or shots can be used for cosmetic purposes. Regardless of how many shots are used, each flow material may facilitate transmission of EHF signals.

FIG. 25 shows an illustrative cross-sectional view of an interface mounted conduit structure 2500, according to an embodiment. Interface mounted conduit structure 2500 can embody aspects of the approaches discussed above in connection with FIGS. 23 and 24 in which conduit structure 2530 is securely mounted to interface 2520. As shown, conduit structure 2530 has a tapered region that nestles into angled registration regions 2522. Conduit structure 2530 includes channel 2532 that spans from top to bottom. CCU 2540 can be mounted on substrate 2550, which can be secured to the bottom of conduit structure 2530 such that at least a transducer portion of CCU 2540 is positioned within channel 2532. Substrate 2550 can be a printed circuit board or a flex circuit board, which may optionally have a stiffener plate attached thereto to provide added rigidity.

To mitigate or prevent EHF signals from emanating from CCU 2540 down and through substrate 2550, a ground plane may be incorporated within substrate 2550 or within CCU 2540. As an alternative or addition to the aforementioned ground plane possibilities, a ground plane can exist as a separate entity outside of substrate 2250 and CCU 2540. For example, as shown, ground plane structure 2560 can encapsulate substrate 2250 and be secured to conduit structure 2530. In some embodiments, the ground plane can serve as EHF signal reflecting member that reflects EHF signal energy back up towards interface 1520. The particular ground plane used may depend on several factors, including, for example, the type of CCU used, the conduit structure used, and the interface the conduit structure is mounted to, and any combination thereof.

FIGS. 26A, 26B, 26C, 27A, 27B, 27C, 28A, 28B, 28C, 29A, 29B and 29C each show different views of several conduit structure embodiments. Each of FIGS. 26A, 26B, 26C, 27A, 27B, 27C, 28A, 28B, 28C, 29A, 29B and 29C shows illustrative top view (as demarcated by "A" suffix), side view (as demarcated by "B" suffix), and perspective view (as demarcated by "C" suffix) of their respective conduit structure. Each conduit includes an EHF channel that spans from the top to bottom. The top side of each conduit structure is designed for coupling to the interface portion of a housing and the bottom portion may be designed to be secured to a CCU and/or substrate. It should be appreciated that conduit structure of FIGS. 26A, 26B, 26C, 27A, 27B, 27C, 28A, 28B, 28C, 29A, 29B and 29C can be used in connection with adhesive or press fit approaches or injection molded approaches.

FIGS. 26A, 26B and 26C show conduit structure 2600 having a square shaped channel 2610 that extends from top surface 2601 to bottom surface 2602 in FIG. 26B. In one embodiment, the sides of conduit structure 2600 may align with registration portions of an interface, and top surface 2601 may be adhesively secured to the interface.

FIGS. 27A, 27B and 27C show conduit structure 2700 (FIGS. 27A and 27B) having channel 2710. At and near top surface 2701 (FIGS. 27B and 27C), channel 2710 may have a circular or elliptical shaped opening and as the channel extends towards bottom surface 2702 (FIG. 27B), the cross-section of the channel may expand as it reaches bottom surface 2702. The expansion may take any suitable shape. As illustrated in FIG. 27B, the expansion mimics the curvature expansion of a bottle such as a wine bottle. The variable cross-section of channel 2710 may be used, for example, to focus contactless signal energy near top surface 2701.

FIGS. 28A, 28B and 28C show conduit structure 2800 having channel 2810. Channel 2810 may have a larger cross-section at top surface 2801 (FIGS. 28B and 28C) than at bottom surface 2802 (FIG. 28B). For example, the top surface opening of channel 2810 may have a rectangular shape that necks down to a smaller rectangle or square at the bottom surface. The neck down shape may resemble a trapezoid, for example. The configuration of channel 2810 may be used for registration with an interface that inserts into channel 2810.

FIGS. 29A, 29B and 29C show conduit structure 2900 having channel 2910. Channel 2910 is shown to extend from top surface 2901 to bottom surface 2902 (FIG. 29B). Channel cap 2911 (FIGS. 29B and 29C) may be positioned above channel 2910 at top surface 2901. Channel cap 2911 may have any suitable shape, such as the square shape as shown, or can resemble a trapezoidal, pyramidal, ovular, circular shape as desired. The cross-section of channel 2910 may be the same or different than channel cap 2911. Channel cap 2911 may serve a reciprocal registration portion that is inserted into the registration region of an interface.

FIG. 30A shows an illustrative cross-sectional view of two devices positioned adjacent to each other to facilitate transmission of contactless signals via spherical lenses according to an embodiment. As shown, device 3000 is positioned below device 3050 such that their respective housings 3002 and 3052 abut each other (not shown) or such that gap 3099 exists between devices 3000 and 3050. Housing 3002 and 3052 may be constructed from metal. Device 3000 can include CCUs 3010 and 3020 that are both mounted to a substrate 3003 (e.g., a printed circuit board). CCUs 3010 and 3020 may be spaced apart by distance X, which defines the distance between center axes 3011 and 3021. EM absorber structure 3040 may be positioned equidistant between axes 3011 and 3021 such that it is centered on axis 3041. EM absorber 3040 may span the distance between substrate 3003 and housing 3002. In addition, EM absorber 3040 may be constructed from a ferrite filled, silicone rubber C-RAM FF-2, available from Cuming Microwave Corporation of Avon, Mass., or a carbon-loaded silicone material, such as the JCS-9 carbon-loaded, silicone rubber made by Laird®.

Device 3000 includes spherical lens structures 3015 and 3025 positioned directly above the antennas of their respective CCUs 3010 and 3020 such that the centers of structures 3015 and 3025 align with respective axes 3011 and 3021, where axes 3011 and 3021 are aligned with the antennas of CCUs 3010 and 3020, respectively. Spherical lens structures 3015 and 3025 (lens structure 3015 is shown in more detail in FIG. 30B and FIG. 30C) may each include respective planar portions 3016 and 3026 and spherical portions 3017 and 3027. Spherical lens structures 3015 and 3025 may be integrated within housing 3002 such that planar portions 3016 and 3026 are co-planar with an outer surface of housing 3002 or serve as part of housing 3002. Spherical portions 3017 and 3027 may protrude beyond an inner surface of housing 3002 in the direction of their respective CCUs 3010 and 3020. The distance, D, may define the distance from the inner surface of housing 3002 and a top surface of CCU 3010 or 3020.

Device 3050 can include housing 3052, substrate 3053, CCUs 3060 and 3070, spherical lens structures 3065 and 3075, and EM absorber 3090. The same arrangements and descriptions of like components in device 3000 apply to equivalent components in device 3050. Attention is now directed to spherical lens structure 3015 as shown in FIGS. 30A, 30B, and 30C.

Spherical lens structure 3015 is constructed from a dielectric material such as, for example, ABS plastic. The dimension of the spherical lens may change depending on the dielectric being used, since different plastics may have a different dielectric constant, in which case the variable for Snell's law would change and affect the angle of refraction. Lens structure 3015 is operative to transform the EM wave emitted by CCU 3010 into a plane wave that is transmitted across gap 3099 to lens structure 3065. The velocity of the EM wave through the dielectric material is less than that of free space. The thickness of spherical portion 3017 (FIGS. 30B and 30C) varies from the edge to the center, being thickest in the center. The thickness variation will impart different EM wave velocities such that the speed of the wave is slower at the thicker parts than at the thinner parts. The curved nature of spherical portion 3017 yields a curved wavefront that is mated with a plane wavefront of planar portion 3016 (FIGS. 30B and 30C). The combination of spherical portion 3017 and planar portion 3016 controls the wave energy entering lens 3015 by yielding a constant phase EM signal that exits lens 3015. This results in a collimated constant phase EM signal at the outer surface of lens 3015. Spherical lens structure 3015 is designed to collimate one wavefront into another by using ray tracing and on the application of Snell's law at the lens surface. Ray tracing can be used to calculate the angle of incidence for the EM waves radiated from the antenna. Snell's law may be used to determine the angle of refraction from the angle of incidence when a wave passes from plastic to air or vice-versa.

Signals that are received at planar portion 3016 (e.g., from CCU 3060) are transformed into a spherical wave by spherical portion 3017. The spherical wave exiting lens 3015 may be more focused than the planar wave being received by lens 3015. In addition, the spherical wave may be a narrow focused beam that enhances reception by CCU 3010.

FIGS. 31A and 31B show an illustrative concave-convex spherical lens structure 3100 according to an embodiment. In some embodiments, lens structure 3100 can be used in place of lens structures 3015, 3025, 3065, and 3075 of FIGS. 30A, 30B and 30C. Lens structure 3100 can include planar portion 3102, convex portion 3104, and concave portion 3106. The dielectric constant of convex portion 3104 and concave portion 3106 may be the same or different. Planar portion 3102 can represent a flat disk that extends beyond the periphery of concave portion 3106. Convex portion 3104 can be integrated into planar portion 3102 such that it forms part of first surface 3101 and extends beyond second surface 3103. Convex portion 3104 can exhibit a spherical or dome shape as shown. Concave portion 3016 can also be integrated into planar portion 3102 such that it forms part of first surface 3101 (FIG. 31A). In addition, concave portion 3016 encompasses convex portion 3104 and extends beyond second surface 3103 (FIG. 31A). Concave portion 3106 includes concave surface 3105 and spherical outer surface 3107 (FIG. 31A). Concave surface 3105 interfaces with the outer surface of convex portion 3105 (FIG. 31A). This interface represents the convex-concave interface of spherical lens structures 3100.

The convex-concave interface of lens structure 3100 can produce a more homogenous wave than that produced by spherical lens structure 3015 of FIGS. 30A, 30B and 30C. This results in a higher antenna gain. Similar to lens structure 3015, the EM wave received from the CCU is transformed into a planar wave. The combination of planar portion 3102, convex portion 3104, and concave portion 3106 controls the wave energy entering lens 3100 by yielding a constant phase EM signal that exits lens 3100. This results in a collimated constant phase EM signal at the outer surface of lens 3100. The convex-concave lens has a better structure for focusing the EM wave than lens structure 3000, and therefore provides better directivity and higher gain.

FIGS. 32A and 32B show a zoned lens structure 3200 (FIG. 32A) according to an embodiment. Zoned lens structure 3200, which may be implemented as a Fresnel lens, can be substituted in place of lens structures 3015, 3025, 3065, and 3075 of FIG. 30A. Zoned lens structure 3200 can include several discontinuous or zoned surfaces within a planar structure. Use of the zoned surfaces offers an alternative to spherical structures (e.g., structures 3015 in FIGS.

30A, 30B and 30C and 3100 in FIGS. 31A and 31B) and yields a lens with reduced thickness compared to the spherical structures. The zoned surfaces can be provided by disk structures 3210, 3220, and 3230. Each disk structure can exhibit the same dielectric constant or different dielectric constants. Each disk structure can exhibit a saucer shaped structure that is amenable to stacking. As shown, disk 3210 can serve as a base disk, with disk 3220 sitting on top of disk 3210, and disk 3230 sitting on top of disk 3220. All of disk 3210, 3220, and 3230 can be integrated within planar portion 3240. First surface 3241 of planar portion 3240 may represent where a transformed EM wave exits lens structure 3200 or where an EM wave is received from a counterpart CCU. One or more of disk 3210, 3220, and 3230 can include a flat portion (3211, 3221, and 3231 in FIG. 32A) and a raised portion (3212, 3222, and 3232 in FIG. 32B) that stems from the flat portion. The degree to which the raised portion is raised relative to the flat potion may be the same or different for each disk.

The velocity of EM waves passing through zoned lens structure 3200 may travel faster at the edges than at the center. This may be because stack of disks 3210, 3220, and 3230 is thicker in the center than that at the edges. Thus, each disk structure may produce different velocities of the EM wave. This variance in EM wave velocity is similar to the wave velocity variance created in lens structures 3015 and 3100. Zoned lens structure 3200 is designed such that the EM path can be divided differing by integral multiples of wavelength from one zone to another.

FIG. 33 shows illustrative system 3300 using a conduit structure according to an embodiment. In particular, system 3300 includes devices 3310 and 3350 that are separated by an airgap. Device 3310 can include housing 3311, circuit board 3312 with CCUs 3313 mounted thereto, conduit structures 3320, and ASR region 3316. Device 3350 can include housing 3351, circuit board 3352 with CCUs 3353 mounted thereto, conduit structures 3360, and ASR region 3356. Conduit structures 3320 and 3360 can each include a respective taper region (3321, 3361) that expands to a respective non-taper region (3322, 3362). Conduit structures 3320 and 3360 may directly interface with respective housing 3311 and 3351, but may not directly interface with respective circuit boards 3312 and 3352, thereby leaving an air gap between the CCU and conduit structure. In another embodiment, conduit structures 3320 and 3360 can encapsulate their respective CCUs and interface directly with their respective circuit boards. In some embodiments, conduit structures 3320 and 3360 may be coated with metal. In some embodiments, the conduit structures 3320 and 3360 may have a pyramidal shape, square shape, rectangular shape, etc. Any one of the above-described lens structures (e.g., those of FIGS. 30A, 30B, 30C, 31A, 31B, 32A and 32B) may be incorporated in the conduit structure or housing.

FIG. 34 shows illustrative system 3400 using a conduit structure according to an embodiment. In particular, system 3400 includes devices 3410 and 3450 that are separated by an airgap. Device 3410 can include housing 3411, circuit board 3412 with CCUs 3413 mounted thereto, conduit structures 3420, and ASR region 3416. Device 3450 can include housing 3451, circuit board 3452 with CCUs 3453 mounted thereto, conduit structures 3460, and ASR region 3456. Conduit structures 3420 and 3460 can each include a respective flared region (3421, 3461) that expands to a respective non-taper region (3422, 3462). Conduit structures 3420 and 3460 may directly interface with respective housing 3411 and 3451, but may not directly interface with respective circuit boards 3412 and 3452, thereby leaving an air gap between the CCU and conduit structure. In another embodiment, conduit structures 3420 and 3460 can encapsulate their respective CCUs and interface directly with their respective circuit boards. In some embodiments, conduit structures 3420 and 3460 may be coated with metal. In some embodiments, the conduit structures 3420 and 3460 may have a pyramidal shape, square shape, rectangular shape, etc. Any one of the above-described lens structures (e.g., those of FIG. 30A through 32B) may be incorporated in the conduit structure or housing.

The number of CCUs that exist in a device may vary depending on the application. For example, in some applications, only one CCU may be required, and in others, two or more CCUs may be required. In applications that use two or more CCUs, an n×m spatial arrangement may be used, where n and m are each represented by an integer. For example, a four CCU device may position the CCUs in a 1×4 array or a 2×2 array. Regardless of the number of CCUs and their arrangement, the conduit structures according to various embodiments herein can provide a substantially isolated EHF channel that has minimal signal loss due to cross-talk, multi-path cross-talk, and/or spurious radiation and also provide shock protection for the CCUs.

Many of the features related to the conduit structures discussed herein may also be applied to conduit structures that interface with a waveguide. Conduit structures that interface with waveguides may be referred to herein as launches, and all the features discussed in connection with conduit structures may be applicable to the launches. Launches and waveguides may be designed to serve many different criteria. For example, packaging restraints may require that the launches exhibit a top launch, angled launch, or side launch design. As another example, the waveguide may have particular dimensions that require a specific launch design. Regardless of the configuration of the launch and waveguide, the combination should satisfy a few basic requirements concerning the characteristics of the contactless signal (or wave) passing through the launch and the waveguide. It may be desirable for the contactless signal to exhibit a single mode of wave propagation with minimal jitter, signal degradation, and dispersion from source to target. The source can be a CCU in a first device and the target can be a CCU in a second device, and the pathway may include a first launch associated with the CCU in the first device, a waveguide that is coupled to the first launch and a second launch, and the second launch may be associated with the CCU in the second device.

FIG. 35 shows an illustrative cross-sectional view of launch and dielectric filled waveguide assembly according to various embodiments. In particular, FIG. 35 shows launch/waveguide assembly 3700 in a top launch configuration. Launch/waveguide assembly 3700 can include substrate 3702, CCU 3704, launch 3710, and waveguide 3730. Launch 3710 can include cover 3715, transition region 3720, and waveguide interface region 3725. Launch 3710 is a top launch design in that the contactless signals launch from CCU 3704 and travel straight up to reach waveguide 3730. Waveguide 3730 may include dielectric body portion 3731, taper portion 3732, and shield portion 3733. Dielectric body portion 3731 and taper portion 3732 may be the dielectric component of waveguide 3730 through which the contactless signal travels. Shield portion 3733 may contain the contactless signal within waveguide 3730.

Launch 3710 may have a channel 3711 defined by the interior dimensions of cover 3715, transition region 3720, and waveguide interface region 3725. Channel 3711 may originate with cover 3715 and terminate at waveguide interface 3725. As shown, cover 3715 has opening 3716 that aligns with inner walls 3721 of transition region 3720 at the interface between cover 3715 and region 3720. Inner walls 3721 (only two of which are shown) are sized and shaped to transition from opening 3716 to waveguide opening 3726. Waveguide interface opening 3726 may be dimensioned to interface with waveguide 3730. In particular, opening 3726 can be dimensionally the same as dielectric body portion 3731. For example, if body portion 3731 is rectangular in shape, inner walls 3727 of waveguide interface region 3725 are dimensioned to mimic the same rectangular shape and dimensions of body portion 3731. Matching the dimensions of inner walls 3727 with the dimensions of body portion 3731 may assist launch 3710 in impedance matching waveguide 3730. In this particular embodiment, taper portion 3732 of waveguide 3730 can be set within channel 3711. The distance in which taper portion 3732 extends into channel 3711 can be controlled using, for example, a stop gap feature (not shown) that sets the distance of taper portion 3732 penetration within channel 3711.

Channel 3711 may be filled with air. In other embodiments, channel 3711 may be filled with a dielectric material other than air such as, for example, vinyl, polycarbonate, or polyethylene. The dielectric of the matter existing within channel 3711 can affect the dimensions of the channel. For example, if the dielectric is air, the sizing of the channel may be larger than if the dielectric is a plastic. The inner walls (e.g., walls 3721 and 3727) may be lined with a conductive material. Regardless of whether the dielectric is air or some other material, channel 3711 is dimensioned so that the output impedance of launch 3710 matches the impedance of waveguide 3730.

In addition, the input impedance of launch 3710 may be designed to match the output impedance of CCU 3704. This may be accomplished by sizing opening 3716 to the appropriate dimension. For example, opening 3716 may be sized such that it is at least half the wavelength of the contactless signal being emitted by CCU 3704. Furthermore, opening 3716 may be centered on an antenna 3705 (or antennas if multiple antennas per IC package) of the CCU 3704. According to some embodiments, the antenna 3705 may instead be disposed on the circuit board with the launch opening centered around the antenna.

FIG. 36 shows an illustrative device-to-device coupling that uses guiding conduit structures according to embodiments discussed herein. FIG. 36 shows device 3500 positioned relative to device 3550 to enable EHF communication between the two devices. Each of the devices includes housing 3501/3551 with respective guiding structure 3502/3553. Housing 3501/3551 may be a metallic case, for example. Each device further includes CCU 3503/3553 mounted on respective PCB 3504/3554 and launch portion 3505/3555 that guides EHF signals emitted by the CCU 3502/3552 towards the guiding structure 3502/3552. Launch portion 3505/3555, for example, may resemble a metal horn and have a shape similar to the transition region 3720 shown in FIG. 35. The guiding structure 3502/3552 may also have a shape different than that shown in FIG. 35. For example, the guiding structure 3502/3552 may have a shape in which at least a portion thereof is non-flush with an interior surface of its respect housing 3501/3551 and extends towards its respective CCU 3503/3553.

FIG. 37 shows an illustrative cross-sectional view of another launch and waveguide assembly according to various embodiments. This launch structure includes a bevel-compensated right angle transition which redirects the EHF signal into a horizontal direction and adds to the design features of the vertical launch of FIG. 35. In particular, FIG. 37 shows launch/waveguide assembly 3800 in an angled launch or side launch configuration. Launch/waveguide assembly 3800 can include substrate 3802, CCU 3804, launch 3810, and waveguide 3830. Launch 3810 can include cover 3815, transition region 3820, and waveguide interface region 3825. Launch 3810 is a side launch design in that the contactless signals launch from CCU 3804 and take a turn at an angle (shown here as 90 degrees) to reach waveguide 3830. Waveguide 3830 may include body portion 3831 and shield portion 3833. Body portion 3831 may be the dielectric component of waveguide 3830 through which the contactless signal travels. Shield portion 3833 may contain the contactless signal within waveguide 3830.

Launch 3810 may have a channel 3811 defined by the interior dimensions of cover 3815, transition region 3820, and waveguide interface region 3825. The dimensions of the launch may follow several general rules to reject multi-moding and to prevent operation in a cut-off regime. For example, assuming that the EHF polarization direction (determined by the CCU antenna orientation) is perpendicular to the plane of the drawing in FIG. 37, all cross-section dimensions in this plane (for example opening 3824, which may be dimensionally the same as dielectric body portion 3831) should be greater than ½ the wavelength of the EHF signal but less than one wavelength of the same. If a cross-section dimension is less than ½ the wavelength, the launch may operate in the cut-off regime. If a cross-section dimension is greater than one wavelength, the launch may permit higher mode transmission. As further example, in the direction perpendicular to the plane of the drawing, cross-section dimensions should be less than ¼ the wavelength of the EHF signal. In general, propagation is more stable when the waveguide dimension in the EHF polarization direction is smaller than in the orthogonal direction.

In general, the dimensions scale with the signal wavelength and inversely with the square-root of the dielectric constant of a material filling the launch or waveguide structure. For example, doubling the wavelength may require all dimensions of the structures to be doubled. Also, replacing air as the dielectric fill with a dielectric material having a dielectric constant of 4 may require all dimensions to be halved.

Channel 3811 may originate with cover 3815 and terminate at waveguide interface 3825. As shown, cover 3815 has opening 3816 that aligns with inner walls 3821 of transition region 3820 at the interface between cover 3815 and region 3820. Inner walls 3821 (only two of which are shown) are sized and shaped to transition from opening 3816 to waveguide opening 3836. Waveguide opening 3836 may be dimensioned to interface with waveguide 3830. In particular, opening 3836 can be dimensionally the same as dielectric body portion 3831. For example, if the cross-section of body portion 3831 is an irregular shape (e.g., a trapezoid), inner walls 3826, 3827, 3828 and 3829 of waveguide interface region 3825 are dimensioned to mimic the same irregular shape and dimensions of body portion 3831. Matching the dimensions of inner walls 3826-3829 with the dimensions of body portion 3831 may assist launch 3810 in impedance matching waveguide 3830. Waveguide 3830 may abut launch 3810 and be at least partially inserted into channel 3811, such as was shown in FIG. 35, and effectively extend the opening of waveguide interface region 3825. Inner walls 3827-3829 may be designed to redirect the contactless signal energy to a new direction (shown here as 90 degrees relative to the signal's origination at CCU 3804). Inner wall 3827 may exist at 45 degree angle with respect to walls 3826 and 3828. Inner wall 3827 may form an angled corner within channel 3811 that assists in redirecting the contactless signal energy. The angled corner can enable constructive interference of the contactless signals as they are re-directed from a first path (e.g., a vertical path) to a second path (e.g., a horizontal path).

Channel 3811 may be filled with air. In other embodiments, channel 3811 may be filled with a dielectric material other than air such as, for example, vinyl, polycarbonate, or polyethylene. The dielectric of the matter existing within channel 3811 can affect the dimensions of the channel. For example, if the dielectric is air, the sizing of the channel may be larger than if the dielectric is a plastic. The inner walls (e.g., walls 3821 and 3827) may be lined with a conductive material. Regardless of whether the dielectric is air or some other material, channel 3811 is dimensioned so that the output impedance of launch 3810 matches the input impedance of waveguide 3830. More specifically, the channel 3811 may be dimensioned such that the electromagnetic wave impedance of the launch 3810 at its output matches the electromagnetic wave impedance of the waveguide 3830 at its input, while taking into account the intended frequency of the signal being transmitted. In addition, the input impedance of launch 3810 may be designed to match the output impedance of CCU 3804. This may be accomplished by sizing opening 3816 to the appropriate dimension.

FIG. 38 shows an illustrative contactless connector according to an embodiment. In particular, FIG. 38 shows a male connector 3890 using a launch/waveguide assembly similar to assembly 3800 of FIG. 37. Male connector 3890 may fit into female connector 3895. In this case, the CCU 3804 and substrate 3802 as shown in FIG. 37 may be disposed within the female connector 3895, while the male connector 3890 houses the guiding structures (e.g., 3815 and 3810 as shown in FIG. 37). The assembly 3800 may receive and transmit EHF signals from and toward the left-hand side through a waveguide structure. The female connector 3895 may hold two CCUs (e.g., TX and RX), which receive and transmit electrical signals from and toward the right-hand side.

FIG. 39A shows an illustrative perspective view of top launch 4000 according to an embodiment similar to that of FIG. 35. A waveguide 4050 is attached to top launch 4000. Waveguide 4050 may have a cross-section of 1.9-2.0 mm×3.8-4.0 mm depending on the EHF frequency and the waveguide dielectric constant. Waveguide 4050 may be sized to only support single mode of operation, and in some embodiments, may be sized to the point where it is almost able to support multi-mode operation, but does not. Top launch 4000 may embody the teachings of FIG. 35, as described above and thus those features need not be repeated in detail again. Top launch 4000 may be an injection molded part that has its inner surfaces coated with a conductive material, or it can be a die cast or 3D-printed metal part. Top launch 4000 can include cover region 4015, transition region 4020, and waveguide interface region 4025. It should be appreciated that a channel (not shown) exists within top launch 4000 that directs the EHF energy from cover region 4015 to waveguide interface region 4025. Top launch 4000 can include external features such as lip 4030 that may be used to secure launch 4000 in place onto a substrate or a wave containment plate (such as that shown in FIG. 39B).

FIG. 39B shows an illustrative exploded view of an assembly according to an embodiment. In particular, FIG. 39B shows launch 4000 being inserted into wave containment plate 4060, which is positioned over CCUs 4072 contained on substrate 4070. Wave containment plate 4060 may provide an EHF seal around each CCU 4072 and also have a raised wall 4061 surrounding each CCU 4072. When launch 4000 is inserted into plate 4060, raised wall 4061 can surround the periphery of launch 4000 to further enhance the EHF seal. Plate 4060 can include interlocking mechanisms 4062 for securing top launch 4000 thereto. Protrusion 4032 of the launch 4000 may nestle into interlocking mechanisms 4062 when launch 4000 is connected to plate 4060. An advantage of using plate 4060 in connection with top launch 4000 is that the distance between CCU 4072 and launch 4000 is controlled. The distance between CCU 4072 and launch 4000 is a significant aspect of contactless signal transmission, and the ability to ensure consistent and secure distances between the two advantageously ensures successful contactless communications. Other embodiments may use magnetic components or screws to secure launch 4000 to plate 4060.

FIGS. 40A and 40B show different views of top launch 4100 according to various embodiments. In particular, FIG. 40A shows an illustrative perspective view and FIG. 40B shows an illustrative exploded view. Top launch 4100 can be constructed from two parts, parts 4102 and 4104 that are designed to interlock and connect to each other. Parts 4102 and 4104 can be metalized plastic, a metal cast, or a sheet metal component. Part 4102 can include holes 4103 that are designed to receive interlock members 4105 of part 4104 as shown in FIG. 40B. Part 4102 can also include tab member 4106 (FIG. 40B) that exerts tension onto waveguide 4150. Part 4104 may have a similar tab (not shown). The combination of these tabs may hold waveguide 4150 in place when parts 4102 and 4104 are secured together. In some embodiments, after parts 4102 and 4104 are secured together to hold waveguide 4150 in place, they may be overmolded with a plastic shroud.

FIG. 41 shows an illustrative perspective view of top launch 4200 according to an embodiment similar to that of FIG. 35. Top launch 4200 may be a one-piece component manufactured from a die cast or a metalized plastic. Top launch 4200 may include cover 4215, transition region 4220, and waveguide interface region 4225. Channel 4211 may exist within launch 4200. Launch 4200 may have external features such as ring region 4230 that can support a ring shaped magnet (not shown). This way, when launch 4200 is secured to wave containing plate or other structure associated with a CCU, launch 4200 can be secured in place (to provide proper alignment and offset and) to form an EHF seal.

FIG. 42A shows a perspective view of waveguide 4300 according to various embodiments. FIG. 42B shows an illustrative cross-sectional view of waveguide 4300 taken along line B-B of FIG. 42A. Waveguide 4300 is a waveguide that exhibits a sharp right angle bend. That is, waveguide leg 4302 is oriented 90 degrees relative to waveguide leg 4304. The right angle is merely illustrative and it should be understood that any bend angle between 1 and 179 (0 to 90 if larger than 90 needs two cascaded bends) degrees may be designed into the wave guide. Bends may introduce wave propagation discontinuities. Thus, to compensate for the propagation discontinuity, waveguide compensation network 4320 (FIGS. 42A and 42B) is provided. Waveguide compensation network 4320 may change the angle between waveguide legs 4302 and 4304 to an angle enabling constructive interference of the wave energy as the contactless signal energy travels from leg 4302 to leg 4304. Waveguide compensation network 4320 may include a conductive surface for redirecting EHF energy.

Waveguide compensation network 4320 can include angled edge 4322 (sometimes referred to herein as a mitered corner) as shown in FIGS. 42B and 42C. The angle of angled edge 4322 is half of the bend angle between waveguide legs 4302 and 4304, or 45 degrees in this example. Angled edge 4322 may be offset with respect to where a true 45 degree mitered corner would exist between legs 4302 and 4304. FIG. 42C shows an illustrative close up of waveguide compensation network 4320. A true 45 degree corner existing between legs 4302 and 4304 is shown by dotted line 4340. Dotted line 4340 is formed by drawing a line from the theoretical edge of leg 4304 (shown by dotted line 4303 in FIGS. 42B and 42C) to the theoretical edge of leg 4302 (shown by dotted line 4305 in FIGS. 42B and 42C). Angled edge 4322 is offset (in the direction towards the right angle of waveguide 4300 by an offset distance, demarcated by offset 4350. Offset 4350 results in a truncation of angled edge 4322 relative to a true mitered edge. In addition, this causes offsets 4352 and 4354, as shown in FIGS. 42B and 42C. In particular, offset 4352 shows a first point of edge 4322 starts a distance x relative to dotted line 4303, and offset 4354 shows a second point of edge 4322 starts a distance y relative to dotted line 4305. Angles $\alpha 1$ and $\alpha 2$ may each be approximately 45 degrees as shown in FIG. 42B. If desired, the transition from legs 4302 and 4304 to angled edge 4322 may be filleted to provide for a smoother transition.

According to an embodiment, offsetting the angled edge 4322 relative to the true 45 degree mitered corner minimizes or otherwise reduces reflections due to constructive interference, particularly when the wavelength is long compared to the size of the waveguide (e.g., when the waveguide is between ½ and 1 wavelength wide). When the wavelength of the signal is small compared to the size of the waveguide, and the wave hits the true 45 degree miter, it may behave like light hitting a mirror, and, in which case, the wave would be faithfully reflected 90 degrees (in the case of a 45 degree miter). However, when the wavelength is long compared to the size of the waveguide, there may be a tendency for part of the propagating wave to scatter around the sharp corner and the other part of the wave to reflect off of the true 45 degree miter. In such case, the two wave components may add (superposition) and cause the wavefront to distort its shape. This distorted wavefront can be decomposed via superposition into a forward wave (energy going away from a wave source) and a reflected wave (energy going back to the source). The less the energy is reflected back to the source, the less the wavefront is distorted. Thus, by offsetting the angled edge 4322 relative to the true 45 degree mitered corner away from the sharp inside corner, the distortion of the wavefront shape is reduced, and more of the incoming wave travels forward away from the source. This results in less of the wave being reflected back toward the source and, hence, a better (voltage standing wave ratio) VSWR or reflection loss.

FIG. 43A shows illustrative waveguide tee 4400 according to an embodiment. FIG. 43B shows illustrative cross-sectional view of waveguide tee 4400 taken along line B-B of FIG. 43A. Waveguide 4400 is a T shaped waveguide that redirects EHF signal energy from a first path 4401 to second and third paths 4402 and 4403 as shown in FIG. 43A. First path 4401 may be associated with leg 4410 and second and third paths 4402 and 4403 may be associated with leg 4420. Leg 4410 may be perpendicular to leg 4420. In another embodiment, leg 4420 may be positioned at any angle between 1 and 179 degrees relative to leg 4410. The lengths of paths 4401, 4402, and 4403 may all be the same or different; however, the width of legs 4410 and 4420 must be the same. Regardless of the angle of leg 4420 relative to leg 4410, the redirection on the EHF signal from the first path to both the second and third paths may introduce wave propagation discontinuities. Waveguide compensation network 4450 may compensate for the propagation discontinuity. Waveguide compensation network 4450 may assist in splitting the EHF signal energy to second path 4402 and third path 4403.

Waveguide compensation network 4450 can include a triangular-shaped conductive block positioned within channel 4405 (FIG. 43B) of waveguide 4400. The triangular shape may cause EHF reflections to occur that result in constructive interference. In some embodiments, the triangle may be equilateral triangle or a bi-lateral triangle (triangle is right isosceles meaning 90/45/45 angles). The actual position and size of network 4450 may vary depending on the cross-sectional dimension of legs 4410 and 4420 and the frequency of the EHF signal. In some embodiments, point 4451 may be co-aligned with center axis 4411 of leg 4410 as shown in FIG. 43B. Point 4451 may be offset with respect to center axis 4421 of leg 4420 by a fixed distance (in the direction away from leg 4410), for significantly the same reasons discussed above (in FIG. 42C) regarding offsetting the angled edge 4322 to minimize reflections. In other embodiments, point 4451 may be co-aligned with center axis 4421 or offset a fixed direction with respect to center axis 4421 (in the direction towards leg 4410 as shown in FIG. 43B). The position of network 4450 may be centered on incoming leg on line 4441.

Waveguides can exhibit different modes of operation and are designed to achieve desired characteristics for those different modes. One of these modes is a transverse mode of electromagnetic radiation, which is a particular electromagnetic field pattern of radiation measured in a plane perpendicular (i.e., transverse) to the propagation direction of the beam. Transverse modes occur in EHF waves confined to a waveguide. Unguided electromagnetic waves in free space, or in a bulk isotropic dielectric, can be described as a superposition of plane waves; these can be described as TEM modes (in embodiments discussed herein, TEM modes do not exist in the waveguides) as defined below. Transverse modes occur because of boundary conditions imposed on the wave by the waveguide. For example, a radio wave in a hollow metal waveguide may have zero tangential electric field amplitude at the walls of the waveguide, so the transverse pattern of the electric field of waves is restricted to those that fit between the walls. However, in any sort of waveguide where boundary conditions are imposed by a physical structure, a wave of a particular frequency can be described in terms of a transverse mode (or superposition of such modes). These modes generally follow different propagation constants. When two or more modes have an identical propagation constant along the waveguide, then there is more than one modal decomposition possible in order to describe a wave with that propagation constant (for instance, a non-central Gaussian laser mode can be equivalently described as a superposition of Hermite-Gaussian modes or Laguerre-Gaussian modes. Modes in waveguides can be classified as a transverse electromagnetic (TEM) mode (neither electric nor magnetic field in the direction of propagation), transverse electric (TE) mode (no electric field in the direction of propagation), and transverse magnetic (TM) mode (no magnetic field in the direction of propagation).

Hollow metallic waveguides filled with a homogeneous, isotropic material (usually air) generally support TE and TM modes but not the TEM mode. In coaxial cable energy is normally transported in the fundamental TEM mode. The TEM mode is also usually assumed for most other electrical conductor line formats as well. This is mostly an accurate assumption, but a major exception is microstrip which has a significant longitudinal component to the propagated wave due to the inhomogeneity at the boundary of the dielectric substrate below the conductor and the air above it. In an optical fiber or other dielectric waveguide, modes are generally of the hybrid type. In rectangular waveguides, rectangular mode numbers are designated by two suffix numbers attached to the mode type, such as TEmn or TMmn, where m is the number of half-wave patterns across the width of the waveguide and n is the number of half-wave patterns across the height of the waveguide. In circular waveguides, circular modes exist, in which case m is the number of full-wave patterns along the circumference and n is the number of half-wave patterns along the diameter.

For certain waveguide applications, it may be desirable to operate between the TE10 and TE20 modes. TE10 can refer to the first order cutoff frequency of a rectangular waveguide. TE20 can refer to the second order cutoff frequency of the rectangular waveguide. The waveguide can be modified to push the second order cutoff frequency to a higher frequency, thereby allowing use of a wider bandwidth without having to compensate for delay dispersion. This may be accomplished, for example, by incorporating one or more ridges into the waveguide.

FIG. 44A shows an illustrative perspective view of ridge waveguide 4500 according to an embodiment. FIG. 44B shows an illustrative cross-sectional view of ridge waveguide 4500 taken along line B-B of FIG. 44A. Ridge waveguide 4500 has a generic rectangular configuration with two circular ridges 4510 and 4512 running along its length. Interior 4502 of waveguide 4500 may be filled with air or some other dielectric. Conductive layer 4520 may encapsulate interior 4502 and circular ridges 4510 and 4512. Circular ridges 4510 and 4512 may be constructed from a dielectric material that is different than the dielectric matter of interior 4502. In some embodiments, circular ridges 4510 and 4512 may be a conductive material such as a wire that is electrically coupled to conductive layer 4520. Circular ridges 4510 and 4512 may be positioned in waveguide 4500 such that approximately half of the ridge sits within interior 4502 and the other half sits outside of interior 4502. In some embodiments, circular ridge 4510 and 4512 may resemble a shape other than a circle. For example, they may take the form of a half circle, an oval, a rectangle, or other suitable shape.

FIG. 45A shows an illustrative cross-sectional view of semi-circular ridge waveguide 4600 according to an embodiment. Waveguide 4600 can include inner member 4605 constructed from a material having a first dielectric constant. Inner member 4605 may have semi-circular regions 4610 and 4612 positioned therein and span the length of waveguide 4600. Metal layer 4620 may encapsulate inner member 4605 and semi-circular regions 4610 and 4612.

FIG. 45B shows an illustrative cross-sectional view of filled rectangular ridge waveguide 4630 according to an embodiment. Waveguide 4630 may include inner member 4635 constructed from a material having a first dielectric constant. Ridge members 4640 and 4642 may be rectangular in shape and are located within inner member 4635. Ridge members 4640 and 4642 may be constructed from a material having a second dielectric constant that is different than the first dielectric constant and is not air. A metal layer (not shown) may encapsulate inner member 4635 and ridge members 4640 and 4642. In one embodiment, ridge members 4640 and 4642 can each include an array of conductors that are arranged to form a rectangular shape. The metal layer (not shown) may be electrically coupled to the array of conductors.

FIG. 45C shows an illustrative cross-sectional view of v-shaped ridge waveguide 4660 according to an embodiment. Waveguide 4660 may include inner member 4665 constructed from a material having a first dielectric constant. V-shaped ridge members 4670 and 4672 may be triangular in shape and are located within inner member 4665. In one embodiment, the v-shaped ridge member may be air filled. As a result, when a metal layer (not shown) is applied to cover inner member 4665 and V-shaped ridge members 4670 and 4672, the waveguide will be similar to waveguide 4600 of FIG. 45A. In another embodiment, v-shaped ridge members 4670 and 4672 may be filled with a dielectric material having a different dielectric constant than inner member 4665, and the entirety of waveguide may be covered with a metal layer (not shown). In yet another embodiment, conductors may be arranged to occupy each of ridges 4670 and 4672, and the metal layer (not shown) can be electrically coupled to the conductors.

FIG. 46A shows an illustrative waveguide structure 4900 formed from metal sheets, according to an embodiment. The waveguide structure 4900 includes two rippled metal sheets 4902 and 4903. The ripples in metal sheets 4902 and 4903 may be formed by bending, stamping, etc. Each of metal sheets 4902 and 4903 may be an integrally formed metal sheet or may be formed by joining, such as by welding, a plurality of separately formed metal sheets or pieces. Metal sheet 4902 may be coupled to metal sheet 4903, for example, using bolts or rivets (not shown).

FIG. 46B shows an illustrative cross-sectional view of waveguide structure 4900 of FIG. 46A along broken line XLVI-XLVI', according to an embodiment. Sections A of the waveguide structure 4900 may serve as waveguides, while sections B of the same may serve as spacers between the waveguides. A dielectric material 4904 may fill the space enclosed by metal sheets 4902 and 4903 in sections A. In some cases, the dielectric material may be air. Since sections B serve as spacers and not as a waveguide, portions of the metal sheet 4903 in sections B may be omitted in some cases. Although FIG. 46B illustrates the arrangement of sections A and sections B as alternating every other one, the embodiments are not limited thereto. For example, in some embodiments, two adjacent sections A may be interposed by two sections B, or there may be no sections B to serve as spacers.

FIG. 47 shows a table 4700 of measured characteristics of various waveguide dielectric materials according to various embodiments. Table 4700 includes columns for material, dielectric constant, loss tangent, and dielectric loss (db/M). The material names and their respective values are self-explanatory. It was found that waveguide material performance at 60 GHz required a loss tangent of less than 0.005 and a dielectric constant of less than 4. Each of the materials in table 4700 satisfy this criteria, and any of these materials may be used in the waveguide discussed herein.

FIG. 48A shows an illustrative perspective view of ridge waveguide 4800 according to an embodiment. FIG. 48B shows an illustrative cross-sectional view of ridge waveguide 4800 taken along line B-B of FIG. 48A. Ridge waveguide 4800 has a generic rectangular configuration with two semi-circular ridges 4810 and 4812 running along its length. Interior 4802 of waveguide 4800 may be filled with air or some other dielectric. Conductive layer 4820 may encapsulate interior 4802 and semi-circular ridges 4810 and 4812. Semi-circular ridges 4810 and 4812 may be constructed from a dielectric material that is different than the dielectric matter of interior 4802. The dielectric material in ridges 4810 and 4812 may provide a discontinuity in the electric field. FIG. 48C shows an illustrative plot diagram showing normalized bandwidth versus rod diameter or waveguide width of ridges 4810 and 4812 in FIGS. 48A and 48B (when filled with a dielectric). As shown, as the diameter increases, the normalized bandwidth or frequency separation between TE10 and TE20 waveguide modes increases.

In another embodiment, a ridge waveguide similar to waveguide 4800 can constructed in which semi-circular ridges 4810 and 4812 are conductors and not dielectrics. FIG. 49 shows an illustrative plot diagram showing normalized bandwidth versus rod diameter or waveguide width of ridges 4810 and 4812 in FIGS. 48A and 48B (when ridges 4810 and 4812 are conductors that are electrically coupled to conductive layer 4820). As shown, as the diameter increases, the normalized bandwidth or frequency separation between TE10 and TE20 waveguide modes increases. Comparing FIG. 49 to FIG. 48C, the plots show that conductive semi-circular ridges are more effective in increasing bandwidth than dielectric semi-circular ridges of the same diameter.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A launch assembly comprising:
    a launch configured to direct extreme high frequency (EHF) electromagnetic (EM) signals comprising:
        a cover region partially enclosing a contactless communications unit (CCU) configured to couple the EHF EM signals, the cover region including an opening to guide the EHF EM signals into a transition region;
        the transition region configured to collimate the EHF EM signals toward a waveguide interface region, the transition region including a void having a trapezoid-shaped cross-section; and
        the waveguide interface region configured to interface with a waveguide and to direct the EHF EM signals from the transition region to the waveguide, the waveguide interface region including a channel having a cross-section, the cross-section of the waveguide interface region and a cross-section of a dielectric body disposed within the waveguide is dimensioned substantially to be the same,
    wherein the cover region, the transition region, and the waveguide interface region are integrated with each other.

2. The launch assembly of claim 1, further comprising the waveguide.

3. The launch assembly of claim 1, wherein the launch is an angled launch in which the contactless signals pass through the channel along a first path and are redirected to a second path.

4. The launch assembly of claim 3, wherein the waveguide interface region comprises an angled corner that redirects EHF EM signals from the first path to the second path.

5. The launch assembly of claim 4, wherein the angled corner is constructed to ensure the EHF EM signals engage in constructive interference when being redirected from the first path to the second path.

6. The launch assembly of claim 1, wherein the launch is constructed from an injection molded plastic.

7. The launch assembly of claim 1, wherein the launch is constructed from at least two metal components that interlock with each other to form the channel.

8. The launch assembly of claim 1, wherein the launch comprises an external feature configured to interface with a reciprocal feature that enables the launch assembly to be secured to the substrate.

9. The launch assembly of claim 1, wherein the transition region includes a wall defining the void, and wherein an interior surface of the wall is conductive.

10. The launch assembly of claim 1, wherein the waveguide includes a tapered portion and wherein the channel of the waveguide interface region is configured to receive the tapered portion.

11. The launch assembly of claim 1, wherein the waveguide interface region includes a corner configured to direct the EHF EM signals from a first direction to a second direction different from the first direction.

12. The launch assembly of claim 11, wherein the corner is angled to enable constructive interference of the EHF EM signals.

13. The waveguide of claim 1, wherein a width of the cross-section of the channel is at least half of a longest wavelength of the EHF EM signals and at most a shortest wavelength of the EHF EM signals.

14. The launch assembly of claim 1, wherein the waveguide interface region includes a wall defining the channel, and wherein an interior surface of the wall is conductive.

15. The launch assembly of claim 1, wherein a wall of the waveguide interface region and a wall of the waveguide are dimensioned substantially the same.

16. The launch assembly of claim 1, wherein the opening is positioned to be aligned with an antenna of the CCU.

17. The launch assembly of claim 1, wherein a width of the opening is at least half of a longest wavelength of the EHF EM signals.

18. The launch assembly of claim 1, wherein the void includes a dielectric material.

* * * * *